(12) United States Patent
Matsuzawa et al.

(10) Patent No.: US 9,104,101 B2
(45) Date of Patent: Aug. 11, 2015

(54) RESIST COMPOSITION, METHOD OF FORMING RESIST PATTERN AND POLYMERIC COMPOUND

(75) Inventors: Kensuke Matsuzawa, Kawasaki (JP); Jun Iwashita, Kawasaki (JP); Yoshitaka Komuro, Kawasaki (JP); Masatoshi Arai, Kawasaki (JP)

(73) Assignee: Tokyo Ohka Kogyo Co., Ltd., Kawaski-shi (JP)

( * ) Notice: Subject to any disclaimer, the term of this patent is extended or adjusted under 35 U.S.C. 154(b) by 0 days.

(21) Appl. No.: 13/402,820

(22) Filed: Feb. 22, 2012

(65) Prior Publication Data
US 2012/0282551 A1 Nov. 8, 2012

(30) Foreign Application Priority Data

Feb. 23, 2011 (JP) ................ P2011-037534

(51) Int. Cl.
| | | |
|---|---|---|
| G03F 7/004 | (2006.01) | |
| G03F 7/38 | (2006.01) | |
| C08F 220/18 | (2006.01) | |
| C08F 220/28 | (2006.01) | |
| C08F 220/38 | (2006.01) | |
| C08F 228/06 | (2006.01) | |
| G03F 7/039 | (2006.01) | |
| G03F 7/20 | (2006.01) | |

(52) U.S. Cl.
CPC ............ G03F 7/0045 (2013.01); C08F 220/18 (2013.01); C08F 220/28 (2013.01); C08F 220/38 (2013.01); C08F 228/06 (2013.01); G03F 7/0046 (2013.01); G03F 7/0397 (2013.01); G03F 7/2039 (2013.01); C08F 2220/382 (2013.01); G03F 7/38 (2013.01)

(58) Field of Classification Search
CPC ....... G03F 7/0045; G03F 7/0397; G03F 7/38; C08F 220/18; C08F 220/28; C08F 220/38; C08F 228/06; C08F 2220/382
USPC ............. 430/270.1, 905, 910, 921, 922, 326; 526/243, 287
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,949,325 B2 | 9/2005 | Li et al. | |
| 7,074,543 B2 | 7/2006 | Iwai et al. | |
| 7,932,334 B2 * | 4/2011 | Ando et al. ................. | 526/243 |
| 2001/0049073 A1 | 12/2001 | Hada et al. | |
| 2006/0121390 A1 | 6/2006 | Gonsalves | |
| 2007/0149702 A1* | 6/2007 | Ando et al. ................. | 524/556 |
| 2007/0231708 A1 | 10/2007 | Matsumaru et al. | |
| 2008/0187860 A1 | 8/2008 | Tsubaki et al. | |
| 2009/0023095 A1 | 1/2009 | Hada et al. | |
| 2010/0055606 A1 | 3/2010 | Mimura et al. | |
| 2010/0063232 A1* | 3/2010 | Nagai et al. ................. | 526/287 |
| 2010/0075256 A1 | 3/2010 | Joo et al. | |
| 2010/0255420 A1* | 10/2010 | Sakakibara et al. ......... | 430/285.1 |
| 2010/0304303 A1 | 12/2010 | Maeda et al. | |
| 2011/0177453 A1 | 7/2011 | Masubuchi et al. | |
| 2011/0200940 A1 | 8/2011 | Ichikawa et al. | |
| 2011/0244392 A1 | 10/2011 | Hirano et al. | |
| 2012/0003583 A1 | 1/2012 | Tsuchimura et al. | |
| 2012/0003590 A1 | 1/2012 | Hirano et al. | |
| 2012/0082939 A1 | 4/2012 | Kawabata et al. | |
| 2012/0156618 A1 | 6/2012 | Takahashi et al. | |
| 2012/0328993 A1 | 12/2012 | Utsumi et al. | |
| 2013/0137048 A1 | 5/2013 | Yahagi et al. | |
| 2013/0157201 A1 | 6/2013 | Takaki et al. | |

FOREIGN PATENT DOCUMENTS

| | | |
|---|---|---|
| JP | A-09-208554 | 8/1997 |
| JP | A-10-221852 | 8/1998 |
| JP | A-11-035551 | 2/1999 |
| JP | A-11-035552 | 2/1999 |
| JP | A-11-035573 | 2/1999 |

(Continued)

OTHER PUBLICATIONS

Office Action issued on Nov. 20, 2013 in U.S. Appl. No. 13/653,930.
Office Action issued on May 20, 2014 in U.S. Appl. No. 13/653,930.
Office Action in Japanese Application No. 2011-037534, mailed Aug. 26, 2014.
Office Action in Japanese Patent Application No. 2011-228066, mailed Mar. 24, 2015.

*Primary Examiner* — John Chu
(74) *Attorney, Agent, or Firm* — Knobbe Martens Olson & Bear LLP

(57) ABSTRACT

A resist composition including a resin component which generates acid upon exposure and exhibits changed solubility in a developing solution under the action of acid, the resin component including a resin component having a structural unit represented by a general formula (a0-0-1) shown below

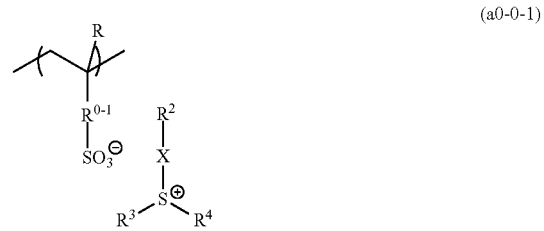

(a0-0-1)

in which R represents a hydrogen atom, an alkyl group of 1 to 5 carbon atoms or a halogenated alkyl group of 1 to 5 carbon atoms, $R^{0-1}$ represents a single bond or a divalent linking group, each of $R^2$, $R^3$ and $R^4$ independently represents a linear, branched or cyclic alkyl group which may have a non-aromatic substituent, or $R^3$ and $R^4$ may be bonded to each other to form a ring together with the sulfur atom, and X represents a non-aromatic divalent linking group or a single bond.

11 Claims, No Drawings

(56) References Cited

FOREIGN PATENT DOCUMENTS

| | | |
|---|---|---|
| JP | A-11-322707 | 11/1999 |
| JP | A-2000-206694 | 7/2000 |
| JP | A-2003-241385 | 8/2003 |
| JP | A-2005-037888 | 2/2005 |
| JP | A-2005-336452 | 12/2005 |
| JP | A-2006-045311 | 2/2006 |
| JP | A-2006-234938 | 9/2006 |
| JP | A-2006-259582 | 9/2006 |
| JP | A-2006-317803 | 11/2006 |
| JP | A-2008-292975 | 12/2008 |
| JP | A-2009-025723 | 2/2009 |
| JP | A-2009-040761 | 2/2009 |
| JP | A-2009-192618 | 8/2009 |
| JP | A-2010-077377 | 4/2010 |
| JP | A-2010-095643 | 4/2010 |
| JP | A-2010-217856 | 9/2010 |
| JP | A-2011-026300 | 2/2011 |
| JP | A-2011-043783 | 3/2011 |
| JP | A-2011-053364 | 3/2011 |
| JP | A-2011-118310 | 6/2011 |
| JP | A-2011-158879 | 8/2011 |
| JP | A-2011-168698 | 9/2011 |
| JP | A-2011-190246 | 9/2011 |
| JP | A-2012-013811 | 1/2012 |
| WO | WO 2004/074242 A2 | 9/2004 |
| WO | WO 2008/056795 A1 | 5/2008 |
| WO | WO 2009/057769 | 5/2009 |
| WO | WO 2011/115190 | 9/2011 |

\* cited by examiner

RESIST COMPOSITION, METHOD OF FORMING RESIST PATTERN AND POLYMERIC COMPOUND

TECHNICAL FIELD

The present invention relates to a resist composition including a base component which generates acid upon exposure and exhibits changed solubility in a developing solution under the action of acid, and also relates to a method of forming a resist pattern using the resist composition, and a polymeric compound that is useful as the base component of the resist composition.

Priority is claimed on Japanese Patent Application No. 2011-037534, filed Feb. 23, 2011, the content of which is incorporated herein by reference.

BACKGROUND ART

In lithography techniques, for example, a resist film composed of a resist material is formed on a substrate, and the resist film is subjected to selective exposure followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as extreme ultraviolet radiation (EUV), electron beam (EB), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, conventionally a chemically amplified composition has been used, which includes a base material component that exhibits changed solubility in a developing solution under the action of acid, and an acid generator component that generates acid upon exposure.

For example, in the case where the developing solution is an alkali developing solution (namely, an alkali developing process), a positive-type chemically amplified resist composition is typically used, which contains a resin component (base resin) that exhibits increased solubility in an alkali developing solution under the action of acid, and an acid generator component. If the resist film formed using this resist composition is selectively exposed during formation of a resist pattern, then within the exposed portions, acid is generated from the acid generator component, and the action of this acid causes an increase in the solubility of the base resin in an alkali developing solution, making the exposed portions soluble in the alkali developing solution. As a result, by performing alkali developing, the unexposed portions remain as a pattern, resulting in the formation of a positive-type pattern.

The base resin uses a resin for which the polarity increases under the action of acid, resulting in an increase in the solubility of the resin in an alkali developing solution, but a decrease in the solubility of the resin within organic solvents. Accordingly, if a solvent developing process that uses a developing solution containing an organic solvent (an organic developing solution) is employed instead of the alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is sometimes referred to as a negative-type developing process (for example, see Patent Document 1).

Currently, resins that contain structural units derived from (meth)acrylate esters within the main chain (acrylic resins) are widely used as base resins for chemically amplified resist compositions that use ArF excimer laser lithography or the like, as they exhibit excellent transparency in the vicinity of 193 nm (for example, see Patent Document 2). Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

Furthermore, a multitude of compounds have been proposed as the acid generator used in a chemically amplified resist composition, and examples of known acid generators include onium salt acid generators, oxime sulfonate acid generators, diazomethane acid generators, nitrobenzylsulfonate acid generators, iminosulfonate acid generators, and disulfone acid generators. Among these, as the onium salt acid generator, an iodonium salt having an iodonium ion as the cation or a sulfonium salt having a sulfonium ion as the cation is generally used. Further, the anion (acid) that forms the salt with the aforementioned cation is typically a fluorinated alkylsulfonate ion (for example, see Patent Document 3). Furthermore, recently, acid generators having a fluorinated alkylsulfonate ion with an amide structure and a triphenylsulfonium ion have been proposed (for example, see Patent Document 4).

In recent years, resins having an acid-generating group have been proposed as base resins. For example, resin components have been proposed that have both an acid-generating group that generates acid upon exposure and an acid-degradable group that exhibits changed polarity under the action of acid within the same structure (for example, see Patent Documents 5 to 7). These resin components combine the function of an acid generator and the function of a base component, and enable a chemically amplified resist composition to be prepared using only a single component. In other words, when this type of resin component is subjected to exposure, acid is generated from the acid-generating group within the structure, and the action of that acid causes degradation of the acid-degradable group, thereby forming a polar group such as a carboxyl group that causes an increase in the polarity. As a result, when a resin film (resist film) formed using such a resin component is subjected to selective exposure, the polarity of the exposed portions increases, and by performing developing using an alkali developing solution, the exposed portions can be dissolved and removed, thus forming a positive-type resist pattern.

DOCUMENTS OF RELATED ART

Patent Documents

[Patent Document 1]
Japanese Unexamined Patent Application, First Publication No. 2008-292975
[Patent Document 2]
Japanese Unexamined Patent Application, First Publication No. 2003-241385
[Patent Document 3]
Japanese Unexamined Patent Application, First Publication No. 2005-037888
[Patent Document 4]
International Patent Publication No. 2009/057769 pamphlet
[Patent Document 5]
Japanese Unexamined Patent Application, First Publication No. Hei 10-221852
[Patent Document 6]
Japanese Unexamined Patent Application, First Publication No. 2006-045311
[Patent Document 7]
Japanese Unexamined Patent Application, First Publication No. 2010-095643

SUMMARY OF THE INVENTION

Problems to be Solved by the Invention

Resist materials for use in EUV lithography or EB lithography require specific lithography properties, including sensitivity to EUV or EB, and a high resolution capable of forming the targeted very fine resist pattern.

Currently, chemically amplified resists that have been proposed for use with KrF excimer lasers or ArF excimer lasers are generally used as the resist materials for EUV lithography and EB lithography due to their superior lithography properties.

Chemically amplified resists containing an acrylic resin as the base resin are particularly common due to their superior lithography properties.

However, a problem exists in that when a chemically amplified resist that has been proposed for use with a KrF excimer laser or an ArF excimer laser is used, the shape of the formed resist pattern is often unsatisfactory.

For example, in the case of EUV lithography, so-called "Out of Band" (OoB) light, which is incorporated within the light generated by the light source of the EUV exposure apparatus but is of a wavelength outside the EUV region, can cause problems. OoB light enters the unexposed portions of the resist film together with a flare that is generated at the same time (thus impairing the selectivity of the exposure region during the EUV light irradiation), and therefore the acid generator component decomposes and generates acid even within the unexposed portions, which can cause problems such as a decrease in the resist pattern contrast, thickness loss, and roughness (surface roughness in the upper surface and the side walls of the pattern). Roughness can cause inferior resist pattern shape. For example, roughness in the side wall surfaces of a pattern can cause shape defects typified by non-uniformity in the line width of a line and space pattern or distortion around the hole periphery in a hole pattern.

These shape defect problems caused by OoB light tend to be particularly marked when chemically amplified resists containing an acrylic resin as the base resin are used. In other words, in these types of chemically amplified resists, generally, irradiation of light having a wavelength in the DUV region such as ArF excimer laser light results in the generation of acid from the acid generator component and a change in solubility within the developing solution. Because OoB light includes light having a wavelength within the DUV region, when an EUV exposure is performed, those portions that are intended as unexposed portions also exhibit photosensitivity, causing a decrease in the contrast.

In EB lithography, electrons may be diffused (scattered) across the surface of the resist film depending on the electron beam irradiation conditions such as the accelerating voltage, and therefore the same type of problem as that observed with the OoB light in EUV lithography can occur.

Unsatisfactory resist pattern shape can adversely effect the formation of very fine semiconductor elements. Accordingly, resist materials for use in EUV lithography and EB lithography require improved lithography properties and an improved pattern shape.

The present invention takes the above circumstances into consideration, and has an object of providing a resist composition that is useful for use with EUV and EB, as well as providing a method of forming a resist pattern that uses the composition, and a polymeric compound that is useful for use within the resist composition.

Means to Solve the Problems

As a result of intensive investigation, the inventors of the present invention discovered that among the components included within a resist composition, it is only the cation moiety within the acid generator component that tends to cause shape defects upon absorption of light within a specific wavelength region (200 to 400 nm) of the DUV light incorporated within OoB light (for example, in those cases where the base resin is an acrylic resin, and the acid generator component includes an aromatic group such as a triphenylsulfonium salt).

Accordingly, it was postulated that avoiding compositions in which only the cation moiety within the acid generator component exhibits absorption of DUV light should act as a countermeasure to the shape defects generated by OoB light. More specific examples of realizing this countermeasure include a method in which the base resin is also imparted with DUV light absorption properties, thereby achieving a relative reduction in the DUV light absorption by the cation moiety of the acid generator component, and a method in which the cation moiety of the acid generator component is changed to a structure that does not absorb DUV light, thereby lowering the photosensitivity of the acid generator to DUV light.

Of these methods, the present invention was discovered as a result of performing further research of the method in which the cation moiety of the acid generator component is changed to a structure that does not absorb DUV light, thereby lowering the photosensitivity of the acid generator to DUV light.

In other words, a first aspect of the present invention provides a resist composition for use with EUV or EB, the composition including a resin component (A) which generates acid upon exposure and exhibits changed solubility in a developing solution under the action of acid, wherein
the resin component (A) contains a resin component (A1) having a structural unit (a0) represented by a general formula (a0-0-1) shown below.

A second aspect of the present invention provides a method of forming a resist pattern, the method including forming a resist film using the resist composition for use with EUV or EB according to the first aspect, exposing the resist film with EUV or EB, and developing the resist film to form a resist pattern.

A third aspect of the present invention provides a polymeric compound having a structural unit (a0) represented by the general formula (a0-0-1) shown below.

[Chemical Formula 1]

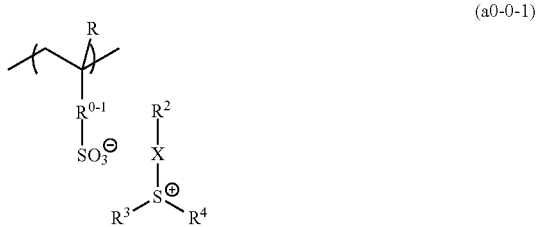

(a0-0-1)

In the formula, R represents a hydrogen atom, an alkyl group of 1 to 5 carbon atoms or a halogenated alkyl group of 1 to 5 carbon atoms, $R^{0-1}$ represents a single bond or a divalent linking group, each of $R^2$, $R^3$ and $R^4$ independently represents a linear, branched or cyclic alkyl group which may have a non-aromatic substituent, or alternatively $R^3$ and $R^4$ may be bonded to each other to form a ring together with the sulfur atom in the formula, and X represents a non-aromatic divalent linking group or a single bond.

In the present description and claims, the expression "for use with EUV or EB" indicates that formation of a resist pattern using the resist composition is performed by exposure using extreme ultraviolet radiation (EUV) or an electron beam (EB) as the exposure light source (radiation source).

The term "exposure" is used as a general concept that includes irradiation with any form of radiation.

The term "aliphatic" is a relative concept used in relation to the term "aromatic", and defines a group or compound or the like that has no aromaticity.

The term "alkyl group" includes linear, branched and cyclic monovalent saturated hydrocarbon groups, unless specified otherwise.

The term "alkylene group" includes linear, branched and cyclic divalent saturated hydrocarbon groups, unless specified otherwise. This definition also applies for the alkyl group within an alkoxy group.

A "halogenated alkyl group" is a group in which part or all of the hydrogen atoms of an alkyl group have each been substituted with a halogen atom, and a "halogenated alkylene group" is a group in which part or all of the hydrogen atoms of an alkylene group have each been substituted with a halogen atom, wherein examples of the halogen atom include a fluorine atom, chlorine atom, bromine atom and iodine atom.

A "fluorinated alkyl group" is a group in which part or all of the hydrogen atoms of an alkyl group have each been substituted with a fluorine atom, and a "fluorinated alkylene group" is a group in which part or all of the hydrogen atoms of an alkylene group have each been substituted with a fluorine atom.

The term "structural unit" refers to a monomer unit that contributes to the formation of a polymeric compound (a resin, polymer or copolymer).

Effects of the Invention

The present invention is able to provide a resist composition that is useful for use with EUV or EB, as well as providing a method of forming a resist pattern that uses the composition, and a polymeric compound that is useful for use within the resist composition.

MODE FOR CARRYING OUT THE INVENTION

<<Resist Composition>>

The resist composition of the present invention includes a resin component (A) (hereinafter referred to as "component (A)") which generates acid upon exposure and exhibits changed solubility in a developing solution under the action of acid. Because the resist composition exhibits changed solubility in a developing solution upon exposure, when a resist film is formed using the resist composition, and that resist film is then subjected to selective exposure, acid is generated from the component (A) in the exposed portions, and the generated acid causes a change in the solubility of the component (A) in a developing solution. As a result, the solubility of the exposed portions in the developing solution changes, whereas in the unexposed portions, the solubility of the component (A) in the developing solution does not change, meaning that when the resist film is subjected to developing, either a positive-type resist pattern is formed by dissolving and removing the exposed portions in the case of a positive-type resist pattern, or a negative-type resist pattern is formed by dissolving and removing the unexposed portions in the case of a negative-type resist pattern.

In this description, a resist composition in which the exposed portions are dissolved and removed to form a positive-type resist pattern is referred to as a "positive-type resist composition", whereas a resist composition in which the unexposed portions are dissolved and removed to form a negative-type resist pattern is referred to as a "negative-type resist composition".

The resist composition of the present invention may be either a positive-type resist composition or a negative-type resist composition.

Further, the resist composition of the present invention may be used for either an alkali developing process in which an alkali developing solution is used for the developing treatment during formation of the resist pattern, or a solvent developing process in which a developing solution containing an organic solvent (an organic developing solution) is used for the developing treatment.

<Component (A)>

The component (A) is a resin component which generates acid upon exposure and exhibits changed solubility in a developing solution under the action of acid.

In this description, the term "resin component" describes an organic compound capable of forming a film, which exists as a polymer. A polymeric compound having a molecular weight of 500 or more, and preferably 1,000 or more, is typically used as the resin component, as such polymeric compounds facilitate the formation of nano level resist patterns. For a resin component, the "molecular weight" refers to the polystyrene-equivalent weight-average molecular weight determined by gel permeation chromatography (GPC).

The component (A) may exhibit increased solubility in the developing solution under the action of acid, or decreased solubility in the developing solution under the action of acid.

In those cases where the resist composition of the present invention is a resist composition which forms a negative-type resist pattern in an alkali developing process (or forms a positive-type resist pattern in a solvent developing process), a resin component which generates acid upon exposure and is soluble in an alkali developing solution (hereinafter referred to as "component (A-2)") is preferably used as the component (A), and a cross-linking agent is also added to the composition. In this resist composition, when acid is generated from the component (A-2) upon exposure, the action of the acid causes cross-linking between the component (A-2) and the cross-linking agent, and as a result, the solubility in an alkali developing solution decreases (whereas the solubility in an organic developing solution increases). Accordingly, during resist pattern formation, by conducting selective exposure of a resist film formed by applying the resist composition to a substrate, the exposed portions change to a state that is substantially insoluble in an alkali developing solution (but soluble in an organic developing solution), while the unexposed portions remain soluble in an alkali developing solution (but substantially insoluble in an organic developing solution), meaning developing with an alkali developing solution can be used to form a negative-type resist pattern. Further, if an organic developing solution is used as the developing solution, then a positive-type resist pattern can be formed.

Examples of the component (A-2) include conventional resins that are soluble in an alkali developing solution (hereinafter referred to as "alkali-soluble resins") into which an acid-generating group that generates acid upon exposure has been introduced.

Examples of the alkali-soluble resin (prior to introduction of the acid-generating group) include a resin having a structural unit derived from at least one of an α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin or polycycloolefin resin having a sulfonamide group, and in which an atom other than a hydrogen atom or a substituent may be bonded to the carbon atom on the α-position, as disclosed in U.S. Pat. No. 6,949,325; an acrylic resin containing a fluorinated alcohol, and in which an atom other than a hydrogen atom or a substituent may be bonded to the carbon atom on the α-position, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582. These resins are preferable in that a resist pattern can be formed with minimal swelling.

The term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (and preferably a hydroxyalkyl group of 1 to 5 carbon atoms) is bonded to the carbon atom on the α-position.

As the cross-linking agent, usually, an amino-based cross-linking agent such as a glycoluril having a methylol group or alkoxymethyl group, or a melamine-based cross-linking agent is preferable, as it enables formation of a resist pattern with minimal swelling. The amount added of the cross-linking agent is preferably within a range from 1 to 50 parts by weight, relative to 100 parts by weight of the alkali-soluble resin.

In those cases where the resist composition of the present invention is a resist composition which forms a positive-type resist pattern in an alkali developing process, and forms a negative-type resist pattern in a solvent developing process, a resin component which exhibits increased polarity under the action of acid (hereinafter referred to as "component (A-1)") is preferably used as the component (A). Because the polarity of the component (A-1) changes upon exposure, by using the component (A-1), favorable developing contrast can be achieved, not only in an alkali developing process, but also in a solvent developing process.

In other words, when an alkali developing process is used, the component (A-1) is substantially insoluble in an alkali developing solution prior to exposure, but when acid is generated from the component (A-1) upon exposure, the action of the acid causes an increase in the polarity that increases the solubility in the alkali developing solution. Accordingly, during resist pattern formation, by conducting selective exposure of a resist film formed by applying the resist composition to a substrate, the exposed portions change from being substantially insoluble in the alkali developing solution to being soluble, while the unexposed portions remain substantially insoluble in the alkali developing solution, meaning alkali developing can be used to form a positive-type resist pattern. On the other hand, when a solvent developing process is used, the component (A-1) exhibits good solubility in an organic developing solution prior to exposure, but when acid is generated from the component (A-1) upon exposure, the action of the acid causes an increase in the polarity that reduces the solubility in the organic developing solution. Accordingly, during resist pattern formation, by conducting selective exposure of a resist film formed by applying the resist composition to a substrate, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, enabling formation of a negative-type resist pattern.

In the present invention, the component (A) is preferably a component (A-1). Accordingly, the component (A1) is preferably a polymeric compound that exhibits increased polarity under the action of acid.

[Component (A1)]
(Structural Unit (a0))

The component (A1) has a structural unit (a0) represented by a general formula (a0-0-1) shown below.

[Chemical Formula 2]

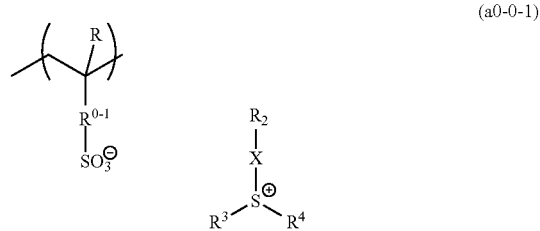

In the formula, R represents a hydrogen atom, an alkyl group of 1 to 5 carbon atoms or a halogenated alkyl group of 1 to 5 carbon atoms, $R^{0-1}$ represents a single bond or a divalent linking group, each of $R^2$, $R^3$ and $R^4$ independently represents a linear, branched or cyclic alkyl group which may have a non-aromatic substituent, or alternatively $R^3$ and $R^4$ may be bonded to each other to form a ring together with the sulfur atom in the formula, and X represents a non-aromatic divalent linking group or a single bond.

In formula (a0-0-1), the alkyl group of 1 to 5 carbon atoms for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group of 1 to 5 carbon atoms for R include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and a hydrogen atom or a methyl group is particularly desirable in terms of industrial availability.

Although there are no particular limitations on the divalent linking group represented by $R^{0-1}$, preferred examples include a divalent hydrocarbon group which may have a substituent, and a divalent linking group containing a hetero atom.

The description that the divalent hydrocarbon group "may have a substituent" means that part or all of the hydrogen atoms within the hydrocarbon group may each be substituted with a substituent (an atom other than a hydrogen atom or a group).

The divalent hydrocarbon group for the linking group may be either an aliphatic hydrocarbon group or an aromatic hydrocarbon group. An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group that includes a ring within the structure.

The linear or branched aliphatic hydrocarbon group preferably has 1 to 10 carbon atoms, more preferably 1 to 8 carbon atoms, and still more preferably 1 to 5 carbon atoms.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms and an oxo group (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those mentioned above.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane is preferred. The monocycloalkane preferably contains 3 to 6 carbon atoms, and specific examples include cyclopentane and cyclohexane. As the polycyclic alicyclic hydrocarbon group, a group in which two hydrogen atoms have been removed from a polycycloalkane is preferred, wherein the polycycloalkane preferably contains 7 to 12 carbon atoms, and specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxo group (=O).

The aromatic hydrocarbon group is a hydrocarbon group having an aromatic ring.

The aromatic hydrocarbon group used as the divalent hydrocarbon group for $R^{0-1}$ preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within substituents is not included in the number of carbon atoms of the aromatic hydrocarbon group.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom.

Specific examples of the aromatic hydrocarbon group include groups in which two hydrogen atoms have been removed from an aforementioned aromatic hydrocarbon ring (namely, arylene groups), and groups in which one hydrogen atom from a group having one hydrogen atom removed from an aforementioned aromatic hydrocarbon ring (namely, an aryl group) is substituted with an alkylene group (for example, groups in which one hydrogen atom is removed from the aryl group of an arylalkyl group such as a benzyl group, phenethyl group, 1-naphthylmethyl group, 2-naphthylmethyl group, 1-naphthylethyl group or 2-naphthylethyl group). The alkylene group (the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an aforementioned aromatic hydrocarbon group may be substituted with a substituent. Examples of the substituent include an alkyl group, alkoxy group, halogen atom, halogenated alkyl group, hydroxyl group and oxo group (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent of the aromatic hydrocarbon group include a fluorine atom, chlorine atom, bromine atom and iodine atom, and a fluorine atom is preferred.

Examples of the halogenated alkyl group for the substituent include groups in which part or all of the hydrogen atoms of an aforementioned alkyl group have each been substituted with an aforementioned halogen atom.

Examples of the hetero atom in the "divalent linking group containing a hetero atom" include atoms other than a carbon atom or hydrogen atom, and specific examples include an oxygen atom, nitrogen atom, sulfur atom or halogen atom.

Specific examples of the divalent linking group containing a hetero atom include non-hydrocarbon linking groups such as —O—, —C(=O)—, —C(=O)—O—, a carbonate linkage (—O—C(=O)—O—), —S—, —S(=O)$_2$—, —S(=O)$_2$—O—, —NH—, —NR$^{04}$— (wherein R$^{04}$ represents a substituent such as an alkyl group or an acyl group), —NH—C(=O)— and =N—, and combinations of at least one of these non-hydrocarbon linking groups with a divalent hydrocarbon group. Examples of the divalent hydrocarbon group include the same groups as those described above for the divalent hydrocarbon group which may have a substituent, although a linear or branched aliphatic hydrocarbon group is preferable.

The divalent linking group for R$^{0-1}$ may or may not include an acid-degradable region within the structure of the group. An "acid-degradable region" describes a region in which a bond exists that can be cleaved under the action of acid generated upon exposure (for example, the acid generated from the structural unit (a0)).

An example of the acid-degradable region is a region that includes a carbonyloxy group and a tertiary carbon atom that is bonded to the oxygen atom (—O—) at the terminal of the carbonyloxy group. When an acid acts upon this type of acid-degradable region, the bond between the oxygen atom and the tertiary carbon atom is cleaved.

When R$^{0-1}$ includes this type of acid-degradable region, the acid generated from the structural unit (a0) upon exposure causes degradation of the acid-degradable region within R$^{0-1}$, thereby increasing the polarity. As a result, even in those cases where the component (A1) is composed solely of the structural unit (a0), the action of acid still causes an increase in the polarity.

As the divalent linking group for R$^{0-1}$, a group represented by general formula (x1), (x2) or (x3) shown below is preferred.

 (x1)

 (x2)

 (x3)

In the formulas, R$^1$ represents a divalent linking group, Rc$_1$ represents a hydrogen atom or an alkyl group of 1 to 5 carbon atoms, A$_{ar1}$ represents an arylene group which may have a substituent, and z represents 0 or 1.

In formulas (x1) to (x3), examples of the divalent linking group for R$^1$ include the same groups as those described above for the divalent linking group for R$^{0-1}$.

As R$^1$, groups represented by a general formula -A-[C(R$^{f1}$)(R$^{f2}$)]$_m$— (wherein A represents a divalent linking group or a single bond, m represents an integer of 1 to 8, and each of R$^{f1}$ and R$^{f2}$ independently represents a hydrogen atom, an alkyl group, a fluorine atom or a fluorinated alkyl group, provided that at least one of R$^{f1}$ and R$^{f2}$ represents a fluorine atom or a fluorinated alkyl group) are particularly preferred.

Examples of the divalent linking group for A include the same groups as those described above for the divalent linking group for R$^{0-1}$.

Among the above possibilities, A is preferably an alkylene group, a divalent linking group containing an oxygen atom, or a single bond.

The alkylene group is preferably a linear or branched alkylene group, is more preferably a linear alkylene group of 1 to 5 carbon atoms, and is most preferably a methylene group or an ethylene group.

The divalent linking group containing an oxygen atom may also contain atoms other than the oxygen atom. Examples of these atoms other than the oxygen atom include a carbon atom, hydrogen atom, sulfur atom and nitrogen atom. Examples of the divalent linking group containing an oxygen atom include non-hydrocarbon, oxygen atom-containing linking groups such as an oxygen atom (an ether linkage, —O—), an ester linkage (—C(=O)—O—), an amide linkage (—NH—C(=O)—), a urethane linkage (—NH—C(=O)—O—), a carbonyl group (—C(=O)—) and a carbonate linkage (—O—C(=O)—O—), and combinations of these non-hydrocarbon, oxygen atom-containing linking groups with an alkylene group.

Specific examples of the above combinations include —X$^{02}$—NH—C(=O)—O—R$^{90}$—, —R$^{91}$—O—, —R$^{91}$—O—C(=O)—, —O—C(=O)—R$^{92}$—, —R$^{91}$—O—C(=O)—R$^{92}$— and —C(=O)—O—R$^{93}$—O—C(=O)—. In these formulas, X$^{02}$ represents a single bond or a divalent linking group, and each of R$^{90}$ to R$^{93}$ independently represents an alkylene group.

Examples of the divalent linking group for X$^{02}$ include the same groups as those described above for the divalent linking group for R$^{0-1}$.

The alkylene group for R$^{90}$ to R$^{93}$ is preferably a linear or branched alkylene group, and preferably contains 1 to 12 carbon atoms, more preferably 1 to 5 carbon atoms, still more preferably 1 to 3 carbon atoms, and most preferably 1 or 2 carbon atoms.

Specific examples of the alkylene group include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, an ethylene group [—CH$_2$CH$_2$—], alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—], alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

In the formula -A-[C(R$^{f1}$)(R$^{f2}$)]$_m$—, m represents an integer of 1 to 8, preferably an integer of 1 to 4, and more preferably 1 or 2.

Each of R$^{f1}$ and R$^{f2}$ independently represents a hydrogen atom, an alkyl group, a fluorine atom or a fluorinated alkyl group, provided that at least one of R$^{f1}$ and R$^{f2}$ represents a fluorine atom or a fluorinated alkyl group.

In those cases where m is 2 or greater, the plurality of R$^{f1}$ groups within the formula may be the same or different from each other. Similarly, when m is 2 or greater, the plurality of R$^{f2}$ groups within the formula may be the same or different from each other.

The alkyl group for R$^{f1}$ and R$^{f2}$ is preferably an alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The fluorinated alkyl group for R$^{f1}$ and R$^{f2}$ is preferably a group in which part or all of the hydrogen atoms within an aforementioned alkyl group for R$^{f1}$ and R$^{f2}$ have each been substituted with a fluorine atom.

At least one of R$^{f1}$ and R$^{f2}$ represents a fluorine atom or a fluorinated alkyl group. It is particularly desirable that the R$^{f1}$ group and the R$^{f2}$ group bonded to the carbon atom that is bonded directly to the sulfur atom of the —SO$_3^-$ moiety at the terminal of the side chain in formula (a0-0-1) are both fluorine atoms.

Specific examples of the group represented by —[C(R$^{f1}$)(R$^{f2}$)]$_m$— include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—. Among these, —CF$_2$—, —CF$_2$CF$_2$—, —CF$_2$CF$_2$CF$_2$— or —CH$_2$CF$_2$CF$_2$— is preferable, —CF$_2$—, —CF$_2$CF$_2$— or —CH$_2$CF$_2$CF$_2$— is more preferable, and —CF$_2$— is particularly desirable.

As the group represented by the formula -A-[C(R$^{f1}$)(R$^{f2}$)]$_m$—, a group selected from among groups represented by formulas —(CH$_2$)$_{a''}$—(CF$_2$)$_{b''}$—, —(CH$_2$)$_{c''}$—C(=O)—O—(CH$_2$)$_{d''}$—(CF$_2$)$_{e''}$— and —(CH$_2$)$_{f''}$—NH—C(=O)—O—(CH$_2$)$_{g''}$—(CF$_2$)$_{h''}$— is preferred.

In the above formulas, a'' represents an integer of 1 to 10, b'' represents an integer of 0 to 10, c'' represents an integer of 1 to 10, d'' represents an integer of 1 to 10, e'' represents an integer of 0 to 10, f' represents an integer of 1 to 10, g'' represents an integer of 1 to 10, and h'' represents an integer of 0 to 10.

In formula (x2), the alkyl group for Rc$_1$ is preferably a linear or branched group.

In formula (x3), the arylene group for A$_{ar1}$ preferably contains 3 to 30 carbon atoms, more preferably 5 to 30 carbon atoms, still more preferably 5 to 20 carbon atoms, still more preferably 6 to 15 carbon atoms, and most preferably 6 to 10 carbon atoms. The number of carbon atoms within substituents is not included in the number of carbon atoms of the aromatic hydrocarbon group.

Specific examples of the arylene group include groups in which two hydrogen atoms have been removed from an aromatic hydrocarbon ring such as benzene, biphenyl, fluorene, naphthalene, anthracene and phenanthrene. Of these, groups in which two hydrogen atom have been removed from benzene or naphthalene are preferred, and groups in which two hydrogen atoms have been removed from benzene are particularly desirable.

The arylene group may have a substituent. Examples of the substituent include a halogen atom, an alkyl group and an alkoxy group.

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or ethoxy group.

Examples of the halogen atom for the substituent include a fluorine atom, chlorine atom, bromine atom and iodine atom, and a fluorine atom is preferred.

As the structural unit (a0), at least one structural unit is preferably selected from the group consisting of structural units represented by general formulas (a0-1) to (a0-4) shown below.

Including a structural unit represented by formula (a0-1) or (a0-2) is preferred in terms of improving the lithography properties such as the line edge roughness (LER).

When the component (A1) includes a structural unit represented by formula (a0-3) or (a0-4), the component (A1) more readily absorbs not only the energy of the EUV light or EB used as the exposure light source (radiation source), but also the OoB light, and therefore it is thought that even if an additional component (B) is added to the composition, adverse effects such as degradation of the component (B) caused by the OoB light can be reduced, resulting in an improvement in the lithography properties.

[Chemical Formula 3]

(a0-1)

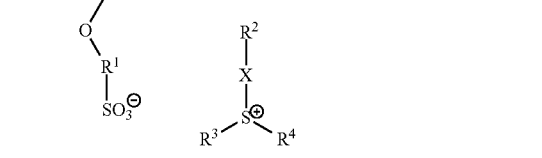

(a0-2)

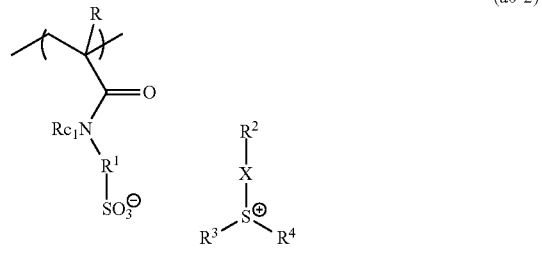

(a0-3)

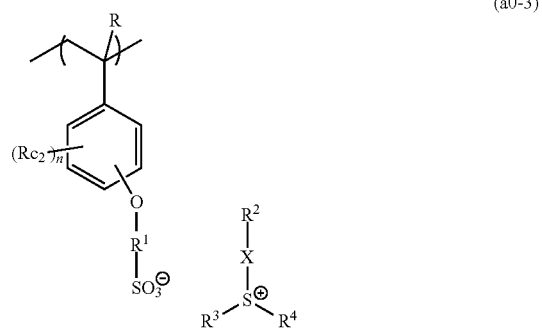

(a0-4)

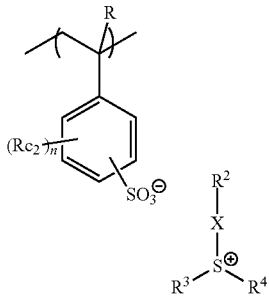

In the formulas, R represents a hydrogen atom, an alkyl group of 1 to 5 carbon atoms or a halogenated alkyl group of 1 to 5 carbon atoms, each of $R^2$, $R^3$ and $R^4$ independently represents a linear, branched or cyclic alkyl group which may have a non-aromatic substituent, or alternatively $R^3$ and $R^4$ may be bonded to each other to form a ring together with the sulfur atom in the formula, X represents a non-aromatic divalent linking group or a single bond, $R^1$ represents a divalent linking group, $Rc_1$ represents a hydrogen atom or an alkyl group of 1 to 5 carbon atoms, each n independently represents an integer of 1 to 4, and each $Rc_2$ independently represents a hydrogen atom, a halogen atom, an alkyl group of 1 to 5 carbon atoms or an alkoxy group of 1 to 5 carbon atoms.

In formulas (a0-1) to (a0-4), R, $R^2$, $R^3$, $R^4$ and X are the same as defined above for R, $R^2$, $R^3$, $R^4$ and X respectively in formula (a0-0-1).

$R^1$ is the same as $R^1$ in formulas (x1) to (x3), and $Rc_1$ is the same as $Rc_1$ in formula (x2).

Examples of the halogen atom for $Rc_2$ include the same halogen atoms as those described above as the substituent for the arylene group for $A_{ar1}$ in formula (x3), and a fluorine atom is particularly desirable.

When n represents an integer of 2 to 4, the n $Rc_2$ groups within formula (a0-3) or (a0-4) may be the same or different from each other.

Of the units described above, the structural unit (a0) is preferably at least one structural unit selected from the group consisting of structural units represented by general formulas (a0-1) to (a0-3), and is more preferably at least one structural unit selected from the group consisting of structural units represented by general formulas (a0-1-1) to (a0-3-1) shown below.

[Chemical Formula 4]

(a0-1-1)

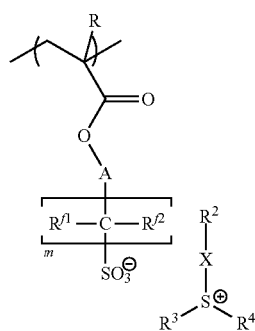

(a0-2-1)

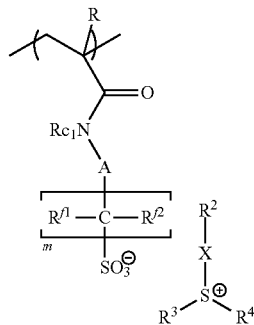

(a0-3-1)

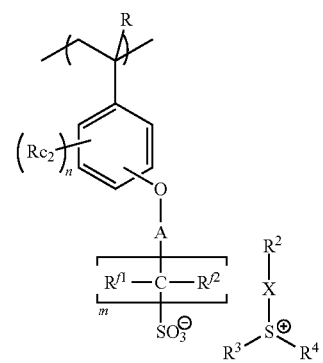

In the formulas, R represents a hydrogen atom, an alkyl group of 1 to 5 carbon atoms or a halogenated alkyl group of 1 to 5 carbon atoms, each of $R^2$, $R^3$ and $R^4$ independently represents a linear, branched or cyclic alkyl group which may have a non-aromatic substituent, or alternatively $R^3$ and $R^4$ may be bonded to each other to form a ring together with the sulfur atom in the formula, X represents a non-aromatic divalent linking group or a single bond, $Rc_1$ represents a hydrogen atom or an alkyl group of 1 to 5 carbon atoms, each n independently represents an integer of 1 to 4, each $Rc_2$ independently represents a hydrogen atom, a halogen atom, an alkyl group of 1 to 5 carbon atoms or an alkoxy group of 1 to 5 carbon atoms, A represents a divalent linking group or a single bond, each m independently represents an integer of 1 to 8, and each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

In formulas (a0-1-1), (a0-2-1) and (a0-3-1), R, $R^2$, $R^3$, $R^4$ and X are the same as defined above for R, $R^2$, $R^3$, $R^4$ and X respectively in formula (a0-0-1).

$Rc_1$ is the same as $Rc_1$ in the above formula (a0-2).

n and $Rc_2$ are the same as n and $Rc_2$ in the above formulas (a0-3) and (a0-4).

A, m, $R^{f1}$ and $R^{f2}$ are the same as defined above for A, m, $R^{f1}$ and $R^{f2}$ respectively in the formula -A-[C($R^{f1}$)($R^{f2}$)]$_m$—. The A group in formula (a0-3-1) is preferably a group represented by —$R^{91}$—O—C(=O)—, wherein the alkylene group for $R^{91}$ preferably contains 1 to 15 carbon atoms, and more preferably 2 to 12 carbon atoms.

Among the above, the structural unit represented by formula (a0-1-1) is preferably a structural unit represented by general formula (a0-1-11), (a0-1-12) or (a0-1-13) shown below.

In formulas (a0-1-11) to (a0-1-13), R, $R^2$, $R^3$, $R^4$ and X are the same as defined above for R, $R^2$, $R^3$, $R^4$ and X respectively in formula (a0-0-1).

[Chemical Formula 5]

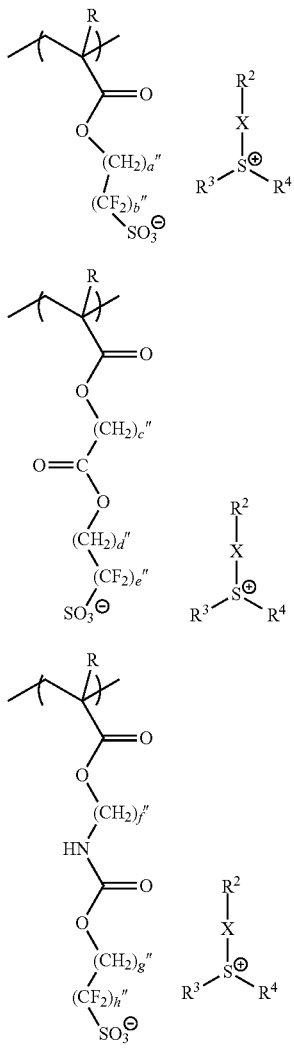

(a0-1-11)

(a0-1-12)

(a0-1-13)

In the formulas, R represents a hydrogen atom, an alkyl group of 1 to 5 carbon atoms or a halogenated alkyl group of 1 to 5 carbon atoms, each of $R^2$, $R^3$ and $R^4$ independently represents an alkyl group which may have a non-aromatic substituent, or alternatively $R^3$ and $R^4$ may be bonded to each other to form a ring together with the sulfur atom in the formula, X represents a non-aromatic divalent linking group or a single bond, a" represents an integer of 1 to 10, b" represents an integer of 0 to 10, c" represents an integer of 1 to 10, d" represents an integer of 1 to 10, e" represents an integer of 0 to 10, f" represents an integer of 1 to 10, g" represents an integer of 1 to 10, and h" represents an integer of 0 to 10.

Next is a description of the cation moiety $(R^2—X—S^+(R^3)(R^4))$ in the structural unit (a0).

In the formula (a0-0-1), $R^2$ represents an alkyl group which may have a non-aromatic substituent.

The alkyl group for $R^2$ may be linear, branched or cyclic, and preferably contains 1 to 30 carbon atoms.

Of these alkyl groups, the linear alkyl group preferably contains 1 to 20 carbon atoms, more preferably 1 to 15 carbon atoms, and most preferably 1 to 10 carbon atoms. Specific examples of the linear alkyl group include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched alkyl group preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The cyclic alkyl group may be either a monocyclic group or a polycyclic group, and preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Specific examples include groups in which one or more hydrogen atoms have been removed from a monocycloalkane, and groups in which one or more hydrogen atoms have been removed from a polycycloalkane such as a bicycloalkane, tricycloalkane or tetracycloalkane. More specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The cyclic alkyl group is preferably a polycyclic group, is more preferably a group in which one or more hydrogen atoms have been removed from a polycycloalkane, and is most preferably a group in which one or more hydrogen atoms have been removed from adamantane.

The alkyl group for $R^2$ may have a non-aromatic substituent.

The term "non-aromatic" means that the substituent has no aromaticity.

The non-aromatic substituent may be any substituent that has no aromatic group (such as an aromatic hydrocarbon group) within the group structure.

The substituent may substitute part or all of the hydrogen atoms of the alkyl group, or may substitute a portion of the carbon atoms that constitute the alkyl group.

Of these non-aromatic substituents, examples of the substituents that substitute part or all of the hydrogen atoms of the alkyl group include an alkyl group and a non-aromatic substituent containing a hetero atom.

The alkyl group for the substituent that substitutes part or all of the hydrogen atoms of the aforementioned alkyl group may be linear, branched or cyclic. The alkyl group substituent preferably contains 1 to 30 carbon atoms. Specific examples include the same groups as those described above as the linear, branched or cyclic alkyl group for $R^2$. Of these, the linear alkyl group for the substituent preferably contains 1 to 5 carbon atoms, more preferably 1 to 4 carbon atoms, and most preferably 1 or 2 carbon atoms. The branched alkyl group for the substituent preferably contains 3 to 10 carbon atoms, and more preferably 3 to 5 carbon atoms.

Examples of the alkyl group in which a hydrogen atom has been substituted with an alkyl group include cyclic alkyl groups in which at least one hydrogen atom has been substituted with a linear or branched alkyl group, and linear or branched alkyl groups in which a hydrogen atom has been substituted with a cyclic alkyl group.

Examples of cyclic alkyl groups in which a hydrogen atom has been substituted with a linear or branched alkyl group include groups represented by formulas (1-1) to (1-9) which are described below in relation to a structural unit (a1).

Examples of linear or branched alkyl groups in which a hydrogen atom has been substituted with a cyclic alkyl group include groups represented by formulas (2-1) to (2-6) which are described below in relation to the structural unit (a1).

There are no particular limitations on the hetero atom in the "non-aromatic substituent containing a hetero atom" that may act as a substituent that substitutes a hydrogen atom of the aforementioned alkyl group, provided the hetero atom is other than a carbon atom or a hydrogen atom, and specific examples of the hetero atom include a halogen atom, oxygen atom, sulfur atom and nitrogen atom. Examples of the halogen atom include a fluorine atom, chlorine atom, iodine atom and bromine atom. The substituent may consist solely of the hetero atom, or may be a group that contains the hetero atom and a group or atom other than the hetero atom.

Specific examples of the "non-aromatic substituent containing a hetero atom" that substitutes a hydrogen atom include a halogen atom, oxo group (=O), cyano group, alkoxyalkyloxy group, alkoxycarbonylalkyloxy group, —C—(=O)—O—R$^{7\prime\prime}$, —O—C(=O)—R$^{8\prime\prime}$ or —O—R$^{9\prime\prime}$. Each of R$^{7\prime\prime}$, R$^{8\prime\prime}$ and R$^{9\prime\prime}$ independently represents a hydrogen atom, a saturated hydrocarbon group or an aliphatic unsaturated hydrocarbon group.

Examples of the halogen atom that substitutes a hydrogen atom include the same halogen atoms as those described above, and a fluorine atom is preferred.

Examples of the alkoxyalkyloxy group that substitutes a hydrogen atom include groups represented by a general formula shown below.

—O—C(R$^{47}$)(R$^{48}$)—O—R$^{49}$

In this formula, each of R$^{47}$ and R$^{48}$ independently represents a hydrogen atom or a linear or branched alkyl group, and R$^{49}$ represents an alkyl group.

The alkyl group for R$^{47}$ and R$^{48}$ preferably has 1 to 5 carbon atoms and may be either linear or branched, but is preferably an ethyl group or a methyl group, and is most preferably a methyl group.

It is preferable that at least one of R$^{47}$ and R$^{48}$ is a hydrogen atom. It is particularly desirable that either one of R$^{47}$ and R$^{48}$ is a hydrogen atom and the other is a hydrogen atom or a methyl group.

The alkyl group for R$^{49}$ preferably has 1 to 15 carbon atoms, and may be linear, branched or cyclic.

The linear or branched alkyl group for R$^{49}$ preferably has 1 to 5 carbon atoms, and examples include a methyl group, ethyl group, propyl group, n-butyl group and tert-butyl group.

The cyclic alkyl group for R$^{49}$ preferably has 4 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these cyclic groups, groups in which one or more hydrogen atoms have been removed from adamantane are preferable.

Examples of the alkoxycarbonylalkyloxy group that substitutes a hydrogen atom include groups represented by a general formula shown below.

—O—R$^{50}$—C(=O)—O—R$^{56}$

In this formula, R$^{50}$ represents a linear or branched alkylene group, and R$^{56}$ represents a tertiary alkyl group.

The linear or branched alkylene group for R$^{50}$ preferably has 1 to 5 carbon atoms, and examples include a methylene group, ethylene group, trimethylene group, tetramethylene group and 1,1-dimethylethylene group.

Examples of the tertiary alkyl group for R$^{56}$ include a 2-methyl-2-adamantyl group, 2-(2-propyl)-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

Moreover, groups in which R$^{56}$ in the general formula —O—R$^{50}$—C(=O)—O—R$^{56}$ has been substituted with R$^{56\prime}$ may also be used. R$^{56\prime}$ represents a hydrogen atom, an alkyl group, a fluorinated alkyl group, or an aliphatic cyclic group which may contain a hetero atom.

Examples of the alkyl group for R$^{56\prime}$ include the same groups as those described above for the alkyl group for R$^{49}$.

Examples of the fluorinated alkyl group for R$^{56\prime}$ include groups in which part or all of the hydrogen atoms within an aforementioned alkyl group for R$^{49}$ have each been substituted with a fluorine atom.

Examples of the aliphatic cyclic group which may contain a hetero atom for R$^{56\prime}$ include aliphatic cyclic groups that do not contain a hetero atom, aliphatic cyclic groups containing a hetero atom within the ring structure, and groups in which a hydrogen atom within an aliphatic cyclic group has been substituted with a hetero atom.

For R$^{56\prime}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

For R$^{56\prime}$, specific examples of the aliphatic cyclic groups containing a hetero atom within the ring structure include groups represented by formulas (L1) to (L5) and (S1) to (S4) shown below.

For R$^{56\prime}$, specific examples of the groups in which a hydrogen atom within the aliphatic cyclic group has been substituted with a hetero atom include groups in which two hydrogen atoms within an aliphatic cyclic group have been substituted with an oxo group (=O).

Each of R$^{7\prime\prime}$, R$^{8\prime\prime}$ and R$^{9\prime\prime}$ in the formulas —C—(=O)—O—R$^{7\prime\prime}$, —O—C(=O)—R$^{8\prime\prime}$ and —O—R$^{9\prime\prime}$ independently represents a hydrogen atom, a saturated hydrocarbon group, or an aliphatic unsaturated hydrocarbon group.

The saturated hydrocarbon group may be linear, branched or cyclic, or may be a combination of any of these structures.

The linear or branched saturated hydrocarbon group preferably contains 1 to 25 carbon atoms, more preferably 1 to 15 carbon atoms, and still more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group include the tertiary alkyl groups mentioned above within the description of $R^{56}$. Further, other examples of the branched saturated hydrocarbon group, excluding tertiary alkyl groups, include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxo group (=O), cyano group and carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group for $R^{7\prime\prime}$, $R^{8\prime\prime}$ and $R^{9\prime\prime}$ preferably contains 3 to 20 carbon atoms. The cyclic saturated hydrocarbon group may be either a polycyclic group or a monocyclic group. Examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, a portion of the carbon atoms that constitute a ring within the cyclic saturated hydrocarbon group may be substituted with a hetero atom, or a hydrogen atom bonded to a ring within the cyclic saturated hydrocarbon group may be substituted with a substituent.

Examples of the former case include groups in which one or more hydrogen atoms have been removed from a heterocycloalkane in which a portion of the carbon atoms that constitute the ring(s) of an aforementioned monocycloalkane or polycycloalkane have been substituted with a hetero atom such as an oxygen atom, sulfur atom or nitrogen atom. Further, the ring structure may include an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a lactone ring-containing bicycloalkane, tricycloalkane or tetracycloalkane.

In the latter case, examples of the substituent include the same substituents as those described above for the linear or branched saturated hydrocarbon group, and an alkyl group of 1 to 5 carbon atoms.

Further, the saturated hydrocarbon group for $R^{7\prime\prime}$, $R^{8\prime\prime}$ and $R^{9\prime\prime}$ may be a combination of a linear or branched saturated hydrocarbon group and a cyclic saturated hydrocarbon group.

Examples of combinations of a linear or branched saturated hydrocarbon group and a cyclic saturated hydrocarbon group include groups in which a cyclic saturated hydrocarbon group is bonded as a substituent to a linear or branched saturated hydrocarbon group (such as a 1-(1-adamantyl)methyl group), and groups in which a linear or branched saturated hydrocarbon group is bonded as a substituent to a cyclic saturated hydrocarbon group.

The aliphatic unsaturated hydrocarbon group for $R^{7\prime\prime}$, $R^{8\prime\prime}$ and $R^{9\prime\prime}$ is preferably a linear or branched group. Examples of the linear aliphatic unsaturated hydrocarbon group include a vinyl group, propenyl group (allyl group), and butynyl group. Examples of the branched aliphatic unsaturated hydrocarbon group include a 1-methylpropenyl group and 2-methylpropenyl group. The linear or branched aliphatic unsaturated hydrocarbon group may have a substituent. Examples of the substituent include the same substituents as those described above for the linear or branched saturated hydrocarbon group.

Of the various possibilities described above, each of $R^{7\prime\prime}$, $R^{8\prime\prime}$ and $R^{9\prime\prime}$ is preferably a hydrogen atom, a linear or branched saturated hydrocarbon group of 1 to 15 carbon atoms, or a cyclic saturated hydrocarbon group of 3 to 20 carbon atoms, as such groups yield superior lithography properties and resist pattern shape.

Among the various possibilities described above, the non-aromatic substituent that substitutes a hydrogen atom of the aforementioned alkyl group is preferably at least one substituent selected from among an alkyl group, halogen atom, oxo group (=O), alkoxyalkyloxy group, alkoxycarbonylalkyloxy group, —C—(=O)—O—$R^{7\prime\prime}$, —O—C(=O)—$R^{8\prime\prime}$ and —O—$R^{9\prime\prime}$.

Of the above non-aromatic substituents, examples of the substituent that substitutes a portion of the carbon atoms that constitute the alkyl group include non-aromatic divalent substituents containing a hetero atom. There are no particular limitations on the hetero atom in such substituents, provided it is an atom other than a carbon atom or a hydrogen atom. Examples of the hetero atom include a halogen atom, oxygen atom, sulfur atom and nitrogen atom. Examples of the halogen atom include a fluorine atom, chlorine atom, iodine atom and bromine atom. The substituent may consist solely of the hetero atom, or may be a group that contains the hetero atom and a group or atom other than the hetero atom.

Specific examples of the "non-aromatic divalent substituent containing a hetero atom" that substitutes a portion of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—.

Among the aforementioned non-aromatic divalent substituents containing a hetero atom, a substituent that substitutes a portion of the carbon atoms that constitute the ring structure of a cyclic alkyl group is preferably —O—, —C(=O)—O—, —S—, —S(=O)$_2$— or —S(=O)$_2$—O—. Specific examples of cyclic alkyl groups having such a substituent include the groups represented by formulas (L1) to (L6) and (S1) to (S4) shown below.

[Chemical Formula 6]

(L1)
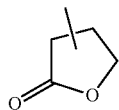

(L2)
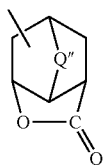

(L3)
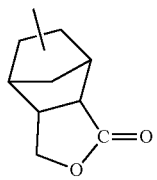

(L4)
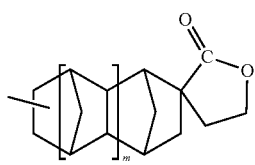

(L5)
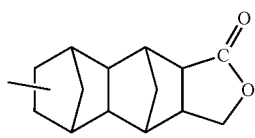

(L6)
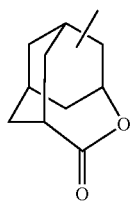

(S1)
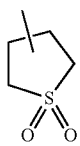

(S2)
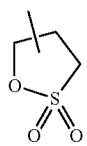

(S3)
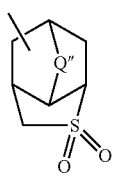

(S4)
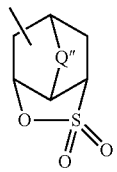

In the formulas, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms), and m represents an integer of 0 or 1.

Examples of the alkylene groups for Q", $R^{94}$ and $R^{95}$ include the same alkylene groups as those described above for $R^{90}$ to $R^{93}$ within the description of the divalent linking group for A.

In these cyclic alky groups, part of the hydrogen atoms bonded to the carbon atoms that constitute the ring structure(s) may be substituted with a non-aromatic substituent. Examples of this substituent include an alkyl group, alkoxy group, halogen atom, halogenated alkyl group, hydroxyl group or oxo group (=O). As the alkyl group, an alkyl group of 1 to 5 carbon atoms is preferred, and a methyl group, ethyl group, propyl group, n-butyl group or tert-butyl group is particularly desirable. Examples of the alkoxy group and the halogen atom include the same groups and atoms as those listed above for the substituent used for substituting part or all of the aforementioned hydrogen atoms.

In formula (a0-0-1), X represents a non-aromatic divalent linking group or a single bond.

Examples of the divalent linking group for X include the same divalent linking groups as those mentioned above within the description of $R^{0-1}$ (but excluding those groups having an aromatic hydrocarbon group).

Among the above possibilities, X is preferably a divalent linking group containing an oxygen atom or a single bond.

Specific examples of the divalent linking group containing an oxygen atom include the same groups as those mentioned above for the divalent linking group for A in the general formula -A-[C($R^{f1}$)($R^{f2}$)]$_m$—, within the description of $R^1$ within the aforementioned formulas (a0-1) to (a0-3), and groups represented by —O—C(=O)—$R^5$— are particularly desirable. $R^5$ represents an alkylene group, examples of which include the same groups as those described above for the alkylene group for $R^{92}$ in the formula —O—C(=O)—$R^{92}$— mentioned within the description of the divalent linking group for A.

In formula (a0-0-1), each of $R^3$ and $R^4$ independently represents an alkyl group which may have a non-aromatic substituent. Examples of this alkyl group include the same groups as those described above for $R^2$.

$R^3$ and $R^4$ may be bonded to each other to form a ring together with the sulfur atom in the formula. The ring may be either monocyclic or polycyclic. For example, if one or both of $R^3$ or $R^4$ are cyclic alkyl groups, then a polycyclic ring structure (condensed ring structure) is formed when these groups are bonded to each other.

When $R^3$ and $R^4$ are bonded to each other to form a ring, the ring that includes the sulfur atom from the formula within the ring structure is preferably a 3- to 10-membered ring, and more preferably a 5- to 7-membered ring, including the sulfur atom.

In the present invention, the cation moiety (R²—X—S⁺(R³)(R⁴)) in formula (a0-0-1) is preferably a cation represented by a general formula (I-1), (I-2), (I-3) or (I-4) shown below.

[Chemical Formula 7]

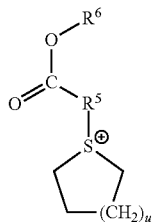

(I-1)

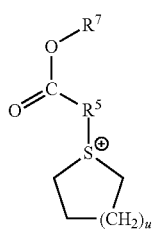

(I-2)

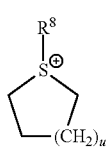

(I-3)

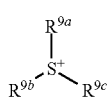

(I-4)

In the formulas, u represents an integer of 1 to 3, $R^5$ represents an alkylene group which may have a non-aromatic substituent, $R^6$ represents an alkyl group which may have a non-aromatic substituent, $R^7$ represents an alkyl group or alkoxy group which may have a non-aromatic substituent, or a hydroxyl group, $R^8$ represents an alkyl group which may have a non-aromatic substituent, and each of $R^{9a}$ to $R^{9c}$ independently represents an alkyl group which may have a non-aromatic substituent.

In formula (I-1) to (I-3), u represents an integer of 1 to 3, and is most preferably 1 or 2.

Examples of the alkylene group for $R^5$ include the same groups as those described above for the alkylene group for $R^{92}$ in the formula —O—C(=O)—$R^{92}$—, which was mentioned in the description of A within the aforementioned general formula -A-[C($R^{f1}$)($R^{f2}$)]$_m$—, and a linear or branched alkylene group is preferred. The alkylene group preferably contains 1 to 12 carbon atoms, more preferably 1 to 5 carbon atoms, still more preferably 1 to 3 carbon atoms, and most preferably 1 or 2 carbon atoms. Examples of the non-aromatic substituent which the alkylene group may have as a substituent include the same groups as those described above for the non-aromatic substituent which the alkyl group for $R^2$ may have.

The alkyl group which may have a non-aromatic substituent for $R^6$, and the non-aromatic substituent which this alkyl group may have as a substituent are the same as the respective groups mentioned within the description of $R^2$.

$R^6$ is preferably an acid-dissociable group. This improves the resolution limit. Examples of the acid-dissociable group include the same groups as those described below within the description for the structural unit (a1), and specific examples include a tertiary alkyl ester-type acid-dissociable group and an acetal-type acid-dissociable group.

Of these, a tertiary alkyl ester-type acid-dissociable group is preferred, and an acid-dissociable group containing an aliphatic cyclic group is particularly desirable.

The alkyl group which may have a non-aromatic substituent for $R^7$, and the non-aromatic substituent which this alkyl group may have as a substituent are the same as the respective groups mentioned within the description of $R^2$.

Examples of the alkoxy group which may have a non-aromatic substituent include groups in which —O— is bonded to an aforementioned alkyl group which may have a non-aromatic substituent, and examples of the non-aromatic substituent which this alkoxy group may have as a substituent include the same groups as those mentioned within the description of $R^2$.

The alkyl group which may have a non-aromatic substituent for $R^8$, and the non-aromatic substituent which this alkyl group may have as a substituent are the same as the respective groups mentioned within the description of $R^2$.

Examples of the alkyl group for $R^{9a}$ to $R^{9c}$ include the same groups as those described above for $R^2$, and the alkyl group preferably contains 5 to 15 carbon atoms. The alkyl group may be linear, branched or cyclic. It is thought that a cyclic alkyl group improves the lithography properties, and is therefore preferred. A chain-like alkyl group, and particularly a linear alkyl group, is preferred in terms of ease of synthesis. Examples of the non-aromatic substituent which the alkyl group may have as a substituent include the same groups as those described above for the non-aromatic substituent which the alkyl group for $R^2$ may have.

The structural unit (a0) of the component (A1) may be either a single type of structural unit or a combination of two or more types of structural units.

The amount of the structural unit (a0) within the component (A1), based on the combined total of all the structural units that constitute the component (A1), is preferably within a range from 1 to 30 mol %, and more preferably from 5 to 20 mol %. When this amount of the structural unit (a0) is at least 5 mol %, the sensitivity improves. Further, when the amount is not more than 20 mol %, satisfactory solubility within the resist solvent (a component (S) described below) can be ensured.

In those cases where the component (A1) is a polymeric compound that exhibits increased polarity under the action of acid, the component (A1) preferably contains an acid-degradable group that exhibits increased polarity under the action of acid.

The "acid-degradable group" describes a group having acid degradability which, under the action of the acid (such as the acid generated from the structural unit (a0) upon exposure or the acid generated from an optional component (B) described below), undergoes cleavage of at least some of the bonds within the structure of the acid-degradable group. The acid-degradable group is described in more detail below, within the description of the structural unit (a1).

In those cases where the structural unit (a0) includes an acid-degradable group (such as the case where $R^1$ has an acid-degradable region within the structure, or the case where $R^6$ in the formula (I-1) is an acid-degradable group), the component (A1) may be composed solely of the structural unit (a0), or may also include a structural unit (a1) containing an acid-degradable group that exhibits increased polarity under the action of acid.

In those cases where the structural unit (a0) does not include an acid-degradable group, the component (A1) must include the structural unit (a1) in addition to the structural unit (a0).

(Structural Unit (a1))

The structural unit (a1) is a structural unit containing an acid-degradable group that exhibits increased polarity under the action of acid.

As mentioned above, the term "acid-degradable group" describes a group having acid degradability which, under the action of acid, undergoes cleavage of at least some of the bonds within the structure of the acid-degradable group.

Examples of the acid-degradable group that exhibits increased polarity under the action of acid include groups which dissociate under the action of acid to form a polar group.

Examples of this polar group include a carboxyl group, hydroxyl group, amino group and sulfo group ($-SO_3H$). Among these groups, polar groups that contain an —OH within the structure (hereinafter also referred to as "OH-containing polar groups") are preferred, a carboxyl group or a hydroxyl group is more preferred, and a carboxyl group is particularly desirable.

More specific examples of the acid-degradable group include groups in which an aforementioned polar group is protected with an acid-dissociable group (such as a group in which the hydrogen atom of an OH-containing polar group is protected with an acid-dissociable group).

An "acid-dissociable group" describes a group having acid dissociability which, under the action of an acid (such as the acid generated from the structural unit (a0) upon exposure), undergoes cleavage of at least the bond between the acid-dissociable group and the atom adjacent to the acid-dissociable group. An acid-dissociable group that constitutes an acid-degradable group must be a group of lower polarity than the polar group generated by dissociation of the acid-dissociable group, so that when the acid-dissociable group dissociates under the action of acid, a polar group having a higher polarity than the acid-dissociable group is generated, resulting in an increase in the polarity. As a result, the polarity of the entire component (A1) increases. Increasing the polarity causes a relative increase in the solubility within the alkali developing solution in the case of an alkali developing process. On the other hand, in the case of a solvent developing process, increasing the polarity causes a relative decrease in the solubility in the organic developing solution containing an organic solvent.

There are no particular limitations on the acid-dissociable group, and any of the groups that have been proposed as acid-dissociable groups for the base resins of chemically amplified resists can be used. Generally, groups that form a cyclic or chain-like tertiary alkyl ester with the carboxyl group of (meth)acrylic acid or the like, and acetal-type acid-dissociable groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

The term "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereinafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched acid-dissociable groups and acid-dissociable groups containing an aliphatic cyclic group.

Here, the term "aliphatic branched" refers to a branched structure having no aromaticity. The structure of the "aliphatic branched acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but in most cases, is preferably saturated.

Examples of the aliphatic branched, acid-dissociable group include groups represented by the formula $-C(R^{71})(R^{72})(R^{73})$. In this formula, each of $R^{71}$ to $R^{73}$ independently represents a linear alkyl group of 1 to 5 carbon atoms. The group represented by the formula $-C(R^{71})(R^{72})(R^{73})$ preferably has 4 to 8 carbon atoms, and specific examples include a tert-butyl group, 2-methyl-2-butyl group, 2-methyl-2-pentyl group and 3-methyl-3-pentyl group.

A tert-butyl group is particularly desirable.

The term "aliphatic cyclic group" refers to a monocyclic group or polycyclic group that has no aromaticity.

The aliphatic cyclic group within the "acid-dissociable groups containing an aliphatic cyclic group" may or may not have a substituent. Examples of the substituent include alkyl groups of 1 to 5 carbon atoms, alkoxy groups of 1 to 5 carbon atoms, a fluorine atom, fluorinated alkyl groups of 1 to 5 carbon atoms, and an oxo group (=O).

The basic ring structure of the "aliphatic cyclic group" excluding substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either monocyclic or polycyclic.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, a portion of the carbon atoms that constitute the ring structure of any of these alicyclic hydrocarbon groups may be substituted with an ethereal oxygen atom (—O—).

Examples of acid-dissociable groups containing an aliphatic cyclic group include groups of type (i) and type (ii) described below.

(i) a group which forms a tertiary carbon atom on the ring structure of a monovalent aliphatic cyclic group in which a substituent (a group or an atom other than hydrogen) is bonded to the carbon atom to which an atom adjacent to the acid dissociable, dissolution inhibiting group (e.g., "—O—" within "—C(=O)—O— group") is bonded.

(ii) a group which have a monovalent aliphatic cyclic group, and a branched alkylene group containing a tertiary carbon atom that is bonded to the monovalent aliphatic cyclic group.

In a group of type (i) described above, as the substituent bonded to the carbon atom to which an atom adjacent to the acid dissociable group is bonded on the ring skeleton of the aliphatic cyclic group, an alkyl group can be mentioned. Examples of these alkyl groups include the same groups as those described below for $R^{14}$ in formulas (1-1) to (1-9) shown below.

Specific examples of groups of type (i) include groups represented by general formulas (1-1) to (1-9) shown below.

Specific examples of groups of type (ii) include groups represented by general formulas (2-1) to (2-6) shown below.

[Chemical Formula 8]

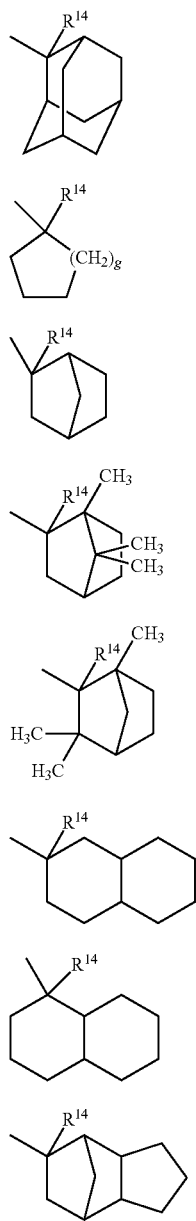

(1-1)
(1-2)
(1-3)
(1-4)
(1-5)
(1-6)
(1-7)
(1-8)

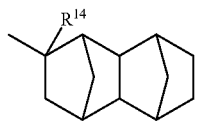

(1-9)

In the formulas above, $R^{14}$ represents an alkyl group, and g represents an integer of 0 to 8.

[Chemical Formula 9]

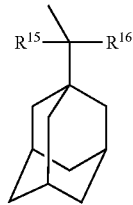

(2-1)

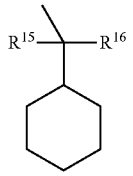

(2-2)

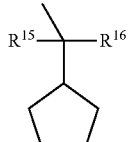

(2-3)

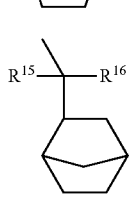

(2-4)

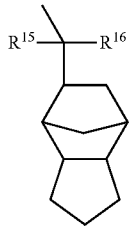

(2-5)

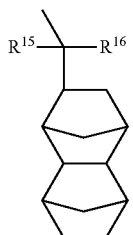

(2-6)

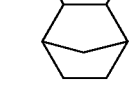

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is the most desirable.

g is preferably an integer of 0 to 3, more preferably an integer of 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and formulas (2-1) to (2-6), a portion of the carbon atoms that constitute the ring(s) may be replaced with an ethereal oxygen atom (—O—).

Further, in formulas (1-1) to (1-9) and formulas (2-1) to (2-6), one or more of the hydrogen atoms bonded to the carbon atoms that constitute the ring(s) may be substituted with a substituent. Examples of the substituent include an alkyl group of 1 to 5 carbon atoms, a fluorine atom, a fluorinated alkyl group and an oxo group (=O).

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group.

Examples of acetal-type acid-dissociable groups include groups represented by general formula (p1) shown below.

[Chemical Formula 10]

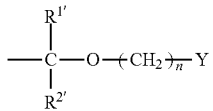

(p1)

In the formula, each of $R^{1\prime}$ and $R^{2\prime}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p1), n is preferably an integer of 0 to 2, more preferably 0 or 1, and most preferably 0.

Examples of the alkyl group for $R^{1\prime}$ and $R^{2\prime}$ include the same alkyl groups as those described below for the α-position substituent within the description relating to the acrylate ester in a structural unit (a11) described below. Among these, a methyl group or ethyl group is preferable, and a methyl group is the most desirable. In the present invention, it is preferable that at least one of $R^{1\prime}$ and $R^{2\prime}$ is a hydrogen atom. That is, it is preferable that the acid-dissociable group (p1) is a group represented by general formula (p1-1) shown below.

[Chemical Formula 11]

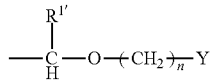

(p1-1)

In the formula, $R^{1\prime}$, n and Y are the same as defined above.

Examples of the alkyl group for Y include the same alkyl groups as those described below, within the description relating to the acrylate ester in the structural unit (a11), for the substituent which may be bonded to the carbon atom on the α-position.

As the aliphatic cyclic group for Y, any of the monocyclic or polycyclic aliphatic cyclic groups which have been proposed for conventional ArF resists and the like can be selected and used as appropriate. For example, the same groups as those described above for the aliphatic cyclic group of the "acid-dissociable group containing an aliphatic cyclic group" can be used.

Further, as the acetal-type acid-dissociable group, groups represented by general formula (p2) shown below can also be used.

[Chemical Formula 12]

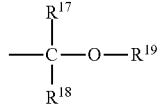

(p 2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (preferably an alkylene group of 1 to 5 carbon atoms), wherein $R^{19}$ and $R^{17}$ are bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

In the structural unit (a1), although there are no particular limitations on the main chain, specific examples include a structural unit (a11), which is derived from an acrylate ester in which the hydrogen atom bonded to the carbon atom on the α-position may be substituted with a substituent, and contains an acid-degradable group; a structural unit (a12), which is derived from a hydroxystyrene in which the hydrogen atom bonded to the carbon atom on the α-position may be substituted with a substituent and a hydrogen atom bonded to the benzene ring may be substituted with a substituent other than a hydroxyl group, and in which the hydrogen atom of the hydroxyl group is substituted with an acid-dissociable group or a substituent containing an acid-dissociable group; and a structural unit (a13), which is derived from a vinyl(hydroxynaphthalene) in which the hydrogen atom bonded to the carbon atom on the α-position may be substituted with a substituent and a hydrogen atom bonded to the naphthalene ring may be substituted with a substituent other than a hydroxyl group, and in which the hydrogen atom of the hydroxyl group is substituted with an acid-dissociable group or a substituent containing an acid-dissociable group. The structural unit (a11) is preferred in terms of improving line edge roughness, whereas the structural units (a12) and (a13) are preferred in terms of facilitating absorption of wavelengths in the EUV region, and reducing the effect of OoB light on the acid generator component.

{Structural Unit (a11)}

The structural unit (a11) is a structural unit derived from an acrylate ester in which the hydrogen atom bonded to the carbon atom on the α-position may be substituted with a substituent, and contains an acid-degradable group.

The term "acrylate ester" describes a compound in which the hydrogen atom at the carboxyl group terminal of acrylic acid ($CH_2$=CH—COOH) has been substituted with an organic group.

A "structural unit derived from an acrylate ester" refers to a structural unit that is formed by the cleavage of the ethylenic double bond of an acrylate ester.

In the present description, an acrylate ester in which the hydrogen atom bonded to the carbon atom on the α-position is substituted with a substituent may also be termed an "α-substituted acrylate ester". Further, the generic term "(α-substituted) acrylate ester" may be used to describe both the acrylate ester and the α-substituted acrylate ester.

Examples of the substituent which may be bonded to the carbon atom on the α-position of an α-substituted acrylate ester include a halogen atom, an alkyl group of 1 to 5 carbon atoms, a halogenated alkyl group of 1 to 5 carbon atoms, and a hydroxyalkyl group. The carbon atom on the α-position of a structural unit derived from an acrylate ester (the α-position carbon atom) refers to the carbon atom bonded to the carbonyl group, unless specified otherwise.

Examples of the halogen atom for the α-position substituent include a fluorine atom, chlorine atom, bromine atom and iodine atom.

Specific examples of the alkyl group of 1 to 5 carbon atoms for the α-position substituent include linear or branched alkyl groups such as a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms for the α-position substituent include groups in which part or all of the hydrogen atoms of an aforementioned alkyl group of 1 to 5 carbon atoms are each substituted with a halogen atom. Examples of the halogen atom include a fluorine atom, chlorine atom, bromine atom and iodine atom, and a fluorine atom is particularly desirable.

Further, examples of the hydroxyalkyl group for the α-position substituent include hydroxyalkyl groups of 1 to 5 carbon atoms, and more specifically, groups in which part or all of the hydrogen atoms of an aforementioned alkyl group of 1 to 5 carbon atoms are each substituted with a hydroxyl group.

In the present invention, it is preferable that a hydrogen atom, an alkyl group of 1 to 5 carbon atoms or a halogenated alkyl group of 1 to 5 carbon atoms is bonded to the carbon atom on the α-position of the (α-substituted) acrylate ester, and of these, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

Specific examples of the structural unit (a11) include structural units represented by a general formula (a1-0-1) shown below and structural units represented by a general formula (a1-0-2) shown below.

[Chemical Formula 13]

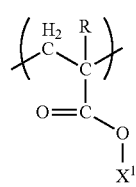

(a1-0-1)

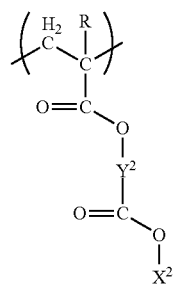

(a1-0-2)

In the formulas, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In the general formula (a1-0-1), examples of the alkyl group and the halogenated alkyl group for R include the same alkyl groups and halogenated alkyl groups as those described above for the α-position substituent within the description relating to the α-substituted acrylate ester. R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, a tertiary alkyl ester-type acid-dissociable group is preferable.

In the general formula (a1-0-2), R is the same as defined above.

$X^2$ is the same as defined for $X^1$ in formula (a1-0-1).

Although there are no particular limitations on the divalent linking group for $Y^2$, preferred examples include divalent hydrocarbon groups which may have a substituent, and divalent linking groups containing a hetero atom. Specific examples of these divalent hydrocarbon groups which may have a substituent, and divalent linking groups containing a hetero atom include the same divalent linking groups as those described above for $R^{0-1}$ in the general formula (a0-0-1) within the description relating to the structural unit (a0).

$Y^2$ is preferably a linear or branched alkylene group, a divalent alicyclic hydrocarbon group, or a divalent linking group containing a hetero atom.

When $Y^2$ is a linear or branched alkylene group, the alkylene group preferably contains 1 to 10 carbon atoms, more preferably 1 to 6 carbon atoms, still more preferably 1 to 4 carbon atoms, and most preferably 1 to 3 carbon atoms. Specific examples include the same linear alkylene groups and branched alkylene groups as those mentioned above for the linear or branched aliphatic hydrocarbon group within the description of the divalent linking group for $R^{0-1}$. When $Y^2$ is a divalent alicyclic hydrocarbon group, examples of the alicyclic hydrocarbon group include the same alicyclic hydrocarbon groups as those mentioned above as the "aliphatic hydrocarbon group that includes a ring within the structure" within the description of the divalent linking group for $R^{0-1}$.

Specific examples of the alicyclic hydrocarbon group include groups in which two or more hydrogen atoms have been removed from cyclopentane, cyclohexane, norbornane, isobornane, adamantane, tricyclodecane and tetracyclododecane.

When $Y^2$ is a divalent linking group containing a hetero atom, preferred examples of the divalent linking group include —O—, —C(=O)—O—, —C(=O)—, —O—C(=O)—O—, —C(=O)—NH—, —NH— (wherein H may be substituted with a substituent such as an alkyl group or acyl group), —S—, —S(=O)$_2$—, —S(=O)$_2$—O—, and groups represented by general formulas —Y$^{21}$—O—Y$^{22}$—, —[Y$^{21}$—C(=O)—O]$_m$—Y$^{22}$— and —Y$^{21}$—O—C(=O)—Y$^{22}$— [wherein each of Y$^{21}$ and Y$^{22}$ independently represents a divalent hydrocarbon group which may have a substituent, O represents an oxygen atom, and m' represents an integer of 0 to 3].

When $Y^2$ represents —NH—, the H may be substituted with a substituent such as an alkyl group or acyl group. The substituent (the alkyl group or acyl group or the like) preferably contains 1 to 10 carbon atoms, more preferably 1 to 8 carbon atoms, and most preferably 1 to 5 carbon atoms.

In the formulas —Y$^{21}$—O—Y$^{22}$—, —[Y$^{21}$—C(=O)—O]$_m$—Y$^{22}$— and —Y$^{21}$—O—C(=O)—Y$^{22}$—, each of Y$^{21}$ and Y$^{22}$ independently represents a divalent hydrocarbon group which may have a substituent. Examples of this divalent hydrocarbon group include the same groups as those described above for the "divalent hydrocarbon group which may have a substituent" for $R^{0-1}$. Y$^{21}$ is preferably a linear aliphatic hydrocarbon group, more preferably a linear alkylene group, still more preferably a linear alkylene group of 1 to 5 carbon atoms, and most preferably a methylene group or ethylene group.

Y$^{22}$ is preferably a linear or branched aliphatic hydrocarbon group, and is more preferably a methylene group, ethylene group or alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[Y$^{21}$—C(=O)—O]$_m$—Y$^{22}$—, m' represents an integer of 0 to 3, and is preferably an integer of 0 to 2, more preferably 0 or 1, and most preferably 1. In other words, the group represented by formula —[Y$^{21}$—C(=O)—O]$_m$—Y$^{22}$— is most preferably a group represented by a formula —Y$^{21}$—C(=O)—O—Y$^{22}$—. Among such groups, groups represented by —(CH$_2$)$_{a'}$C(=O)—O—(CH$_2$)$_{b'}$— are particularly preferred. In this formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

The divalent linking group containing a hetero atom for Y$^2$ is preferably an organic group composed of a combination of at least one non-hydrocarbon group and a divalent hydrocarbon group. Among such groups, linear groups containing an oxygen atom as the hetero atom, such as groups containing an ether linkage or an ester linkage, are preferred, a group represented by one of the above formulas —Y$^{21}$—O—Y$^{22}$—, —[Y$^{21}$—C(=O)—O]$_m$—Y$^{22}$— or —Y$^{21}$—O—C(=O)—Y$^{22}$— is more preferred, and a group represented by the formula —[Y$^{21}$—C(=O)—O]$_m$—Y$^{22}$— or the formula —Y$^{21}$—O—C(=O)—Y$^{22}$— is particularly desirable.

Among the above possibilities, Y$^2$ is preferably a linear or branched alkylene group, or a divalent linking group containing a hetero atom, and is more preferably a linear or branched alkylene group, a group represented by the above formula —Y$^{21}$—O—Y$^{22}$—, a group represented by the above formula —[Y$^{21}$—C(=O)—O]$_m$—Y$^{22}$— or a group represented by the above formula —Y$^{21}$—O—C(=O)—Y$^{22}$—.

Specific examples of the structural unit (a11) include structural units represented by general formulas (a1-1) to (a1-4) shown below.

[Chemical Formula 14]

(a1-1)

(a1-2)

-continued

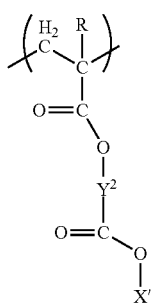
(a1-3)

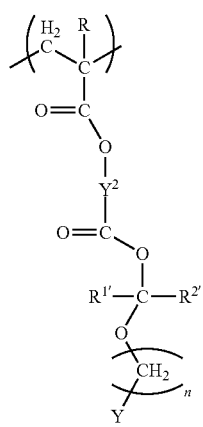
(a1-4)

In the formulas, R, $R^{1'}$, $R^{2'}$, n, Y and $Y^2$ are each the same as defined above, and X' represents a tertiary alkyl ester-type acid-dissociable group.

In the above formulas, examples of X' include the same tertiary alkyl ester-type acid-dissociable groups as those described above.

$R^{1'}$, $R^{2'}$, n and Y are the same as defined above for $R^{1'}$, $R^{2'}$, n and Y respectively in general formula (p1) within the description relating to the "acetal-type acid-dissociable group".

Examples of $Y^2$ include the same groups as those described above for $Y^2$ in general formula (a1-0-2).

Specific examples of the structural units represented by general formulas (a1-1) to (a1-4) are shown below.

In the formulas shown below, $R^\alpha$ represents a hydrogen atom, a methyl group or a trifluoromethyl group.

[Chemical Formula 15]

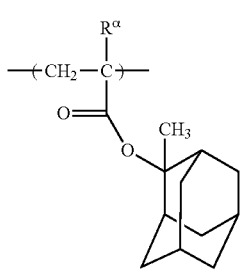
(a1-1-1)

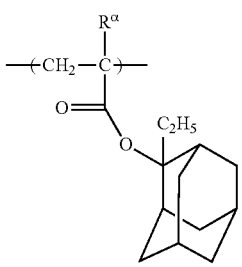
(a1-1-2)

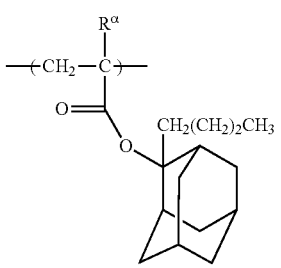
(a1-1-3)

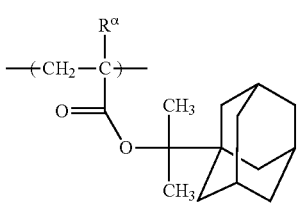
(a1-1-4)

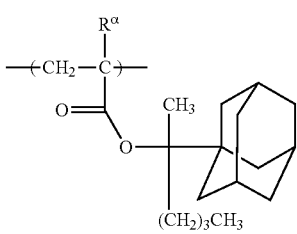
(a1-1-5)

(a1-1-6)

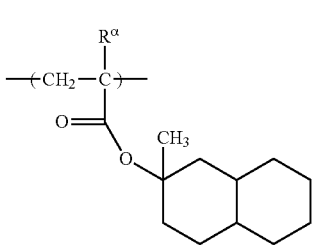
(a1-1-7)

(a1-1-8)
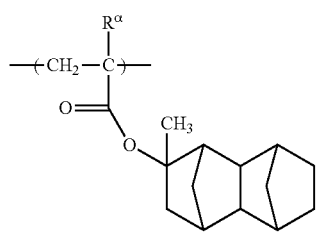
(a1-1-9)
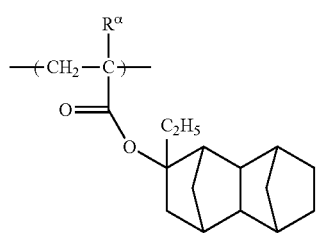
[Chemical Formula 16]
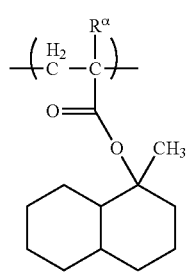
(a1-1-10)
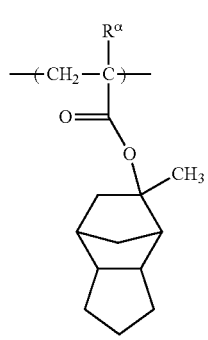
(a1-1-11)
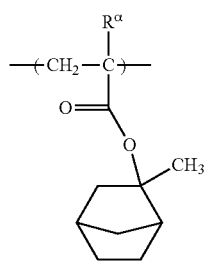
(a1-1-12)
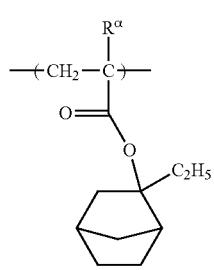
(a1-1-13)
(a1-1-14)
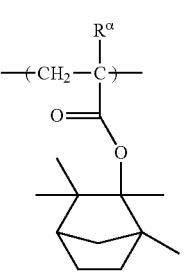
(a1-1-15)
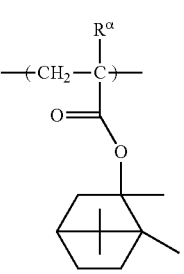
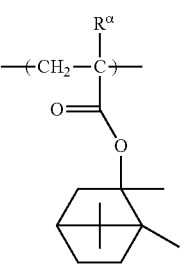
(a1-1-16)
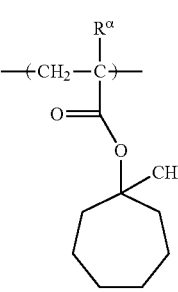
(a1-1-17)
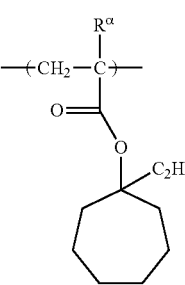
(a1-1-18)
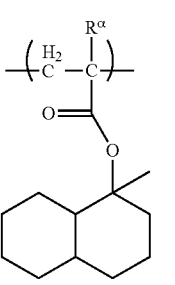

(a1-1-19) 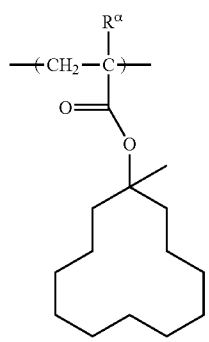
(a1-1-20) 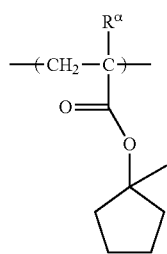
(a1-1-21) 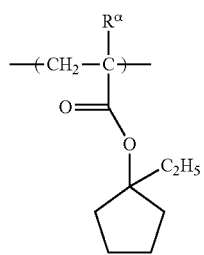
[Chemical Formula 17]
(a1-1-22) 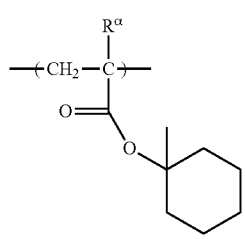
(a1-1-23) 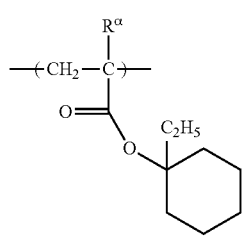
(a1-1-24) 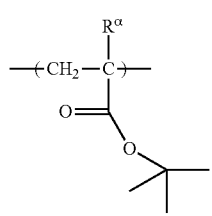
(a1-1-25) 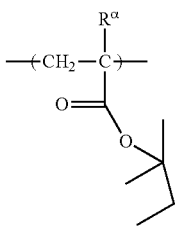
(a1-1-26) 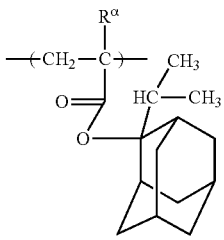
(a1-1-27) 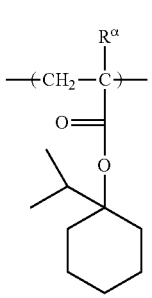
(a1-1-28) 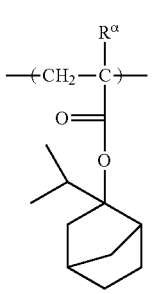
(a1-1-29) 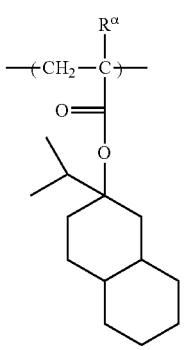

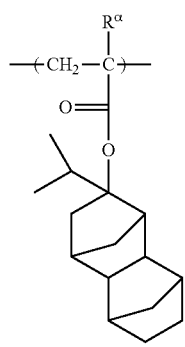 (a1-1-30)
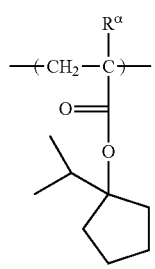 (a1-1-31)
[Chemical Formula 18]
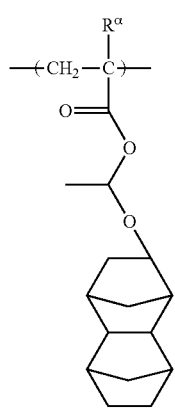 (a1-2-1)
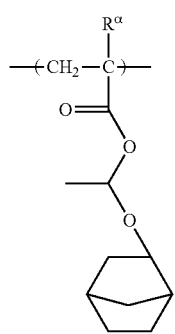 (a1-2-2)
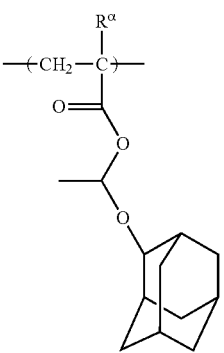 (a1-2-3)
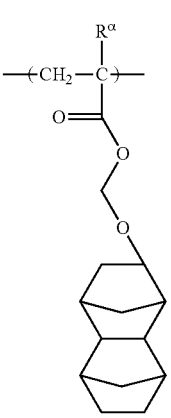 (a1-2-4)
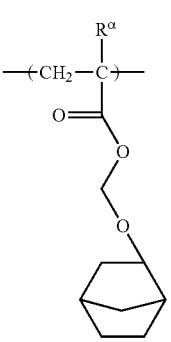 (a1-2-5)
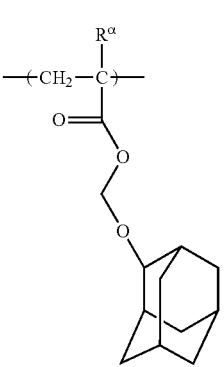 (a1-2-6)

(a1-2-7) 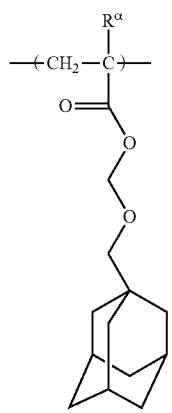
(a1-2-8) 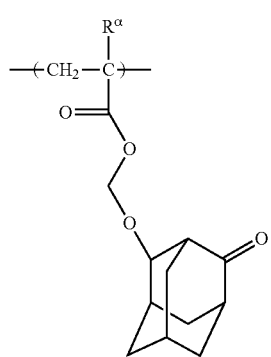
(a1-2-9) 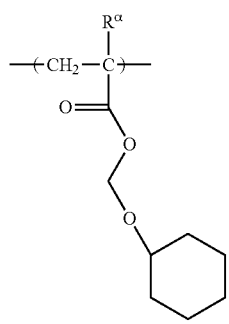
(a1-2-10) 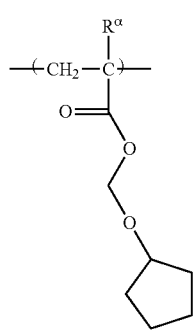
(a1-2-11) 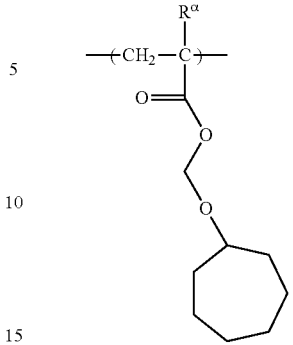
(a1-2-12) 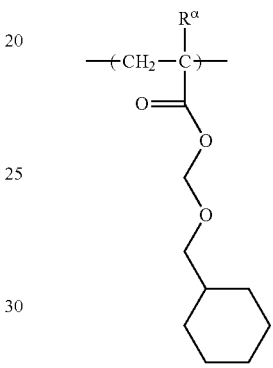
(a1-2-13) 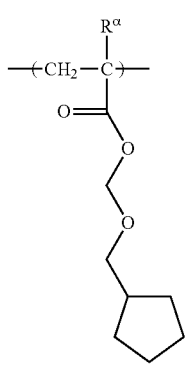
(a1-2-14) 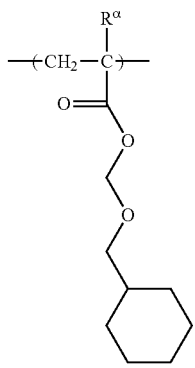

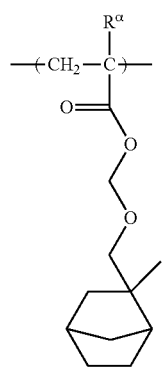 (a1-2-15)
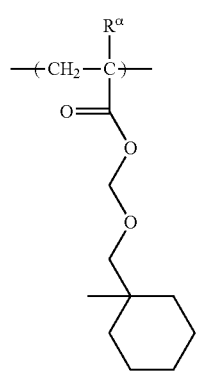 (a1-2-16)
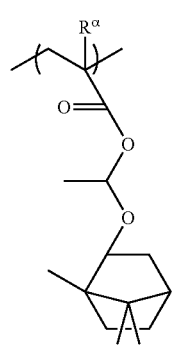 (a1-2-17)
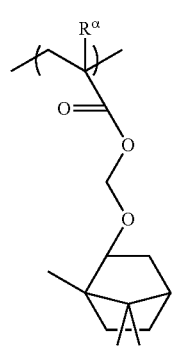 (a1-2-18)
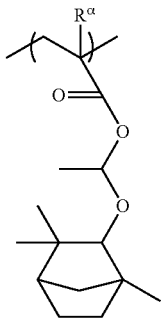 (a1-2-19)
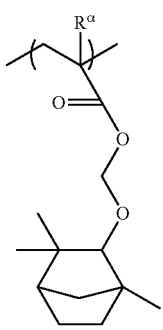 (a1-2-20)
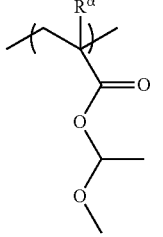 (a1-2-21)
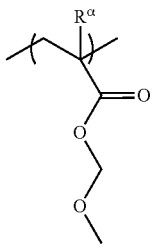 (a1-2-22)
(a1-2-23)

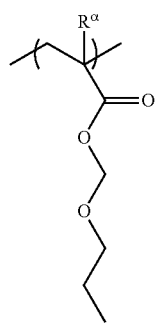
(a1-2-24)
[Chemical Formula 19]
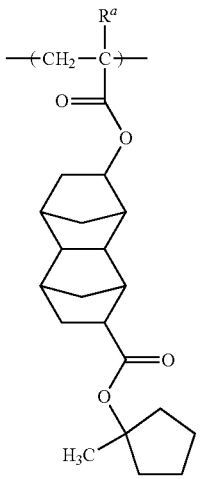
(a1-3-1)
(a1-3-2)
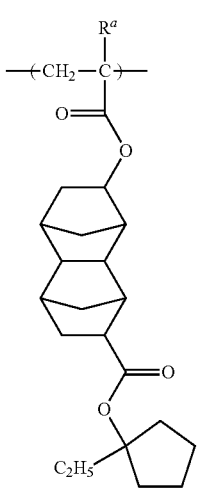
(a1-3-3)
(a1-3-4)
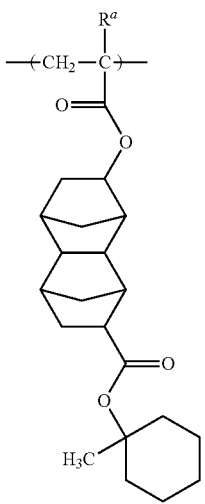
(a1-3-5)

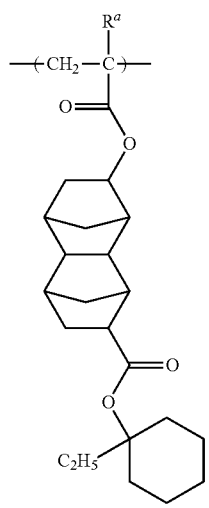
(a1-3-6)
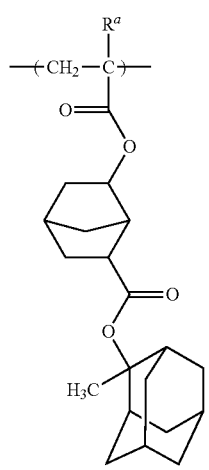
(a1-3-7)
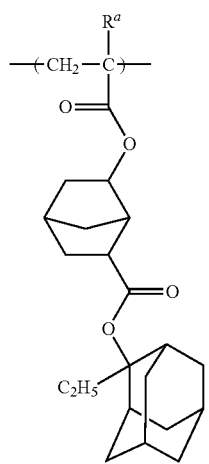
(a1-3-8)
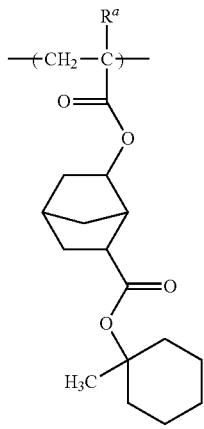
(a1-3-9)
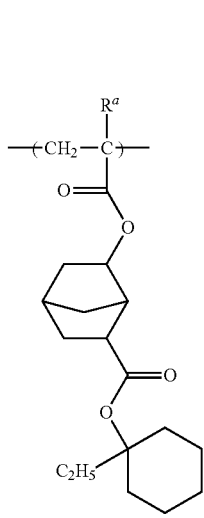
(a1-3-10)
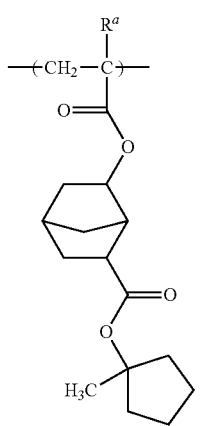
(a1-3-11)

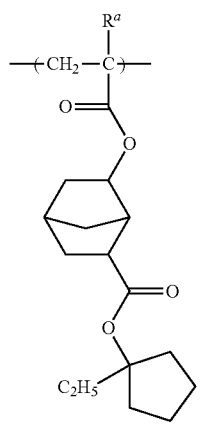
(a1-3-12)
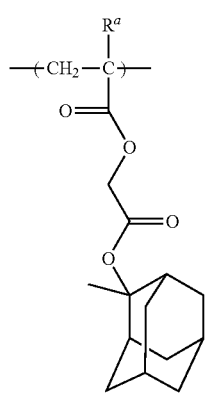
(a1-3-13)
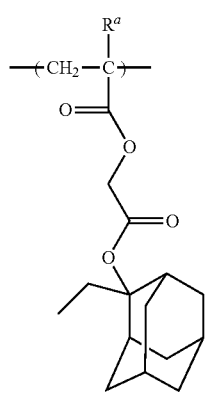
(a1-3-14)
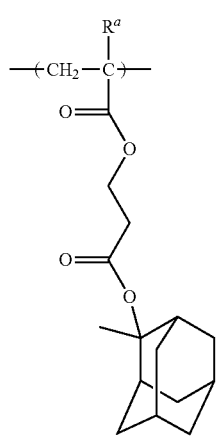
(a1-3-15)
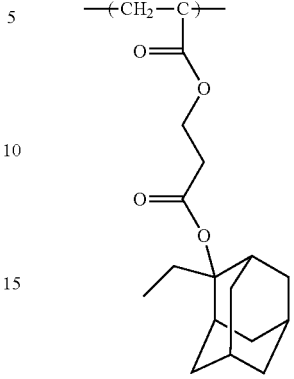
(a1-3-16)
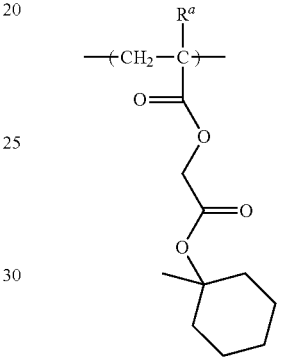
(a1-3-17)
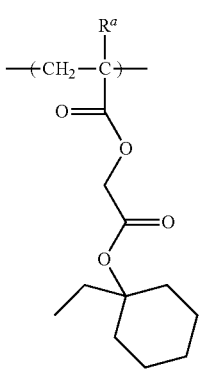
(a1-3-18)
[Chemical Formula 20]
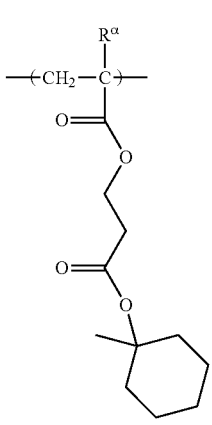
(a1-3-19)

(a1-3-20)
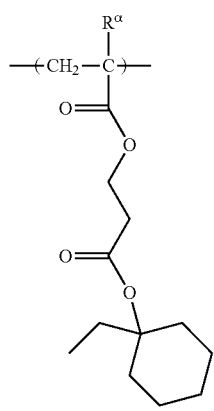
(a1-3-21)
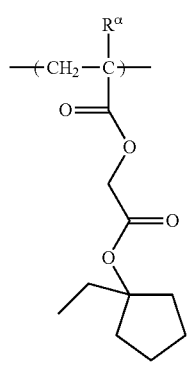
(a1-3-22)
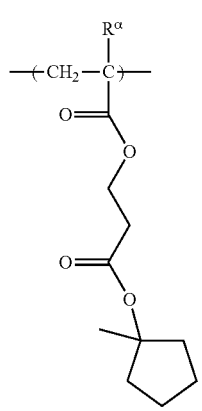
(a1-3-23)
(a1-3-24)
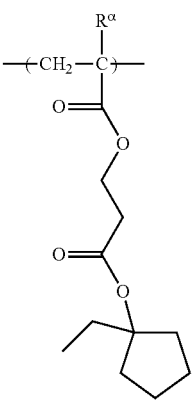
[Chemical Formula 21]
(a1-3-25)
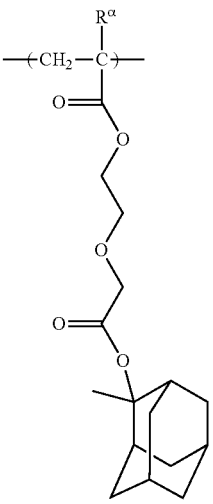
(a1-3-26)
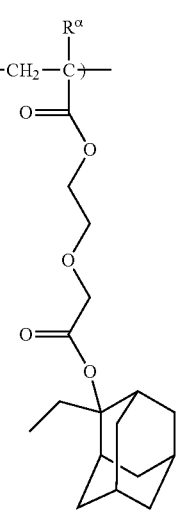

(a1-3-27) 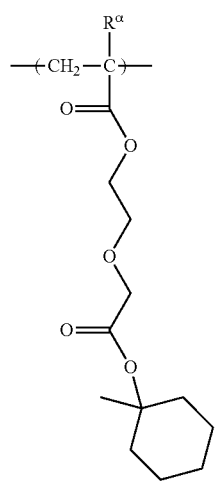
(a1-3-28) 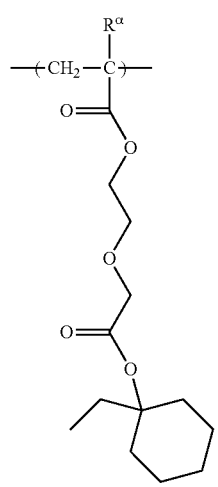
(a1-3-29) 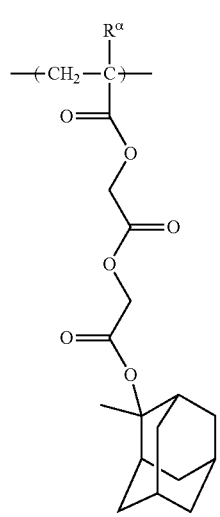
(a1-3-30) 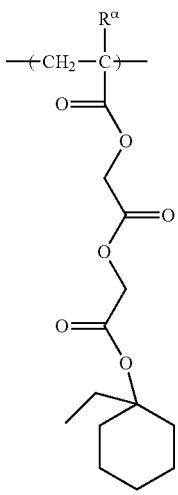
(a1-3-31) 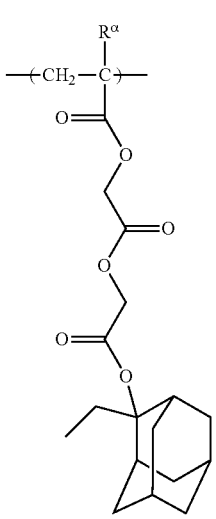
(a1-3-32) 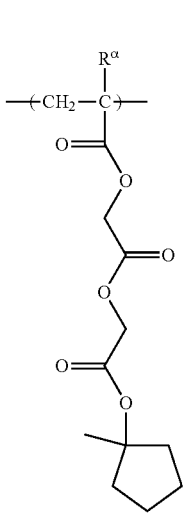

[Chemical Formula 22]
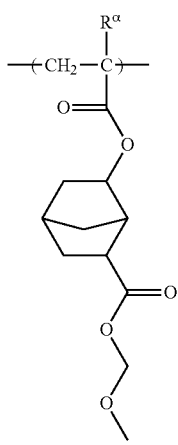
(a1-4-1)
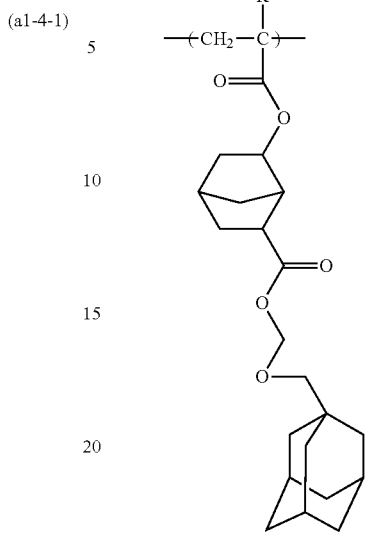
(a1-4-4)
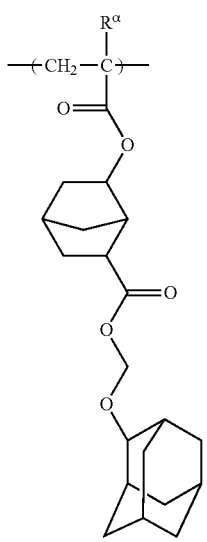
(a1-4-2)
(a1-4-5)
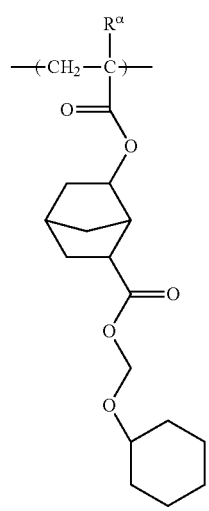
(a1-4-3)
(a1-4-6)
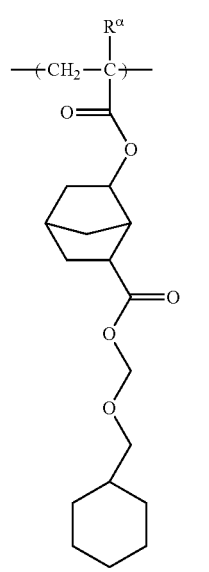

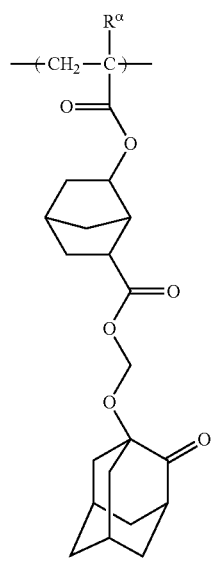
(a1-4-7)
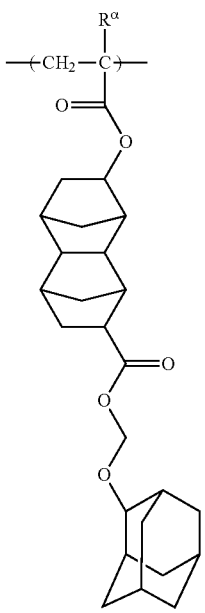
(a1-4-9)
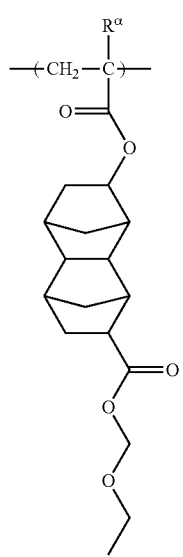
(a1-4-8)
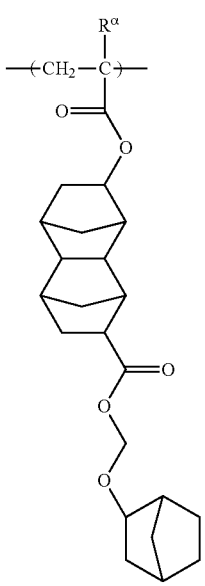
(a1-4-10)

(a1-4-11)
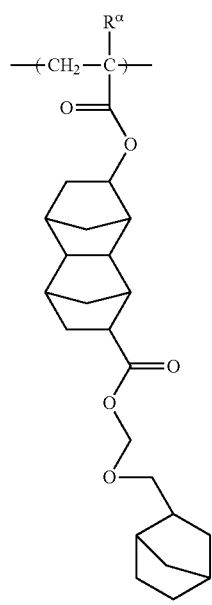
(a1-4-13)
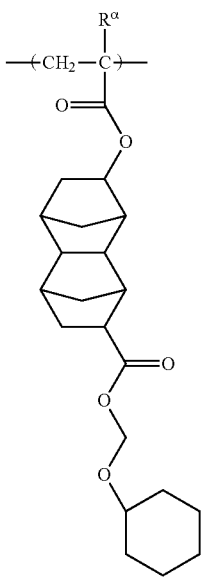
(a1-4-12)
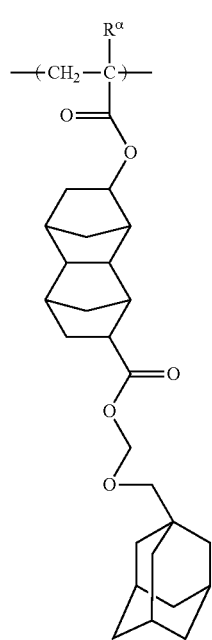
(a1-4-14)
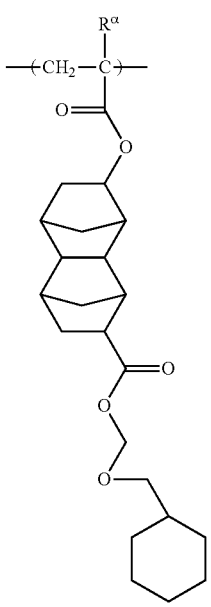

(a1-4-15)

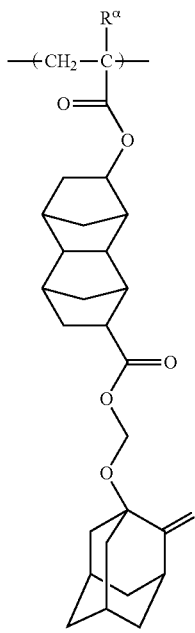

The present invention preferably includes, as the structural unit (a11), at least one structural unit selected from the group consisting of structural units represented by general formula (a1-0-11) shown below, structural units represented by general formula (a1-0-12) shown below, structural units represented by general formula (a1-0-13) shown below, and structural units represented by general formula (a1-0-2) shown below. Among these structural units, at least one structural unit selected from the group consisting of structural units represented by formula (a1-0-11), structural units represented by formula (a1-0-12) and structural units represented by general formula (a1-0-2) is particularly desirable.

[Chemical Formula 23]

(a1-0-11)

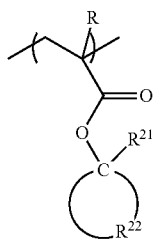

(a1-0-12)

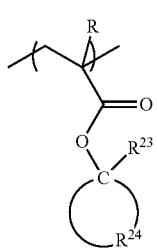

(a1-0-13)

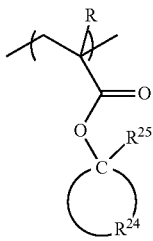

(a1-0-2)

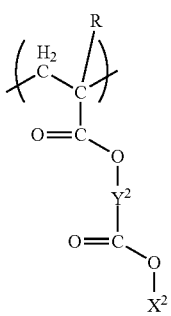

In the above formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group that forms an aliphatic monocyclic group together with the carbon atom to which $R^{22}$ is bonded, $R^{23}$ represents a branched alkyl group, $R^{24}$ represents a group that forms an aliphatic polycyclic group together with the carbon atom to which $R^{24}$ is bonded, $R^{25}$ represents a linear alkyl group of 1 to 5 carbon atoms, $Y^2$ represents a divalent linking group, and $X^2$ represents an acid-dissociable group.

In each of the above formulas, R, $Y^2$ and $X^2$ are the same as defined above.

In formula (a1-0-11), examples of the alkyl group for $R^{21}$ include the same alkyl groups as those described above for $R^{14}$ in the formulas (1-1) to (1-9), and a methyl group, ethyl group or isopropyl group is preferred.

In terms of $R^{22}$, examples of the aliphatic monocyclic group that is formed together with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

A portion of the carbon atoms that constitute the ring of the monocycloalkane may or may not be substituted with an ether group (—O—).

Further, the monocycloalkane may include an alkyl group of 1 to 5 carbon atoms, a fluorine atom, or a fluorinated alkyl group of 1 to 5 carbon atoms as a substituent.

Examples of the $R^{22}$ group that constitutes the aliphatic monocyclic group include linear alkylene groups which may have an ether group (—O—) interposed between the carbon atoms of the alkylene chain.

Specific examples of the structural units represented by formula (a1-0-11) include structural units represented by the above formulas (a1-1-16) to (a1-1-23), (a1-1-27) and (a1-1-31). Among these, structural units represented by general formula (a1-1-02) shown below, which includes the structural units represented by formulas (a1-1-16) and (a1-1-17), formulas (a1-1-20) to (a1-1-23), and formulas (a1-1-27) and (a1-1-31) are preferred. Furthermore, structural units represented by general formula (a1-1-02') shown below are also preferred.

In each of the formulas below, h is preferably 1 or 2.

[Chemical Formula 24]

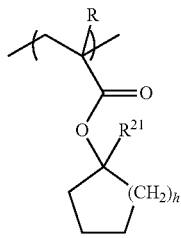

(a1-1-02)

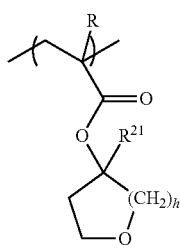

(a1-1-02')

In the formulas, R and $R^{21}$ are each the same as defined above, and h represents an integer of 1 to 3.

In formula (a1-0-12), examples of the branched alkyl group for $R^{23}$ include the same branched alkyl groups as those described above for the alkyl group for $R^{14}$ in the formulas (1-1) to (1-9), and an isopropyl group is particularly desirable.

Examples of the aliphatic polycyclic group formed by $R^{24}$ together with the carbon atom to which $R^{24}$ is bonded include the polycyclic groups among the aliphatic cyclic groups described above in connection with the tertiary alkyl ester-type acid-dissociable groups.

Specific examples of structural units represented by general formula (a1-0-12) include the structural units represented by the above formula (a1-1-26) and formulas (a1-1-28) to (a1-1-30).

The structural unit represented by formula (a1-0-12) is preferably a structural unit in which the aliphatic polycyclic group formed by $R^{24}$ together with the carbon atom to which $R^{24}$ is bonded is a 2-adamantyl group, and a structural unit represented by the above formula (a1-1-26) is particularly desirable.

In formula (a1-0-13), R and $R^{24}$ are each the same as defined above.

Examples of the linear alkyl group for $R^{25}$ include the same linear alkyl groups as those described above for the alkyl group for $R^{14}$ in the formulas (1-1) to (1-9), and a methyl group or ethyl group is the most desirable.

Specific examples of the structural units represented by formula (a1-0-13) include the structural units represented by formulas (a1-1-1) to (a1-1-3) and formulas (a1-1-7) to (a1-1-15), which were listed above as specific examples of the general formula (a1-1).

The structural unit represented by formula (a1-0-13) is preferably a structural unit in which the aliphatic polycyclic group formed by $R^{24}$ together with the carbon atom to which $R^{24}$ is bonded is a 2-adamantyl group, and a structural unit represented by the above formula (a1-1-1) or (a1-1-2) is particularly desirable.

Examples of the structural units represented by formula (a1-0-2) include structural units represented by the above formulas (a1-3) and (a1-4), and of these, a structural unit represented by formula (a1-3) is particularly desirable.

The structural unit represented by general formula (a1-0-2) is preferably a structural unit in which $Y^2$ in the formula is a group represented by the above formula —$Y^{21}$—O—$Y^{22}$—, a group represented by the above formula —[$Y^{21}$—C(=O)—O]$_m$—$Y^{22}$— or a group represented by the above formula —$Y^{21}$—O—C(=O)—$Y^{22}$—.

Preferred examples of such structural units include structural units represented by general formula (a1-3-01) shown below, structural units represented by general formula (a1-3-02) shown below, and structural units represented by general formula (a1-3-03) shown below.

[Chemical Formula 25]

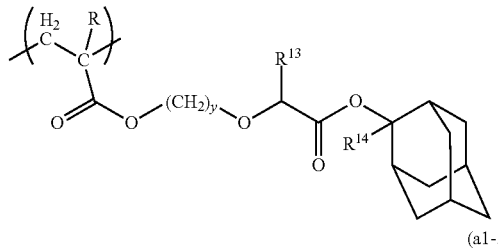

(a1-3-01)

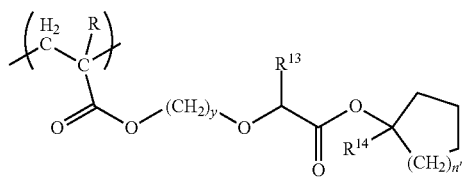

(a1-3-02)

In the formulas, R is the same as defined above, $R^{13}$ represents a hydrogen atom or a methyl group, $R^{14}$ represents an alkyl group, y represents an integer of 1 to 10, and n' represents an integer of 0 to 3.

[Chemical Formula 26]

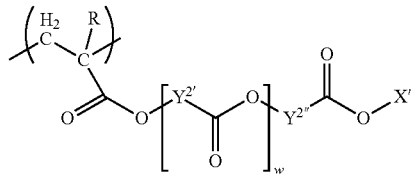

(a1-3-03)

In the formula, R is the same as defined above, each of $Y^{2'}$ and $Y^{2''}$ independently represents a divalent linking group, X' represents an acid-dissociable group, and w represents an integer of 0 to 3.

In formulas (a1-3-01) to (a1-3-02), $R^{13}$ is preferably a hydrogen atom.

$R^{14}$ is the same as defined above for $R^{14}$ in formulas (1-1) to (1-9).

y is preferably an integer of 1 to 8, more preferably an integer of 1 to 5, and most preferably 1 or 2.

n' is preferably 1 or 2, and is most preferably 2.

Specific examples of the structural units represented by formula (a1-3-01) include the structural units represented by the above formulas (a1-3-25) and (a1-3-26).

Specific examples of the structural units represented by formula (a1-3-02) include the structural units represented by the above formulas (a1-3-27) and (a1-3-28).

Examples of the divalent linking groups for $Y^{2'}$ and $Y^{2''}$ in formula (a1-3-03) include the same groups as those described above for $Y^2$ in the general formula (a1-3).

$Y^{2'}$ is preferably a divalent hydrocarbon group which may have a substituent, is more preferably a linear aliphatic hydrocarbon group, and is still more preferably a linear alkylene group. Among such groups, a linear alkylene group of 1 to 5 carbon atoms is preferable, and a methylene group or ethylene group is the most desirable.

$Y^{2''}$ is preferably a divalent hydrocarbon group which may have a substituent, is more preferably a linear aliphatic hydrocarbon group, and is still more preferably a linear alkylene group. Among such groups, a linear alkylene group of 1 to 5 carbon atoms is preferable, and a methylene group or ethylene group is the most desirable.

The acid-dissociable group for X' is the same as defined above, is preferably a tertiary alkyl ester-type acid-dissociable group, is more preferably a group of type (i) described above, in which a substituent is bonded to a carbon atom within the ring structure of a monovalent aliphatic cyclic group that is bonded to the atom adjacent to the acid-dissociable group, thereby forming a tertiary carbon atom on the ring structure of the monovalent aliphatic cyclic group, and is most preferably a group represented by the above general formula (1-1).

w represents an integer of 0 to 3, and is preferably an integer of 0 to 2, more preferably 0 or 1, and most preferably 1.

The structural unit represented by general formula (a1-3-03) is preferably a structural unit represented by general formula (a1-3-03-1) or (a1-3-03-2) shown below, and among these, is most preferably a structural unit represented by formula (a1-3-03-1).

[Chemical Formula 27]

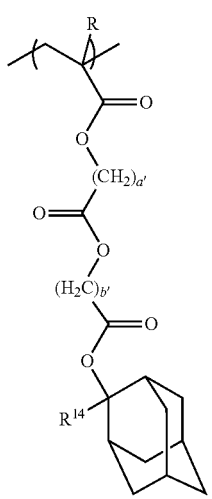

(a1-3-03-1)

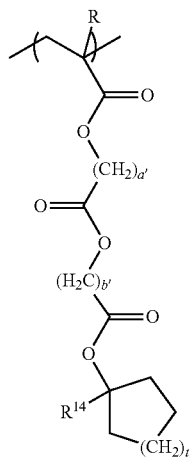

(a1-3-03-2)

In the formulas, R and $R^{14}$ are the same as defined above, a' represents an integer of 1 to 10, b' represents an integer of 1 to 10, and t represents an integer of 0 to 3.

In formulas (a1-3-03-1) and (a1-3-03-2), a' is preferably an integer of 1 to 8, more preferably an integer of 1 to 5, and most preferably 1 or 2.

b' is preferably an integer of 1 to 8, more preferably an integer of 1 to 5, and most preferably 1 or 2.

t is preferably an integer of 1 to 3, and most preferably 1 or 2.

Specific examples of the structural units represented by formulas (a1-3-03-1) and (a1-3-03-2) include the structural units represented by the above formulas (a1-3-29) to (a1-3-32).

{Structural Unit (a12)}

The structural unit (a12) is a structural unit derived from a hydroxystyrene in which the hydrogen atom bonded to the carbon atom on the α-position may be substituted with a substituent and a hydrogen atom bonded to the benzene ring may be substituted with a substituent other than a hydroxyl group, and in which the hydrogen atom of the hydroxyl group is substituted with an acid-dissociable group or a substituent containing an acid-dissociable group.

A "structural unit derived from a hydroxystyrene" refers to a structural unit that is formed by the cleavage of the ethylenic double bond of a hydroxystyrene.

A hydroxystyrene is a compound having one vinyl group and at least one hydroxyl group bonded to a benzene ring. The number of hydroxyl groups bonded to the benzene ring is preferably from 1 to 3, and is most preferably 1. There are no particular limitations on the bonding position of the hydroxyl group on the benzene ring. When there is only one hydroxyl group, the hydroxyl group is preferably bonded to the para-4 position relative to the vinyl group. When the number of hydroxyl groups is an integer of 2 or more, any arbitrary combination of bonding positions may be used.

In the present description, a hydroxystyrene in which the hydrogen atom bonded to the carbon atom on the α-position has been substituted with a substituent may be referred to as an "α-substituted hydroxystyrene". Further, the generic term "α-substituted) hydroxystyrene" may be used to describe both the hydroxystyrene and the α-substituted hydroxystyrene.

Examples of the substituent which is bonded to the carbon atom on the α-position of an α-substituted hydroxystyrene include the same substituents as those mentioned above for the substituent bonded to the carbon atom on the α-position of an α-substituted acrylate ester.

There are no particular limitations on the substituent other than a hydroxyl group that may be bonded to the benzene ring of the (α-substituted) hydroxystyrene, and examples include a halogen atom, an alkyl group of 1 to 5 carbon atoms, and a halogenated alkyl group of 1 to 5 carbon atoms. Specific examples of the halogen atom include a fluorine atom, chlorine atom, bromine atom and iodine atom, and a fluorine atom is particularly desirable.

In the structural unit (a12), examples of the acid-dissociable group that substitutes the hydrogen atom of the hydroxyl group include the same acid-dissociable groups as those described above. Of these, a tertiary alkyl ester-type acid-dissociable group or an acetal-type acid-dissociable group is preferred, and an acetal-type acid-dissociable group is particularly desirable.

Examples of the aforementioned substituent containing an acid-dissociable group include groups composed of an acid-dissociable group and a divalent linking group. Examples of this divalent linking group include the same divalent linking groups as those mentioned above within the description of $R^{0-1}$ from the formula (a0-0-1). As the divalent linking group, a group in which the terminal structure on the acid-dissociable group-side of the group is a carbonyloxy group is particularly desirable. In such a case, the acid-dissociable group is preferably bonded to the oxygen atom (—O—) of the carbonyloxy group.

As the substituent containing an acid-dissociable group, groups represented by a formula $R^{11'}$—O—C(=O)— and groups represented by a formula $R^{11'}$—O—C(=O)—$R^{12'}$— are preferred. In these formulas, $R^{11'}$ represents an acid-dissociable group, and $R^{12'}$ represents a linear or branched alkylene group.

The acid-dissociable group for $R^{11'}$ is preferably a tertiary alkyl ester-type acid-dissociable group or an acetal-type acid-dissociable group, and is more preferably a tertiary alkyl ester-type acid-dissociable group.

Preferred examples of the tertiary alkyl ester-type acid-dissociable group for $R^{11'}$ include the aforementioned aliphatic branched, acid-dissociable groups represented by the formula —C($R^{71}$)($R^{72}$)($R^{73}$), groups represented by the above formulas (1-1) to (1-9), and groups represented by the above formulas (2-1) to (2-6).

Examples of the alkylene group for $R^{12'}$ include a methylene group, ethylene group, trimethylene group, tetramethylene group and 1,1-dimethylethylene group. A linear alkylene group is preferred as $R^{12'}$.

{Structural Unit (a13)}

The structural unit (a13) is a structural unit derived from a vinyl(hydroxynaphthalene) in which the hydrogen atom bonded to the carbon atom on the α-position may be substituted with a substituent and a hydrogen atom bonded to the naphthalene ring may be substituted with a substituent other than a hydroxyl group, and in which the hydrogen atom of the hydroxyl group is substituted with an acid-dissociable group or a substituent containing an acid-dissociable group.

A "structural unit derived from a vinyl(hydroxynaphthalene)" refers to a structural unit that is formed by the cleavage of the ethylenic double bond of a vinyl(hydroxynaphthalene).

A vinyl(hydroxynaphthalene) is a compound having one vinyl group and at least one hydroxyl group bonded to a naphthalene ring. The vinyl group may be bonded to the 1st position or the 2nd position of the naphthalene ring. The number of hydroxyl groups bonded to the naphthalene ring is preferably from 1 to 3, and is most preferably 1. There are no particular limitations on the bonding position of the hydroxyl group on the naphthalene ring. When the vinyl group is bonded to the 1st position or the 2nd position of the naphthalene ring, the hydroxyl group(s) are preferably bonded to any of the 5th to 8th positions of the naphthalene ring. Particularly in those cases where there is only a single hydroxyl group, the hydroxyl group is preferably bonded to one of the 5th to 7th positions of the naphthalene ring, and is more preferably bonded to the 5th or 6th position. When the number of hydroxyl groups is an integer of 2 or more, any arbitrary combination of bonding positions may be used.

In the present description, a vinyl(hydroxynaphthalene) in which the hydrogen atom bonded to the carbon atom on the α-position has been substituted with a substituent may be referred to as an "α-substituted vinyl(hydroxynaphthalene)". Further, the generic term "(α-substituted) vinyl(hydroxynaphthalene)" may be used to describe both the vinyl(hydroxynaphthalene) and the α-substituted vinyl(hydroxynaphthalene).

Examples of the substituent which is bonded to the carbon atom on the α-position of an α-substituted vinyl(hydroxynaphthalene) include the same substituents as those mentioned above for the substituent bonded to the carbon atom on the α-position of an α-substituted acrylate ester.

Examples of the substituent other than a hydroxyl group that may be bonded to the naphthalene ring of the (α-substituted) vinyl(hydroxynaphthalene) include the same substituents as those mentioned above as the substituent other than a hydroxyl group that may be bonded to the benzene ring of the (α-substituted) hydroxystyrene.

In the structural unit (a13), examples of the acid-dissociable group or the substituent containing an acid-dissociable group that substitute the hydrogen atom of the hydroxyl group include the same groups as those mentioned above within the description of the structural unit (a12).

The structural unit (a1) contained within the component (A1) may be either a single type of structural unit or a combination of two or more types of structural units.

The amount of the structural unit (a1) within the component (A1), based on the combined total of all the structural units that constitute the component (A1), is preferably within a range from 15 to 70 mol %, more preferably from 15 to 60 mol %, and still more preferably from 20 to 55 mol %. When the amount of the structural unit (a1) is at least as large as the lower limit of the above range, a pattern can be formed easily using a resist composition prepared from the component (A1), and the lithography properties such as the sensitivity, the resolution and the pattern shape also improve. On the other hand, when the amount of the structural unit (a1) is not more than the upper limit of the above range, a good balance can be achieved with the other structural units.

(Structural Unit (a2))

In addition to the structural units (a0) and (a1), the component (A1) preferably also includes at least one structural unit (a2) selected from the group consisting of structural units derived from an acrylate ester in which the hydrogen atom bonded to the carbon atom on the α-position may be substituted with a substituent and containing an —SO$_2$-containing cyclic group (hereinafter referred to as the "structural unit (a2$^S$)"), and structural units derived from an acrylate ester in which the hydrogen atom bonded to the carbon atom on the α-position may be substituted with a substituent and containing a lactone-containing cyclic group (hereinafter referred to as the "structural unit (a2$^L$)").

When the component (A1) is used in forming a resist film, the —SO$_2$-containing cyclic group or a lactone-containing cyclic group of the structural unit (a2) is effective in improving the adhesion between the resist film and the substrate.

Further, the —SO$_2$-containing cyclic group or lactone-containing cyclic group is also effective in an alkali developing process in terms of improving the compatibility of the resist with developing solutions containing water, such as an alkali developing solution.

In the case of an aforementioned structural unit (a0) or (a1) that also includes an —SO$_2$-containing cyclic group or lactone-containing cyclic group within the structure, although such a structural unit also corresponds with the structural unit (a2), it is deemed to be a structural unit (a0) or (a1) and is excluded from the definition of the structural unit (a2).

Structural Unit (a2$^S$)

The structural unit (a2$^S$) is a structural unit derived from an (α-substituted) acrylate ester which contains an —SO$_2$-containing cyclic group.

As mentioned above, an "—SO$_2$-containing cyclic group" refers to a cyclic group having a ring containing an —SO$_2$— group within the ring structure, and specifically refers to a cyclic group in which the sulfur atom (S) within the —SO$_2$— group forms part of the ring skeleton of the cyclic group. In the —SO$_2$-containing cyclic group, the ring containing the —SO$_2$— group within the ring structure is counted as the first ring, so that groups containing only the first ring are referred to as monocyclic groups, and groups containing other ring structures are described as polycyclic groups regardless of the structure of the other rings. The —SO$_2$-containing cyclic group may be either a monocyclic group or a polycyclic group.

The —SO$_2$-containing cyclic group is preferably a cyclic group containing an —O—SO$_2$— group within the ring skeleton, namely a cyclic group containing a sultone ring in which the —O—S— within the —O—SO$_2$— forms a part of the ring skeleton.

The —SO$_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring skeleton, and does not include carbon atoms contained within substituents.

The —SO$_2$-containing cyclic group may be either an —SO$_2$-containing aliphatic cyclic group or an —SO$_2$-containing aromatic cyclic group. An —SO$_2$-containing aliphatic cyclic group is preferred.

Examples of the —SO$_2$-containing aliphatic cyclic group include groups in which at least one hydrogen atom has been removed from an aliphatic hydrocarbon ring in which a portion of the carbon atoms that constitute the ring structure have been substituted with an —SO$_2$— group or —O—SO$_2$— group. More specific examples include groups in which at least one hydrogen atom has been removed from an aliphatic hydrocarbon ring in which a —CH$_2$— group that constitutes part of the ring structure has been substituted with an —SO$_2$— group, and groups in which at least one hydrogen atom has been removed from an aliphatic hydrocarbon ring in which a —CH$_2$—CH$_2$— group that constitutes part of the ring structure has been substituted with an —O—SO$_2$— group.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —SO$_2$-containing cyclic group may have a substituent. Examples of the substituent include an alkyl group, alkoxy group, halogen atom, hydroxyl group, oxo group (=O), halogenated alkyl group, halogenated alkoxy group, hydroxyalkyl group, —C(=O)—R$^{80}$ (wherein R$^{80}$ represents an alkyl group), —COOR$^{81}$ (wherein R$^{81}$ represents a hydrogen atom or an alkyl group), —OC(=O)R$^{81}$ (wherein R$^{81}$ represents a hydrogen atom or an alkyl group), cyano group, amino group, amide group, nitro group, sulfur atom and sulfonyl group (SO$_2$).

The alkyl group for the substituent may be linear, branched, cyclic, or a combination thereof. The alkyl group preferably has 1 to 30 carbon atoms.

When the alkyl group is linear or branched, the alkyl group preferably contains 1 to 20 carbon atoms, more preferably 1 to 17 carbon atoms, still more preferably 1 to 15 carbon atoms, and most preferably 1 to 10 carbon atoms. Specific examples include the same groups as those mentioned below as specific examples of the linear or branched saturated hydrocarbon groups described in relation to the aliphatic hydrocarbon group. Of these groups, an alkyl group of 1 to 6 carbon atoms is preferable, and specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferable, and a methyl group is particularly desirable.

When the alkyl group is cyclic (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Specific examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane. In these cycloalkyl groups, part or all of the hydrogen atoms bonded to the ring(s) may or may not each be substituted with a fluorine atom or a fluorinated alkyl group.

Examples of the alkoxy group for the substituent include groups in which an oxygen atom (—O—) is bonded to any of the alkyl groups mentioned above as the alkyl group substituent.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group substituent have each been substituted with an aforementioned halogen atom. A fluorinated alkyl group is preferred as the halogenated alkyl group, and a perfluoroalkyl group is particularly desirable.

Examples of the halogenated alkoxy group for the substituent include groups in which part or all of the hydrogen atoms of an aforementioned alkoxy group substituent have each been substituted with an aforementioned halogen atom. A fluorinated alkoxy group is preferred as the halogenated alkoxy group.

Examples of the hydroxyalkyl group for the substituent include groups in which at least one hydrogen atom within an aforementioned alkyl group substituent has been substituted with a hydroxyl group. The hydroxyalkyl group preferably has 1 to 3 hydroxyl groups, and most preferably one hydroxyl group.

In the groups represented by —C(=O)—$R^{80}$, —COO$R^{81}$ and —OC(=O)$R^{81}$ for the aforementioned substituent, examples of the alkyl group for $R^{80}$ and $R^{81}$ include the same groups as those mentioned above as the alkyl group substituent.

Among the above possibilities, the substituent within the —$SO_2$-containing cyclic group is preferably an alkyl group, alkoxy group, halogen atom, hydroxyl group, oxo group (=O), halogenated alkyl group, hydroxyalkyl group, —COO$R^{81}$, —OC(=O)$R^{81}$, or cyano group or the like.

More specific examples of the —$SO_2$— containing cyclic group include groups represented by general formulas (3-1) to (3-4) shown below.

[Chemical Formula 28]

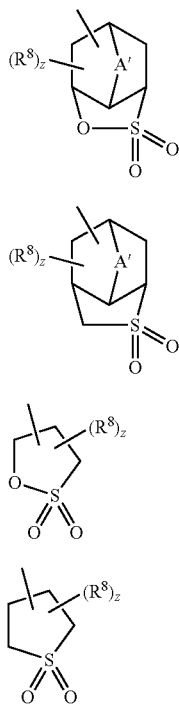

In the formulas, A' represents an oxygen atom, a sulfur atom, or an alkylene group of 1 to 5 carbon atoms which may contain an oxygen atom or a sulfur atom, z represents an integer of 0 to 2, and $R^8$ represents an alkyl group, alkoxy group, halogen atom, hydroxyl group, oxo group (=O), halogenated alkyl group, hydroxyalkyl group, —COO$R^{81}$, —OC(=O)$R^{81}$ or cyano group, wherein $R^{81}$ represents a hydrogen atom or an alkyl group.

In the general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms for A', a linear or branched alkylene group is preferable, and specific examples include a methylene group, ethylene group, n-propylene group and isopropylene group.

Examples of the alkylene group which contains an oxygen atom or a sulfur atom include the aforementioned alkylene groups in which —O— or —S— is either bonded to the terminal of the alkylene group or interposed within the alkylene group. Specific examples of such alkylene groups include —O—$CH_2$—, —$CH_2$—O—$CH_2$—, —S—$CH_2$— and —$CH_2$—S—$CH_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^8$ groups may be the same or different from each other.

Examples of the alkyl group, alkoxy group, halogen atom, halogenated alkyl group, —COO$R^{81}$ or —OC(=O)$R^{81}$ for $R^8$ include the same alkyl groups, alkoxy groups, halogenated alkyl groups, —COO$R^{81}$ groups, —OC(=O)$R^{81}$ groups and hydroxyalkyl groups as those described above for the substituent which the —$SO_2$-containing cyclic group may have.

Specific examples of the cyclic groups represented by general formulas (3-1) to (3-4) are shown below. In the formulas shown below, "Ac" represents an acetyl group.

[Chemical Formula 29]

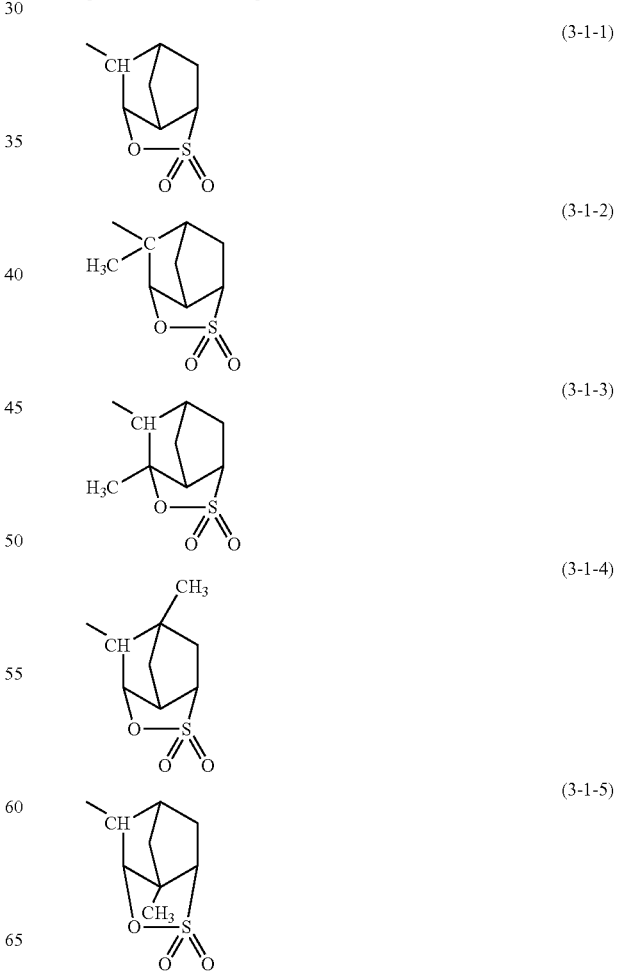

(3-1-6) 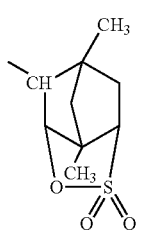
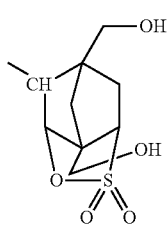
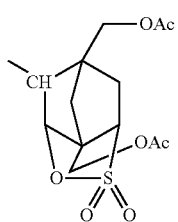
(3-1-9) 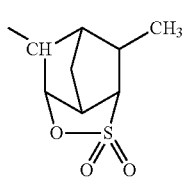
(3-1-10) 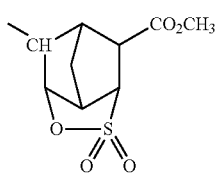
(3-1-11) 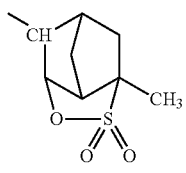
(3-1-12) 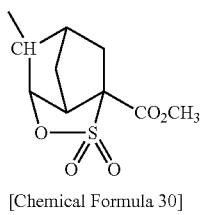
[Chemical Formula 30]
(3-1-13) 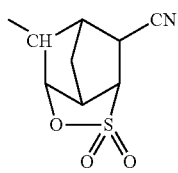
(3-1-14) 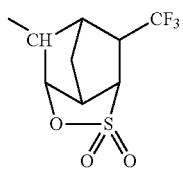
(3-1-15) 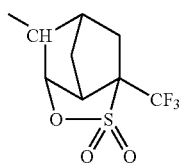
(3-1-16)
(3-1-17) 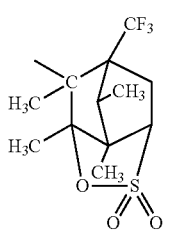
[Chemical Formula 31]
(3-1-18) 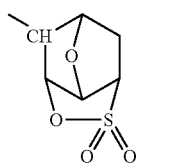
(3-1-19) 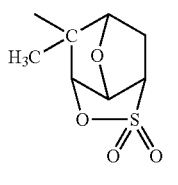
(3-1-20) 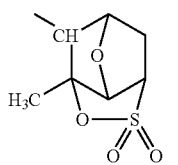
(3-1-21) 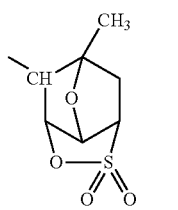

(3-1-22) 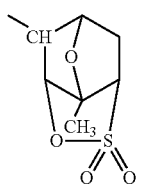

(3-1-23) 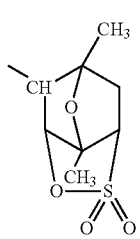

(3-1-24) 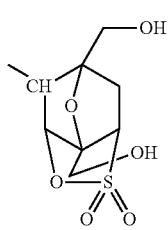

(3-1-25) 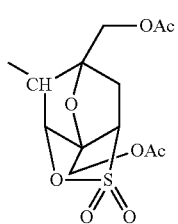

[Chemical Formula 32]

(3-1-26) 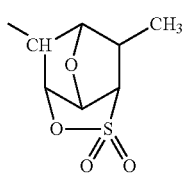

(3-1-27) 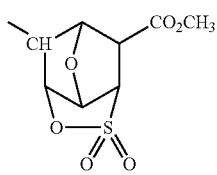

(3-1-28) 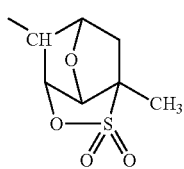

(3-1-29) 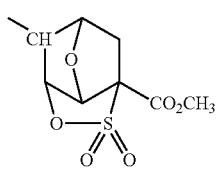

(3-1-30) 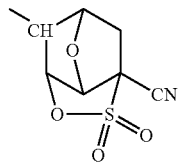

(3-1-31) 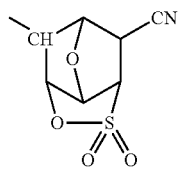

(3-1-32) 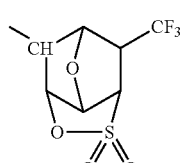

(3-1-33) 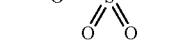

[Chemical Formula 33]

(3-2-1) 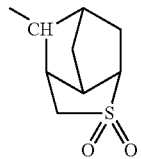

(3-2-2) 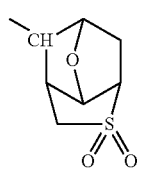

(3-3-1) 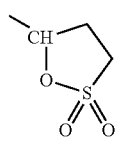

(3-4-1) 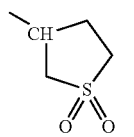

Of the groups shown above, the —SO$_2$-containing cyclic group is preferably a group represented by the general formula (3-1), more preferably at least one group selected from the group consisting of groups represented by the above chemical formulas (3-1-1), (3-1-18), (3-3-1) and (3-4-1), and most preferably a group represented by the chemical formula (3-1-1).

More specific examples of the structural unit (a2$^S$) include structural units represented by a general formula (a2-6) shown below.

[Chemical Formula 34]

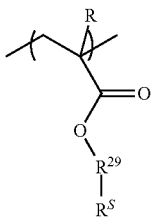

(a2-6)

In the formula, R represents a hydrogen atom, an alkyl group of 1 to 5 carbon atoms or a halogenated alkyl group of 1 to 5 carbon atoms, $R^S$ represents an —$SO_2$-containing cyclic group, and $R^{29}$ represents a single bond or a divalent linking group.

In the formula (a2-6), R is the same as defined above for R in general formula (a1-0-1) or (a1-0-2) within the description of the structural unit (a1).

$R^S$ is the same as the —$SO_2$-containing cyclic group described above.

$R^{29}$ may be either a single bond or a divalent linking group. A divalent linking group is preferable in terms of achieving superior effects for the present invention.

There are no particular limitations on the divalent linking group for $R^{29}$, and examples include the same divalent linking groups as those described above for $Y^2$ in general formula (a1-0-2) within the description of the structural unit (a1).

The divalent linking group for $R^{29}$ is preferably an alkylene group or a group containing an ester linkage (—C(=O)—O—).

The alkylene group is preferably a linear or branched alkylene group. Specific examples include the same groups as the linear alkylene groups and branched alkylene groups described above as the aliphatic hydrocarbon group for $Y^2$.

As the divalent linking group containing an ester linkage, groups represented by a general formula: -$L^4$-C(=O)—O— (wherein $L^4$ represents the divalent linking group) are preferred. In other words, the structural unit ($a2^S$) is preferably a structural unit represented by a general formula (a2-6-1) shown below.

[Chemical Formula 35]

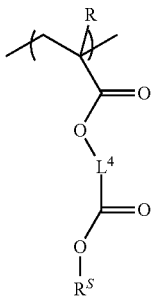

(a2-6-1)

In the formula, R and $R^S$ are each the same as defined above, and $L^4$ represents a divalent linking group.

There are no particular limitations on $L^4$, and examples include the same groups as the divalent linking groups described above for $Y^2$ in general formula (a1-0-2) within the description of the structural unit (a1).

As the divalent linking group for $L^4$, a linear or branched alkylene group, a divalent alicyclic hydrocarbon group, or a divalent linking group containing a hetero atom is preferred.

Examples of the linear or branched alkylene group, divalent alicyclic hydrocarbon group, and divalent linking group containing a hetero atom include the same linear or branched alkylene groups, divalent alicyclic hydrocarbon groups, and divalent linking groups containing a hetero atom as those described above as preferred groups for $Y^2$.

Of the above groups, a linear or branched alkylene group, or a divalent linking group containing an oxygen atom as a hetero atom is preferred.

The linear or branched alkylene group for $L^4$ preferably contains 1 to 10 carbon atoms, more preferably 1 to 8 carbon atoms, and still more preferably 1 to 5 carbon atoms. As the linear alkylene group, a methylene group or ethylene group is preferred, and a methylene group is particularly desirable. As the branched alkylene group, an alkylmethylene group or alkylethylene group is preferred, and —CH($CH_3$)—, —C($CH_3$)$_2$— or —C($CH_3$)$_2CH_2$— is particularly desirable.

The divalent linking group containing an oxygen atom is preferably a divalent linking group containing an ether linkage or an ester linkage, and is more preferably a group represented by one of the formulas —$Y^{21}$—O—$Y^{22}$—, —$Y^{21}$—O—C(=O)—$Y^{22}$— and —[$Y^{21}$—C(=O)—O]$_m$—$Y^{22}$— described above within the description for $Y^2$ in the general formula (a1-0-2). Of these groups, a group represented by the formula —$Y^{21}$—O—C(=O)—$Y^{22}$— is preferred, and a group represented by —($CH_2$)$_c$—C(=O)—O—($CH_2$)$_d$— is particularly desirable. c represents an integer of 1 to 5, and is preferably 1 or 2. d represents an integer of 1 to 5, and is preferably 1 or 2.

As the structural unit ($a2^S$), a structural unit represented by a general formula (a2-6-11) or (a2-6-12) shown below is preferred, and a structural unit represented by formula (a2-6-12) is particularly desirable.

[Chemical Formula 36]

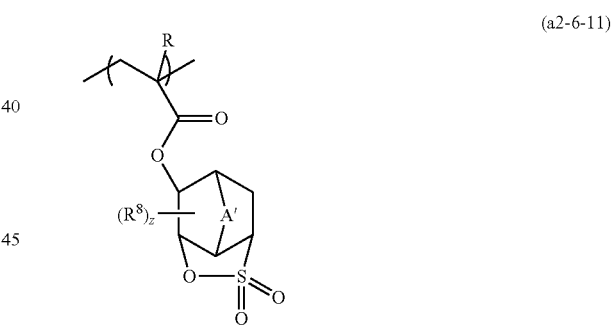

(a2-6-11)

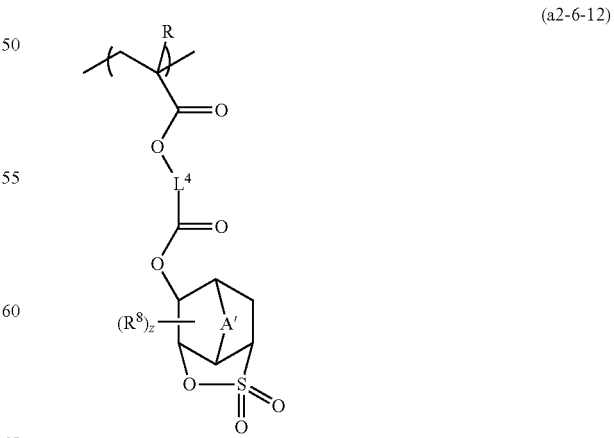

(a2-6-12)

In the formulas, R, A', $R^8$, z and $L^4$ are each the same as defined above.

In the formula (a2-6-11), A' is preferably a methylene group, an oxygen atom (—O—) or a sulfur atom (—S—).

$L^4$ is preferably a linear or branched alkylene group, or a divalent linking group containing an oxygen atom. Examples of the linear or branched alkylene group and the divalent linking group containing an oxygen atom for $L^4$ include the same linear or branched alkylene groups and divalent linking groups containing an oxygen described above.

As the structural unit represented by the formula (a2-6-12), a structural unit represented by a general formula (a2-6-12a) or (a2-6-12b) shown below is particularly desirable.

[Chemical Formula 37]

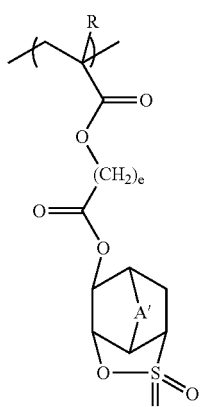

(a2-6-12a)

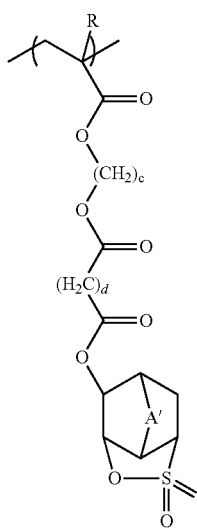

(a2-6-12b)

In the formulas, R and A' are each the same as defined above, and each of c to e independently represents an integer of 1 to 3.

Structural Unit ($a2^L$)

The structural unit ($a2^L$) is a structural unit derived from an (α-substituted) acrylate ester which contains a lactone-containing cyclic group.

As mentioned above, the term "lactone-containing cyclic group" refers to a cyclic group including one ring containing an —O—C(O)— structure (lactone ring). The lactone ring is counted as the first ring, and a lactone-containing cyclic group in which the only ring structure is the lactone ring is referred to as a monocyclic group, and groups containing other ring structures are described as polycyclic groups regardless of the structure of the other rings.

There are no particular limitations on the lactone-containing cyclic group within the structural unit ($a2^L$), and an arbitrary lactone-containing cyclic group may be used. Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

The lactone-containing cyclic group may have a substituent. Examples of the substituent include an alkyl group, alkoxy group, halogen atom, hydroxyl group, oxo group (=O), halogenated alkyl group, halogenated alkoxy group, hydroxyalkyl group, —C(=O)—$R^{80}$ (wherein $R^{80}$ represents an alkyl group), —COOR$^{81}$ (wherein $R^{81}$ represents a hydrogen atom or an alkyl group), —OC(=O)$R^{81}$ (wherein $R^{81}$ represents a hydrogen atom or an alkyl group), cyano group, amino group, amide group, nitro group, sulfur atom and sulfonyl group ($SO_2$).

Among these, examples of the alkyl group, alkoxy group, halogen atom, halogenated alkyl group, halogenated alkoxy group, hydroxyalkyl group, —C(=O)—$R^{80}$, —COOR$^{81}$ and —OC(=O)$R^{81}$ include the same groups as those described above for the substituent which the —$SO_2$-containing cyclic group may have.

The substituent for the lactone-containing cyclic group is preferably an alkyl group of 1 to 5 carbon atoms, an alkoxy group of 1 to 5 carbon atoms, or a group represented by —COOR" (wherein R" represents a hydrogen atom or an alkyl group). Examples of this alkyl group, alkoxy group and —COOR" group include the same alkyl groups, alkoxy groups and —COOR" groups as those mentioned below in the description for R' within general formulas (a2-1) and (a2-5) shown below.

Examples of the structural unit ($a2^L$) include structural units of the above general formula (a2-6) in which $R^S$ has been substituted with a lactone-containing cyclic group, and more specific examples include structural units represented by general formulas (a2-1) to (a2-5) shown below.

[Chemica Formula 38]

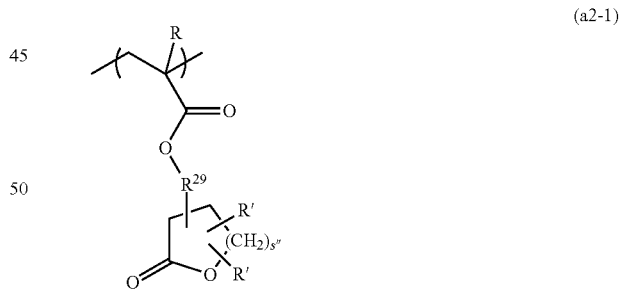

(a2-1)

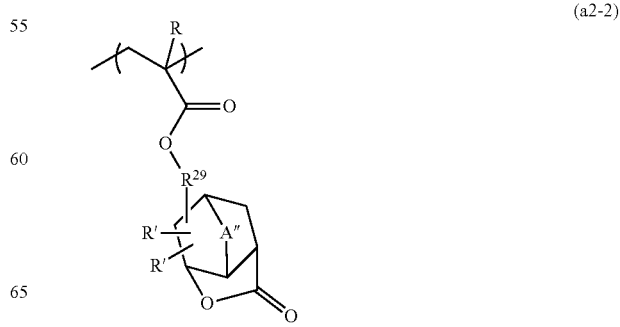

(a2-2)

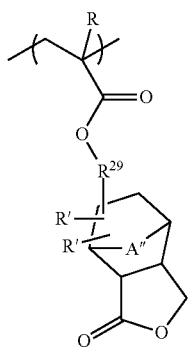
(a2-3)

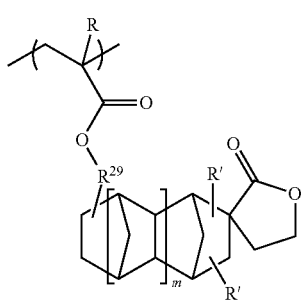
(a2-4)

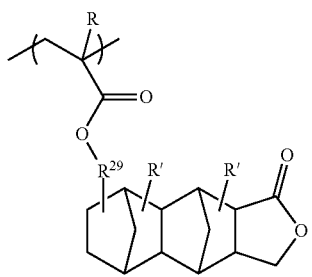
(a2-5)

In the formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents 0 or 1.

Examples of R in the general formulas (a2-1) to (a2-5) include the same groups as those mentioned above for R in general formula (a1-0-1) or (a1-0-2) within the description of the structural unit (a1).

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of industrial availability, R' is preferably a hydrogen atom.

The alkyl group for R" may be a linear, branched or cyclic alkyl group.

When R" is a linear or branched alkyl group, the alkyl group preferably contains 1 to 10 carbon atoms, and more preferably 1 to 5 carbon atoms.

When R" is a cyclic alkyl group (cycloalkyl group), it preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or a dimethylmethylene group is preferable, and a methylene group is particularly desirable.

$R^{29}$ is the same as defined above for $R^{29}$ in the general formula (a2-6).

In formula (a2-1), s" is preferably 1 or 2.

Specific examples of the structural units represented by general formulas (a2-1) to (a2-5) are shown below. In each of the following formulas, $R^\alpha$ represents a hydrogen atom, a methyl group or a trifluoromethyl group.

[Chemical Formula 39]

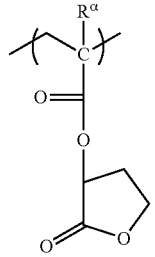
(a2-1-1)

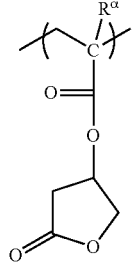
(a2-1-2)

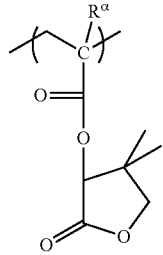
(a2-1-3)

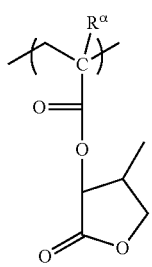 (a2-1-4)
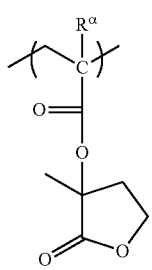 (a2-1-5)
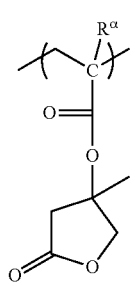 (a2-1-6)
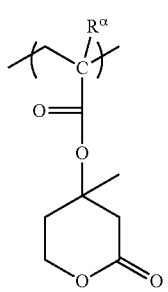 (a2-1-7)
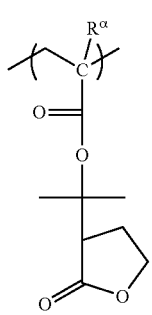 (a2-1-8)
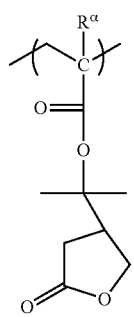 (a2-1-9)
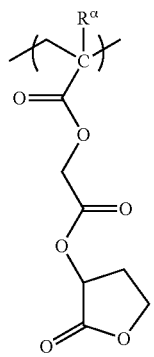 (a2-1-10)
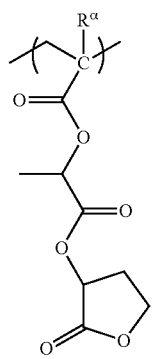 (a2-1-11)
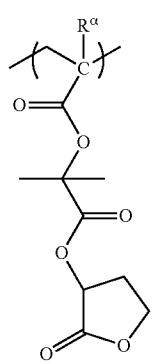 (a2-1-12)

(a2-1-13)
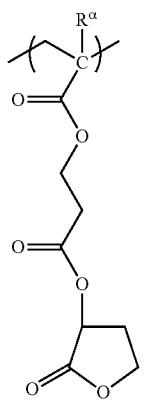
[Chemical Formula 40]
(a2-2-1)
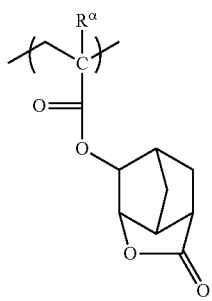
(a2-2-2)
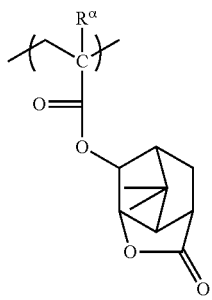
(a2-2-3)
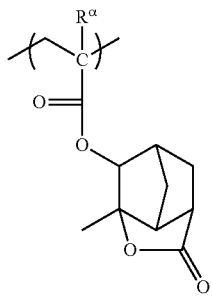
(a2-2-4)
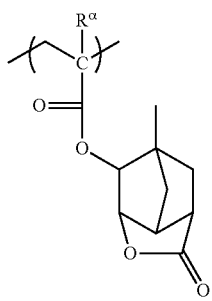
(a2-2-5)
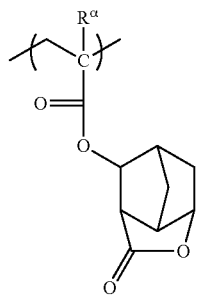
(a2-2-6)
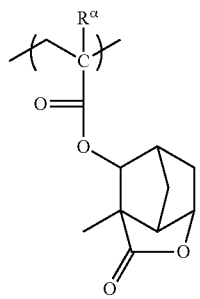
(a2-2-7)
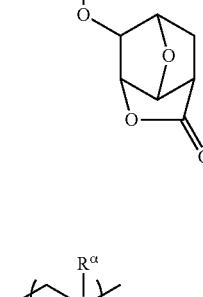
(a2-2-8)
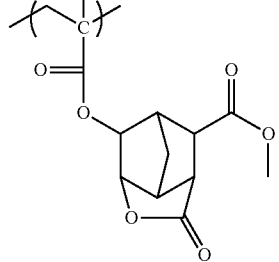
(a2-2-9)
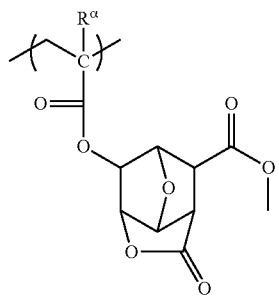

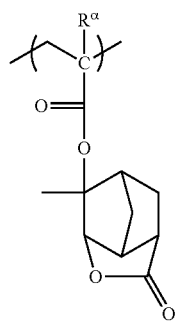 (a2-2-10)
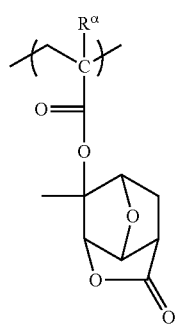 (a2-2-11)
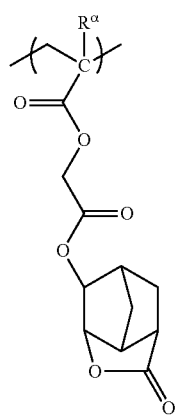 (a2-2-12)
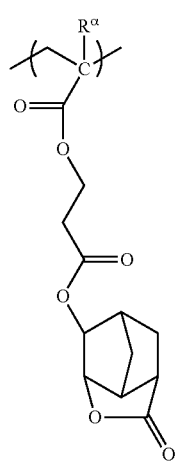 (a2-2-13)
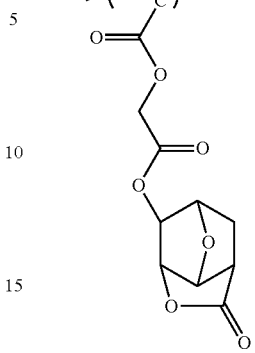 (a2-2-14)
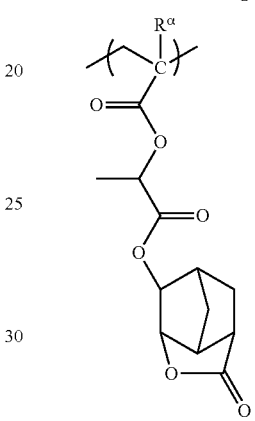 (a2-2-15)
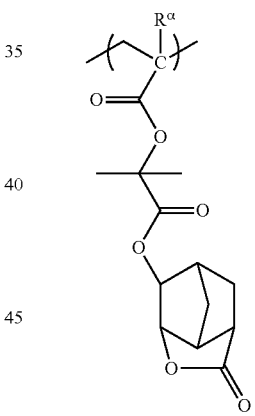 (a2-2-16)
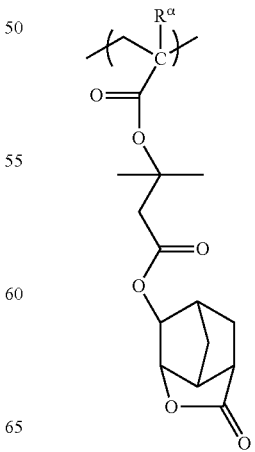 (a2-2-17)

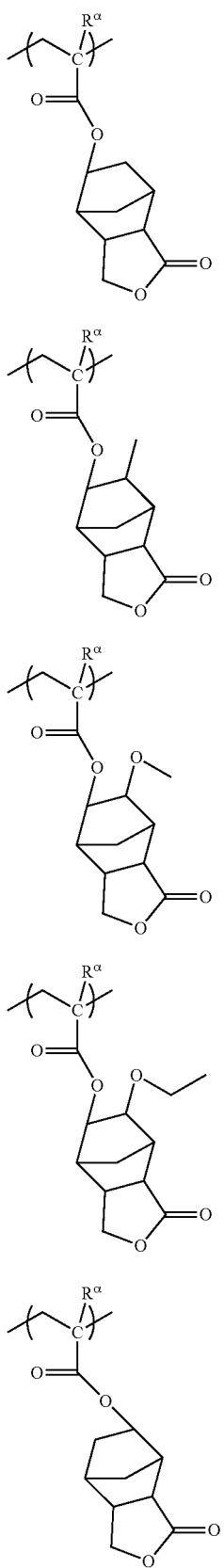
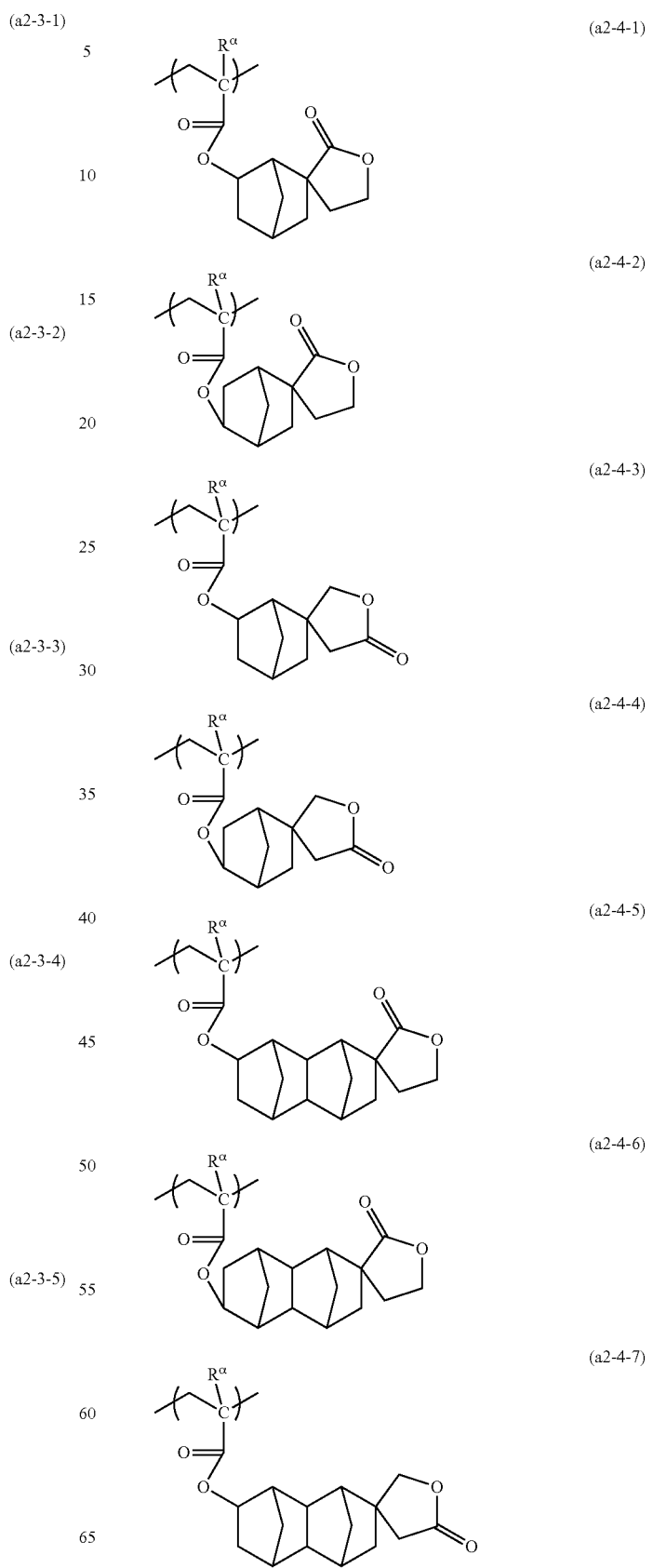

-continued
(a2-4-8)
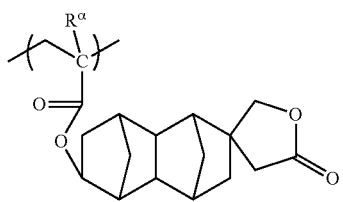
(a2-4-9)
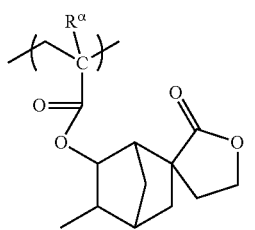
(a2-4-10)
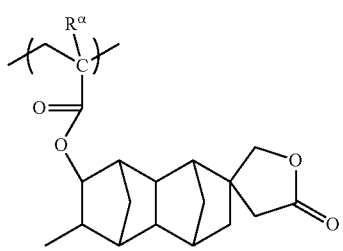
(a2-4-11)
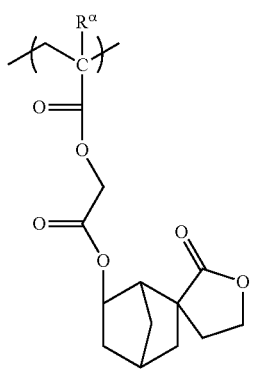
(a2-4-12)
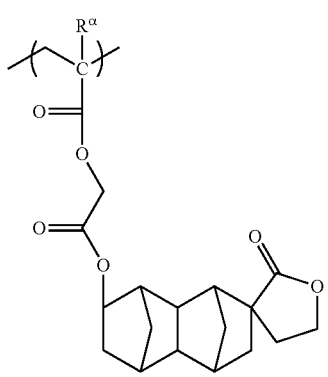
[Chemical Formula 43]
(a2-5-1)
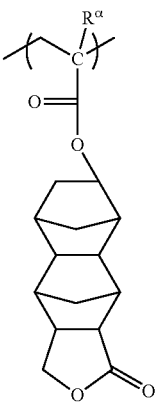
(a2-5-2)
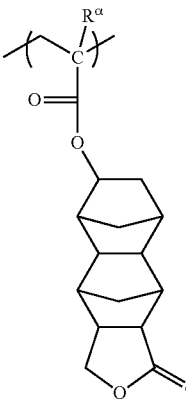
(a2-5-3)
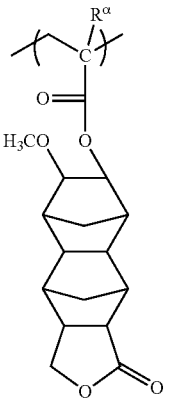
(a2-5-4)
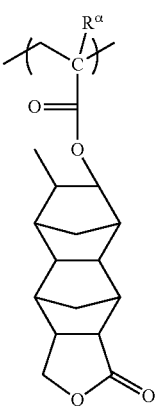

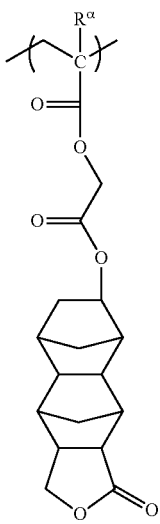

(a2-5-5)

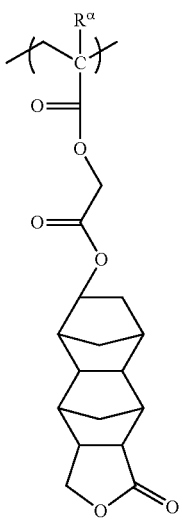

(a2-5-6)

The structural unit (a2) of the component (A1) may be either a single type of structural unit or a combination of two or more types of structural units. For example, as the structural unit (a2), the structural unit (a2$^S$) may be used alone, the structural unit (a2$^L$) may be used alone, or the structural units (a2$^S$) and (a2$^L$) may be used in combination. Further, as the structural unit (a2$^S$) or the structural unit (a2$^L$), one type of structural unit may be used alone, or two or more types of structural units may be used in combination.

In the present invention, the structural unit (a2) preferably includes at least the structural unit (a2$^S$).

The structural unit (a2) is preferably at least one structural unit selected from the group consisting of structural units represented by the above general formulas (a2-1) to (a2-6), and is more preferably at least one structural unit selected from the group consisting of structural units represented by the general formulas (a2-1) to (a2-3) and (a2-6). Among these structural units, at least one structural unit selected from the group consisting of structural units represented by the above formulas (a2-1-1), (a2-2-1), (a2-2-7), (a2-3-1), (a2-3-5) and (a2-6-1) is particularly desirable.

The amount of the structural unit (a2) within the component (A1), based on the combined total of all the structural units that constitute the component (A1), is preferably within a range from 5 to 80 mol %, more preferably from 10 to 60 mol %, and still more preferably from 15 to 50 mol %. When the amount of the structural unit (a2) is at least as large as the lower limit of the aforementioned range, the effects achieved be including the structural unit (a2) can be satisfactorily realized. On the other hand, when the amount of the structural unit (a2) is not more than the upper limit of the above range, a good balance can be achieved with the other structural units.

(Structural Unit (a3))

The component (A1) may also include a structural unit (a3) containing a polar group-containing hydrocarbon group, either in addition to the structural units (a0) and (a1), or in addition to the structural units (a0), (a1) and (a2). Including the structural unit (a3) within the component (A1) further increases the polarity of the component (A1) following exposure. This increase in polarity contributes to improved resolution and the like, particularly in the case of an alkali developing process.

The polar group-containing hydrocarbon group is a hydrocarbon group having a polar group bonded thereto.

Examples of preferred polar groups for the structural unit (a3) include a hydroxyl group, cyano group, carboxyl group, hydroxyalkyl group, hydroxyalkyloxy group and fluorinated alcohol group (a hydroxyalkyl group in which part or all of the hydrogen atoms bonded to carbon atoms are each substituted with a fluorine atom).

The carbon skeleton of the hydroxyalkyl group, hydroxyalkyloxy group and fluorinated alcohol group may be linear, branched, cyclic, or a combination thereof. In the case of a linear or branched skeleton, the carbon skeleton preferably contains 1 to 12 carbon atoms, and specific examples include the same groups as the linear or branched aliphatic hydrocarbon groups described below. In the case of a cyclic skeleton, the carbon skeleton preferably contains 3 to 30 carbon atoms, and specific examples include the same groups as the cyclic aliphatic hydrocarbon groups described below.

Among the various possibilities described above, the polar group is most preferably a hydroxyl group.

In the structural unit (a3), there are no particular limitations on the number of polar groups bonded to the hydrocarbon group, but 1 to 3 polar groups is preferable, and one polar group is the most desirable.

The hydrocarbon group to which the polar group is bonded may be either an aliphatic hydrocarbon group or an aromatic hydrocarbon group.

In a polar group-containing aliphatic hydrocarbon group, the aliphatic hydrocarbon group to which the polar group is bonded may be either saturated or unsaturated, but is preferably saturated.

More specific examples of the aliphatic hydrocarbon group include linear or branched aliphatic hydrocarbon groups, and aliphatic hydrocarbon groups that include a ring within the structure.

The linear or branched aliphatic hydrocarbon group preferably contains 1 to 12 carbon atoms, more preferably 1 to 10 carbon atoms, still more preferably 1 to 8 carbon atoms, and most preferably 1 to 6 carbon atoms.

The linear or branched aliphatic hydrocarbon group is preferably a linear or branched alkyl group.

In the linear or branched aliphatic hydrocarbon group, part or all of the hydrogen atoms may each be substituted with a substituent other than the aforementioned polar group. Examples of this substituent include a fluorine atom, a fluorinated alkyl group of 1 to 5 carbon atoms and an oxo group (=O). Further, the linear or branched aliphatic hydrocarbon group may also include a divalent group containing a hetero atom interposed between carbon atoms of the aliphatic hydrocarbon group. Examples of this "divalent group containing a hetero atom" include the same groups as those mentioned above for the "divalent linking group containing a hetero atom" for $Y^2$ in general formula (a1-0-2) within the description of the structural unit (a1).

Examples of the aforementioned aliphatic hydrocarbon group that includes a ring within the structure include cyclic aliphatic hydrocarbon groups and groups in which a cyclic aliphatic hydrocarbon group is bonded to the terminal of an aforementioned linear or branched aliphatic hydrocarbon group or interposed within the chain of a linear or branched aliphatic hydrocarbon group.

The cyclic aliphatic hydrocarbon group preferably has 3 to 30 carbon atoms. Further, the cyclic aliphatic hydrocarbon group may be either a polycyclic group or a monocyclic group, but a polycyclic group is preferred.

The cyclic aliphatic hydrocarbon group may be selected appropriately from the multitude of groups proposed for the resins for resist compositions designed for use with an ArF excimer laser or the like. For example, the monocyclic aliphatic hydrocarbon group is preferably a group in which two or more hydrogen atom have been removed from a monocycloalkane of 3 to 20 carbon atoms. Specific examples of the monocycloalkane include cyclopentane and cyclohexane. The polycyclic aliphatic hydrocarbon group is preferably a group in which two or more hydrogen atoms have been removed from a polycycloalkane of 7 to 30 carbon atoms, and specific examples of the polycycloalkane include adamantane, norbornane, isobornane, tricyclodecane and tetracyclododecane.

In the cyclic aliphatic hydrocarbon group, part or all of the hydrogen atoms may each be substituted with a substituent other than the aforementioned polar group. Examples of this substituent include an alkyl group of 1 to 5 carbon atoms, a fluorine atom, a fluorinated alkyl group of 1 to 5 carbon atoms and an oxo group (=O).

In the polar group-containing aromatic hydrocarbon group, examples of the aromatic hydrocarbon group to which the polar group is bonded include:

divalent aromatic hydrocarbon groups in which a hydrogen atom has been removed from an aromatic hydrocarbon ring of a monovalent aromatic hydrocarbon group such as a phenyl group, biphenylyl group, fluorenyl group, naphthyl group, anthryl group or phenanthryl group;

aromatic hydrocarbon groups in which a portion of the carbon atoms that constitute the ring(s) of an aforementioned divalent aromatic hydrocarbon group have been substituted with a hetero atom such as an oxygen atom, sulfur atom or nitrogen atom;

and aromatic hydrocarbon groups in which a hydrogen atom has been removed from the aromatic hydrocarbon ring of an arylalkyl group such as a benzyl group, phenethyl group, 1-naphthylmethyl group, 2-naphthylmethyl group, 1-naphthylethyl group or 2-naphthylethyl group.

In the aromatic hydrocarbon group, part or all of the hydrogen atoms may each be substituted with a substituent other than the aforementioned polar group. Examples of the substituent include an alkyl group of 1 to 5 carbon atoms, a fluorine atom, a fluorinated alkyl group of 1 to 5 carbon atoms, and an oxo group (=O).

More specific examples of the structural unit (a3) include a structural unit (a31) which is derived from an acrylate ester in which the hydrogen atom bonded to the carbon atom on the α-position may be substituted with a substituent and contains a polar group-containing hydrocarbon group, a structural unit (a32) which is derived from a hydroxystyrene in which the hydrogen atom bonded to the carbon atom on the α-position may be substituted with a substituent and a hydrogen atom bonded to the benzene ring may be substituted with a substituent other than a hydroxyl group, and a structural unit (a33) which is derived from a vinyl(hydroxynaphthalene) in which the hydrogen atom bonded to the carbon atom on the α-position may be substituted with a substituent and a hydrogen atom bonded to the naphthalene ring may be substituted with a substituent other than a hydroxyl group.

The "structural unit derived from a hydroxystyrene" and the "structural unit derived from a vinyl(hydroxynaphthalene)" are as described above in relation to the structural units (a12) and (a13).

Of the above possibilities, the structural unit (a3) is preferably a structural unit (a31). Specific examples of preferred forms of the structural unit (a31) include the structural units shown below.

[Chemical Formula 44]

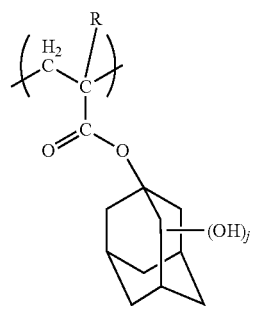

(a3-1)

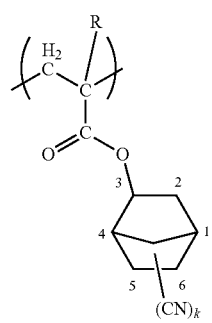

(a3-2)

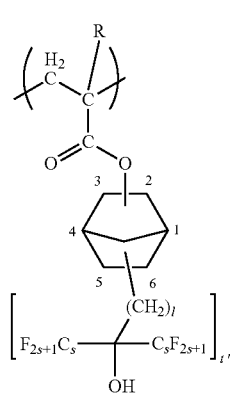

(a3-3)

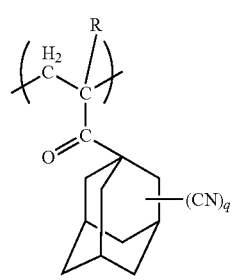

(a3-4)

(a3-5) 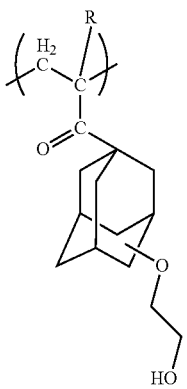

(a3-6) 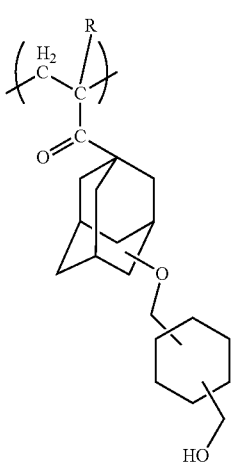

(a3-7) 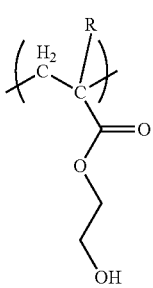

(a3-8) 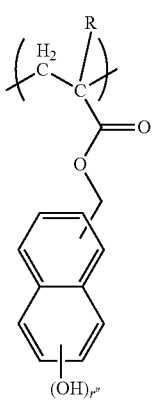

(a3-9) 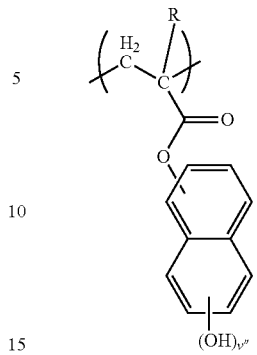

(a3-10) 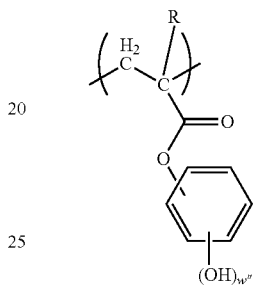

In the above formulas, R is the same as defined above, j represents an integer of 1 to 3, k represents an integer of 1 to 3, t' represents an integer of 1 to 3, l represents an integer of 1 to 5, s represents an integer of 1 to 3 and each of q, r", v" and w" independently represents an integer of 1 to 3.

In formula (a3-1), j is preferably 1 or 2, and more preferably 1. When j is 1, it is preferable that the hydroxyl group is bonded to the 3rd position of the adamantyl group.

When j is 2, it is preferable that the hydroxyl groups are bonded to the 3rd and 5th positions of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

In formula (a3-4), q is preferably 1 or 2, and more preferably 1. When q is 2, it is preferable that the cyano groups are bonded to the 3rd and 5th positions of the adamantyl group. When q is 1, it is preferable that the cyano group is bonded to the 3rd position of the adamantyl group.

In formula (a3-8), r" is preferably 1 or 2, and more preferably 1.

In formula (a3-9), v" is preferably 1 or 2, and more preferably 1.

In formula (a3-10), w" is preferably 1 or 2, and more preferably 1.

The structural unit (a3) of the component (A1) may be either a single type of structural unit or a combination of two or more types of structural units.

When the component (A1) includes the structural unit (a3), the amount of the structural unit (a3) within the component (A1), based on the combined total of all the structural units that constitute the component (A1), is preferably within a range from 1 to 80 mol %, more preferably from 5 to 60 mol %, and still more preferably from 15 to 40 mol %. When the amount of the structural unit (a3) is at least as large as the lower limit of the above range, the effects achieved be including the structural unit (a3) can be satisfactorily realized. On the other hand, when the amount of the structural unit (a3) is not more than the upper limit of the above range, a good balance can be achieved with the other structural units.

The component (A1) may also include structural units other than the aforementioned structural units (a0) to (a3), as long as the effects of the present invention are not impaired.

As these other structural units, any other structural unit which cannot be classified as one of the above structural units (a0) to (a3) can be used without any particular limitations, and any of the multitude of conventional structural units used within resist resins designed for use with ArF excimer lasers or KrF excimer lasers (and particularly ArF excimer lasers) can be used.

Examples of these other structural units include a structural unit (a4) derived from an acrylate ester in which the hydrogen atom bonded to the carbon atom on the α-position may be substituted with a substituent and containing a non-acid-dissociable aliphatic polycyclic group, a structural unit (a5) derived from a styrene in which the hydrogen atom bonded to the carbon atom on the α-position may be substituted with a substituent, and a structural unit (a6) derived from a vinylnaphthalene in which the hydrogen atom bonded to the carbon atom on the α-position may be substituted with a substituent. Including at least one of the structural units (a4) to (a6) improves the dry etching resistance of the formed resist pattern. Further, the hydrophobicity of the component (A1) is also enhanced. An improvement in the hydrophobicity contributes to improvements in the resolution and the resist pattern shape and the like, particularly in the case of an organic solvent developing process.

The "non-acid-dissociable aliphatic polycyclic group" in the structural unit (a4) is an aliphatic polycyclic group which, even when acid is generated from the structural unit (a0) or an optional component (B) described below upon exposure, does not dissociate under the action of acid, and is retained within the structural unit.

Examples of this non-acid-dissociable aliphatic polycyclic group include monovalent aliphatic polycyclic groups in which there is no substituent (atom other than a hydrogen atom or group) bonded to the carbon atom that is bonded to the atom adjacent to the aliphatic polycyclic group (for example, the —O— in —C(=O)—O—).

There are no particular limitations on the aliphatic cyclic group provided it is non-acid-dissociable, and any of the multitude of conventional groups used within the resin components of resist compositions designed for use with an ArF excimer laser or KrF excimer laser (and particularly an ArF excimer laser) may be used. The aliphatic cyclic group may be saturated or unsaturated, but is preferably saturated. Examples of the aliphatic cyclic group include groups in which one hydrogen atom has been removed from a cycloalkane such as the monocycloalkanes and polycycloalkanes mentioned above within the description of the aliphatic cyclic group in the structural unit (a1).

The aliphatic cyclic group may be monocyclic or polycyclic, but polycyclic groups yield superior effects and are consequently preferred. Two- to four-ring groups are particularly desirable, and from the viewpoint of industrial availability, at least one group selected from among a tricyclodecyl group, adamantyl group, tetracyclododecyl group, isobornyl group and norbornyl group is particularly desirable.

Examples of the non-acid-dissociable aliphatic cyclic group include monovalent aliphatic cyclic groups in which there is no substituent (atom other than a hydrogen atom or group) bonded to the carbon atom that is bonded to the atom adjacent to the aliphatic cyclic group (for example, the —O— in —C(=O)—O). Specific examples include groups in which $R^{14}$ has been substituted with a hydrogen atom in the groups represented by the formulas (1-1) to (1-9) that were mentioned above within the description of the structural unit (a1), and groups in which a hydrogen atom has been removed from the tertiary carbon atom of a cycloalkane in which the tertiary carbon atom constitutes only parts of ring structure(s).

The aliphatic cyclic group may have a substituent bonded thereto. Examples of the substituent include an alkyl group of 1 to 5 carbon atoms, a fluorine atom and a fluorinated alkyl group.

As the structural unit (a4), structural units in which the acid-dissociable group in an aforementioned structural unit (a1) has been substituted with a non-acid-dissociable aliphatic polycyclic group, and structural units in which $X^1$ in the above general formula (a1-0-1) has been substituted with a non-acid-dissociable aliphatic polycyclic group, namely structural units represented by a general formula (a4-0) shown below, are preferred, and structural units represented by general formulas (a4-1) to (a4-5) shown below are particularly desirable.

[Chemical Formula 45]

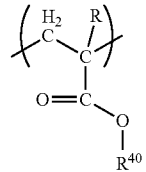

(a4-0)

In the formula, R is the same as defined above, and $R^{40}$ represents a non-acid-dissociable aliphatic polycyclic group.

[Chemical Formula 46]

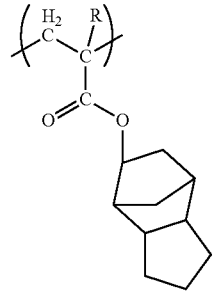

(a4-1)

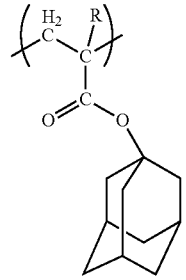

(a4-2)

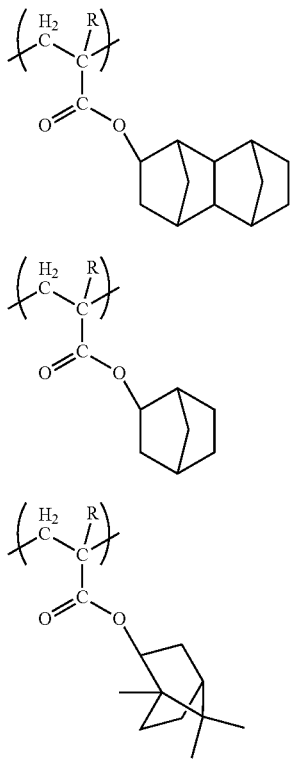

In the formulas, R is the same as defined above.

The structural unit (a4) of the component (A1) may be either a single type of structural unit or a combination of two or more types of structural units.

When the component (A1) includes the structural unit (a4), the amount of the structural unit (a4) within the component (A1), based on the combined total of all the structural units that constitute the component (A1), is preferably within a range from 1 to 30 mol %, more preferably from 1 to 20 mol %, and still more preferably from 5 to 20 mol %. When the amount of the structural unit (a4) is at least as large as the lower limit of the above range, the effects achieved be including the structural unit (a4) can be satisfactorily realized. On the other hand, when the amount of the structural unit (a4) is not more than the upper limit of the above range, a good balance can be achieved with the other structural units.

In relation to the structural unit (a5), the expression "structural unit derived from a styrene" refers to a structural unit that is formed by the cleavage of the ethylenic double bond of the styrene.

In the present invention, a styrene in which the hydrogen atom bonded to the carbon atom on the α-position is substituted with a substituent may be referred to as an "α-substituted styrene".

Examples of the substituent bonded to the carbon atom on the α-position in an α-substituted styrene include the same substituents as those mentioned above for the substituent bonded to the carbon atom on the α-position of an α-substituted acrylate ester.

The benzene ring of the α-substituted styrene may have a substituent. Examples of this substituent include a fluorine atom, an alkyl group of 1 to 5 carbon atoms, a fluorinated alkyl group, and a cyclic alkyl group of 3 to 20 carbon atoms.

In relation to the structural unit (a6), the expression "structural unit derived from a vinylnaphthalene" refers to a structural unit that is formed by the cleavage of the ethylenic double bond of the vinylnaphthalene.

In the present invention, a vinylnaphthalene in which the hydrogen atom bonded to the carbon atom on the α-position is substituted with a substituent may be referred to as an "α-substituted vinylnaphthalene".

Examples of the substituent bonded to the carbon atom on the α-position in an α-substituted vinylnaphthalene include the same substituents as those mentioned above for the substituent bonded to the carbon atom on the α-position of an α-substituted acrylate ester.

The naphthalene ring of the α-substituted vinylnaphthalene may have a substituent. Examples of this substituent include a fluorine atom, an alkyl group of 1 to 5 carbon atoms, a fluorinated alkyl group, and a cyclic alkyl group of 3 to 15 carbon atoms.

In the present invention, the component (A1) is preferably a copolymer containing the structural units (a0) and (a1), is more preferably a copolymer containing the structural units (a0), (a1) and (a2), and is still more preferably a copolymer containing the structural units (a0), (a1), (a2) and (a3).

Examples of the copolymer containing the structural units (a0) and (a1) include copolymers consisting solely of the structural units (a0) and (a1), copolymers consisting of the structural units (a0), (a1) and (a2), copolymers consisting of the structural units (a0), (a1) and (a3), copolymers consisting of the structural units (a0), (a1), (a2) and (a3), and copolymers consisting of the structural units (a0), (a1), (a2), (a3) and (a4).

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight-average molecular weight is not more than the upper limit of the above range, the polymeric compound (A1) exhibits satisfactory solubility in a resist solvent when used as a resist. On the other hand, when the weight average molecular weight is at least as large as the lower limit of the aforementioned range, dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn represents the number-average molecular weight.

The component (A1) can be obtained, for example, by a conventional radical polymerization or the like of the monomers corresponding with each of the structural units, using a radical polymerization initiator such as azobisisobutyronitrile (AIBN).

As the monomer that yields the structural unit (a0), a compound corresponding with the structural unit (a0) may be used (namely, a compound represented by a general formula: $CH_2=C(R)-R^{0-1}-SO_3^-R^2-X-S^+(R^3)(R^4)$), or a compound in which the cation moiety ($R^2-X-S^+(R^3)(R^4)$) of this compound has been substituted with $H^+$, $Na^+$, $K^+$, $NH_4^+$, $N^+(CH_3)_4$ or the like may be used. When a compound of the latter type is used, the component (A1) can be obtained, following the polymerization, by subjecting the obtained polymer to a salt exchange using a salt composed of the cation moiety from formula (a0-0-1) and a counter anion (such as $Cl^-$).

Further, when the component (A1) is a polymer having a structural unit represented by the above formula (a0-3) as the structural unit (a0), the component (A1) can be obtained, for example, by reacting a compound represented by a formula (a0-3') shown below with the phenolic hydroxyl groups of a polymer containing a structural unit derived from a hydroxystyrene, in the presence of a base and within an inert solvent.

[Chemical Formula 47]

(a0-3')

In the formula, $R^1$, $R^2$, $R^3$, $R^4$ and X are each the same as defined above, and $Z^{0-3}$ represents a halogen atom, an alkylsulfonyloxy group of 1 to 15 carbon atoms, or an arylsulfonyloxy group of 6 to 15 carbon atoms.

Furthermore, in the component (A1), by using a chain transfer agent such as HS—$CH_2$—$CH_2$—$CH_2$—$C(CF_3)_2$—OH during the aforementioned polymerization, a —C$(CF_3)_2$—OH group can be introduced at the terminals of the component (A1). Such a copolymer having an introduced hydroxyalkyl group in which part of the hydrogen atoms of the alkyl group have been substituted with fluorine atoms is effective in reducing developing defects and LER (line edge roughness: unevenness in the side walls of a line pattern).

The monomers used for forming each of the structural units may be synthesized using conventional methods. For example, the monomer corresponding with the structural unit (a0) can be synthesized using the method disclosed in Japanese Unexamined Patent Application, First Publication No. 2006-045311 or Japanese Unexamined Patent Application, First Publication No. 2010-095643. In the case of conventional monomers, commercially available products may also be used.

In the component (A), as the component (A1), one type of polymer may be used alone, or two or more types of polymers may be used in combination.

In the component (A), the amount of the component (A1), based on the total weight of the component (A), is preferably at least 25% by weight, more preferably 50% by weight or more, still more preferably 75% by weight or more, and may even be 100% by weight. Provided the amount is at least 25% by weight, the pattern shape and resolution limit and the like are improved for a resist pattern formed by EUV exposure or EB exposure.

The component (A) may also include another resin component, besides the component (A1), which generates acid upon exposure and exhibits changed solubility in a developing solution under the action of acid (hereinafter referred to as "component (A2)"), provided the inclusion of the component (A2) does not impair the effects of the present invention. There are no particular limitations on the component (A2), and conventionally proposed resin components may be used.

In the resist composition of the present invention, the amount of the component (A) may be adjusted in accordance with factors such as the thickness of the resist film that is to be formed.

<Base Component (C)>

The resist composition of the present invention may also include a base component (C), which does not correspond with the component (A), and which exhibits changed solubility in a developing solution under the action of acid (hereinafter referred to as "component (C)"), provided the inclusion of this component (C) does not impair the effects of the present invention.

The term "base component" refers to an organic compound capable of forming a film, and is preferably an organic compound having a molecular weight of 500 or more. Ensuring that the organic compound has a molecular weight of 500 or more ensures a satisfactory film-forming ability, and facilitates the formation of nano level resist patterns.

The organic compounds that can be used as the base component can be broadly classified into non-polymers and polymers.

In general, compounds which have a molecular weight of at least 500 but less than 4,000 may be used as the non-polymers. Hereinafter, the term "low molecular weight compound" is used to describe a non-polymer having a molecular weight of at least 500 but less than 4,000.

In terms of the polymers, typically, resins having a molecular weight of 1,000 or more may be used.

The component (C) may be a base component that exhibits increased solubility in a developing solution under the action of acid, or a base component that exhibits decreased solubility in a developing solution under the action of acid. When the component (A) exhibits increased solubility in a developing solution under the action of acid, a base component that exhibits increased solubility in a developing solution under the action of acid is used as the component (C), whereas when the component (A) exhibits decreased solubility in a developing solution under the action of acid, a base component that exhibits decreased solubility in a developing solution under the action of acid is used as the component (C).

There are no particular limitations on the component (C), which may be selected appropriately from the compounds used as the base components within conventional chemically amplified resist compositions. For example, the component (C) may be selected from among the multitude of compounds already known as base components for chemically amplified resist compositions used for forming positive-type resist patterns in alkali developing processes and chemically amplified resist compositions used for forming negative-type resist patterns in solvent developing processes (including the base resins designed for use with ArF excimer lasers and KrF excimer lasers (and particularly ArF excimer lasers)).

As the component (C), a resin may be used, a low molecular weight compound may be used, or a combination thereof may be used. As the component (C), a single compound may be used alone, or two or more compounds may be used in combination.

For example, in those cases where the resist composition of the present invention is a resist composition that forms a negative-type resist pattern in an alkali developing process and forms a positive-type resist pattern in a solvent developing process, a base component that is soluble in an alkali developing solution is used as the component (C).

As the base component that is soluble in an alkali developing solution, a resin that is soluble in the alkali developing solution is typically used. Examples of such resins include the alkali-soluble resins (prior to the introduction of the acid-generating group) described above for the component (A-2) mentioned within the above description of the component (A).

In those cases where the resist composition of the present invention is a resist composition that forms a positive-type resist pattern in an alkali developing process and forms a negative-type resist pattern in a solvent developing process, examples of the resin used as the component (C) include linear resin components having acid-dissociable groups on side chains (hereinafter referred to as "component (C1)") and main chain-degradable resin components (hereinafter referred to as "component (C2)").

Examples of the component (C1) include resins containing at least one structural unit among the aforementioned structural units (a11) to (a13), and optionally containing an aforementioned structural unit (a2) to (a6) or the like. More specific examples of the component (C1) include resins containing the structural units (a12) and (a32), resins containing the structural units (a12), (a32) and (a5), resins containing the structural units (a13) and (a33), resins containing the structural units (a13), (a33) and (a6), resins containing the structural units (a11) and (a2), resins containing the structural units (a11), (a2) and (a31), resins containing the structural units (a11), (a2), (a31) and (a4), resins containing the structural units (a11) and (a32), resins containing the structural units (a11), (a32) and (a5), resins containing the structural units (a11) and (a33), and resins containing the structural units (a11), (a33) and (a6).

Examples of the component (C2) include polymers in which n arm portions each composed of a polymer chain are bonded to an organic group having a valency of n (wherein n represents an integer of 2 or greater) via linking groups that include a joining group which can be cleaved under the action of acid.

This expression that the joining group "can be cleaved under the action of acid" means that the action of the acid generated from the structural unit (a0) or an optional component (B) upon exposure can cause the bonding within the main chain of the component (C2) to break at the position of the joining group.

In these types of polymers, when acid is generated from the structural unit (a0) or an optional component (B) upon exposure, the action of the acid causes cleavage of the joining group. As a result, the molecular weight decreases significantly, and a polar group is formed at the position of the joining group, resulting in an increase in the solubility within an alkali developing solution and a decrease in the solubility within an organic developing solution.

More specific examples of the component (C2) include polymers having a core portion represented by a general formula (1) shown below and arm portions composed of polymer chains bonded to the core portion (hereinafter referred to as the "polymer (C21)").

$$P(-X^{22}-X^{21}-)_a \qquad (1)$$

In formula (1), P represents an organic group having a valency of a, a represents an integer of 2 to 20, $X^{21}$ represents an arylene group or an alkylene group of 1 to 12 carbon atoms, and $X^{22}$ represents a joining group that can be cleaved under the action of acid.

(Core Portion)

The core portion of the polymer (C21) is represented by the general formula (1) shown above.

In the general formula (1), a represents an integer of 2 to 20, preferably an integer of 2 to 15, and more preferably an integer of 3 to 10. Provided a satisfies this range, the resolution improves and an excellent pattern shape can be obtained.

P represents an organic group having a valency of a. In other words, when P is divalent (a=2), the core portion of the polymer (C21) is a structure in which two groups represented by are bonded to P. When P is trivalent (a=3), three groups represented by —$X^{22}$—$X^{21}$— are bonded to P. In this manner, as the valency a of P increases, the number of groups —$X^{22}$—$X^{21}$— bonded to P increases, and the polymer (C21) becomes a more dense radial-shaped structure.

The organic group for P preferably contains 1 to 20 carbon atoms, more preferably 2 to 15 carbon atoms, and still more preferably 3 to 12 carbon atoms.

Examples of the organic group include aliphatic hydrocarbon groups and aromatic hydrocarbon groups.

The aliphatic hydrocarbon group may be a chain-like group, a cyclic group, or a combination thereof, and may be either saturated or unsaturated.

Examples of the aromatic hydrocarbon group include hydrocarbon groups containing an aromatic hydrocarbon ring, and the group may be composed solely of the aromatic hydrocarbon ring, or may be a combination of the aromatic hydrocarbon ring and an aliphatic hydrocarbon group.

The organic group may also include a linking group such as an ether group, polyether group, ester group [—C(=O)—O—], carbonyl group [—C(=O)—], —NH—, —N=, —NH—C(=O)— or —NR$^{25}$ (wherein R$^{25}$ represents an alkyl group), or a silicon atom within the group structure.

Examples of the alkyl group for R$^{25}$ include lower alkyl groups of 1 to 5 carbon atoms.

Further, a part or all of the hydrogen atoms within the organic group may or may not each be substituted with a substituent such as an alkyl group, alkoxy group, halogen atom or hydroxyl group.

As the alkyl group with which a hydrogen atom of the organic group may be substituted, an alkyl group of 1 to 5 carbon atoms is preferred, and a methyl group, ethyl group, propyl group, n-butyl group or tert-butyl group is particularly desirable.

As the alkoxy group with which a hydrogen atom of the organic group may be substituted, an alkoxy group of 1 to 5 carbon atoms is preferred, a methoxy group, ethoxy group, n-propoxy group, iso-propoxy group, n-butoxy group or tert-butoxy group is more preferred, and a methoxy group or ethoxy group is particularly desirable.

Examples of the halogen atom with which a hydrogen atom of the organic group may be substituted include a fluorine atom, chlorine atom, bromine atom and iodine atom, and a fluorine atom is particularly desirable.

Specific examples of the organic group for P include groups having the structures represented by formulas shown below.

[Chemical Formula 48]

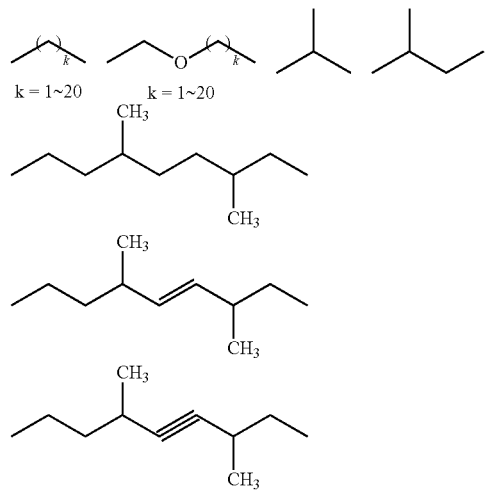

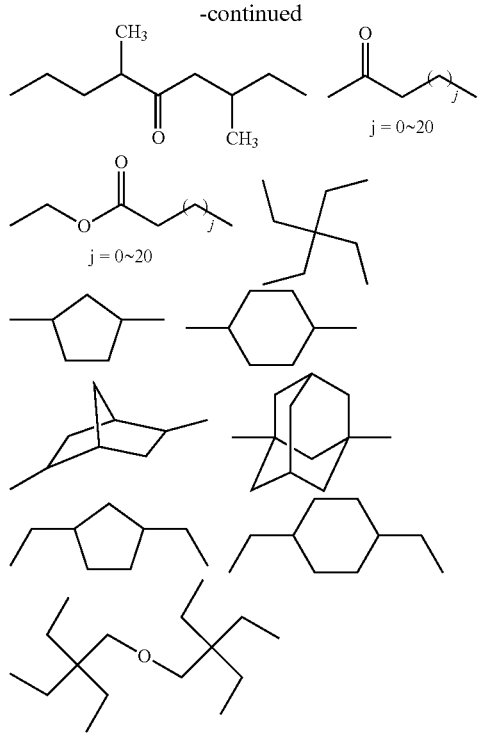
[Chemical Formula 49]
[Chemical Formula 50]
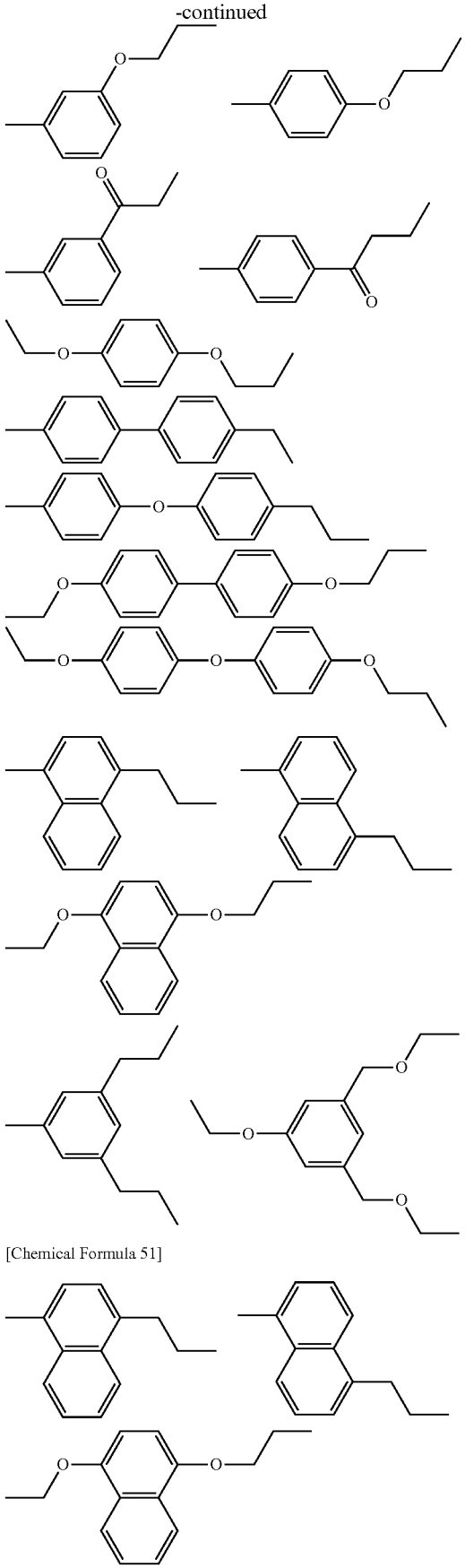
[Chemical Formula 51]

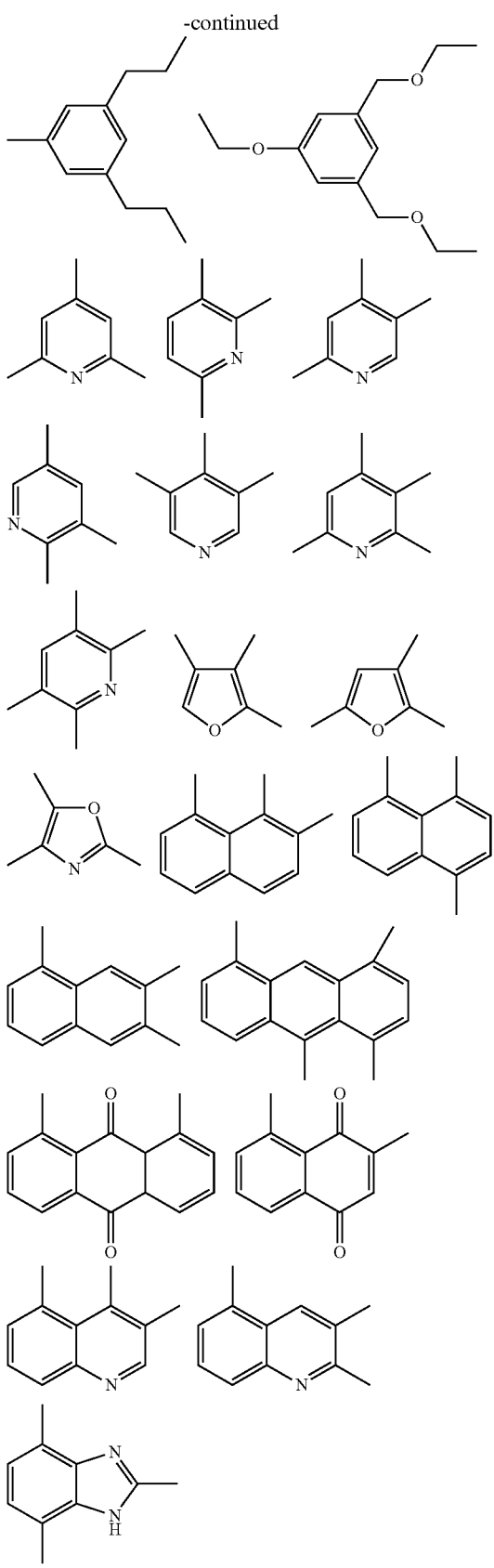

In the above general formula (1), $X^{21}$ represents an arylene group or an alkylene group of 1 to 12 carbon atoms.

There are no particular limitations on the arylene group for $X^{21}$, and examples include groups in which two hydrogen atoms have been removed from an aromatic hydrocarbon ring of 6 to 20 carbon atoms. From the viewpoint of ease of synthesis, a group in which two hydrogen atoms have been removed from an aromatic hydrocarbon ring of 6 to 10 carbon atoms is preferred.

Specific examples of the arylene group include groups in which two hydrogen atoms have been removed from benzene, biphenyl, fluorene, naphthalene, anthracene, phenanthrene or pyrene, and groups in which two hydrogen atoms have been removed from benzene or naphthalene are particularly desirable.

In the arylene group, part or all of the hydrogen atoms within the aromatic hydrocarbon ring may or may not each be substituted with a substituent (an atom other than a hydrogen atom or a group) such as an alkyl group, alkoxy group, halogen atom, halogenated alkyl group or hydroxyl group.

As the alkyl group with which a hydrogen atom of the arylene group may be substituted, an alkyl group of 1 to 5 carbon atoms is preferred, and a methyl group, ethyl group, propyl group, n-butyl group or tert-butyl group is particularly desirable.

As the alkoxy group with which a hydrogen atom of the arylene group may be substituted, an alkoxy group of 1 to 5 carbon atoms is preferred, a methoxy group, ethoxy group, n-propoxy group, iso-propoxy group, n-butoxy group or tert-butoxy group is more preferred, and a methoxy group or ethoxy group is particularly desirable.

As the halogen atom with which a hydrogen atom of the arylene group may be substituted, a fluorine atom is preferred.

Examples of the halogenated alkyl group with which a hydrogen atom of the arylene group may be substituted include groups in which part or all of the hydrogen atoms of an aforementioned alkyl group substituent for the arylene group have each been substituted with a halogen atom. Examples of the halogen atom(s) within the halogenated alkyl group include the same halogen atoms as those described above as the halogen atom substituent for the arylene group.

A fluorinated alkyl group is particularly desirable as the halogenated alkyl group.

The alkylene group for $X^{21}$ is preferably a linear or branched group. The alkylene group contains 1 to 12 carbon atoms, preferably 1 to 10 carbon atoms, more preferably 1 to 5 carbon atoms, and most preferably 1 carbon atom (namely, a methylene group). The case in which all a Y groups are methylene groups is the most desirable.

In the alkylene group, part or all of the hydrogen atoms within the alkylene group may or may not each be substituted with a substituent (an atom other than a hydrogen atom or a group). Examples of substituents with which the alkylene group may be substituted include alkyl groups of 1 to 4 carbon atoms, alkoxy groups of 1 to 4 carbon atoms, and a hydroxyl group.

Of the various possibilities described above, $X^{21}$ is preferably an alkylene group of 1 to 12 carbon atoms, more preferably a linear alkylene group, and most preferably an alkylene group of 1 carbon atom (a methylene group) or 2 carbon atoms (an ethylene group).

$X^{22}$ represents a joining group that can be cleaved under the action of acid.

Examples of this joining group include groups represented by general formulas (2) to (5) shown below.

  (2)

  (3)

  (4)

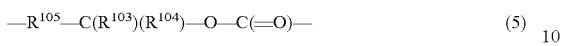  (5)

In formulas (2) to (5), each of $R^{101}$, $R^{102}$, $R^{103}$ and $R^{104}$ independently represents a linear, branched or cyclic alkyl group of 1 to 12 carbon atoms, an aryl group, or a hydrogen atom, wherein the hydrogen atoms of the alkyl group or the aryl group may each be substituted with a halogen atom, an alkoxy group or an epoxy group. $R^{105}$ represents a linear, branched or cyclic alkylene group of 1 to 12 carbon atoms, an arylene group, or a single bond, wherein the hydrogen atoms of the alkylene group or the arylene group may each be substituted with a halogen atom, an alkoxy group or an epoxy group.

In the above general formulas (2) to (5), the alkyl group for $R^{101}$ to $R^{104}$ contains 1 to 12 carbon atoms, is preferably a linear or branched alkyl group, and is most preferably an ethyl group or a methyl group.

The aryl group preferably contains 6 to 20 carbon atoms, and specific examples include a phenyl group and a naphthyl group.

Examples of the halogen atom with which a hydrogen atom of the alkyl group or aryl group may be substituted include a fluorine atom, chlorine atom, bromine atom and iodine atom, and a fluorine atom is particularly desirable.

The alkoxy group with which a hydrogen atom of the alkyl group or aryl group may be substituted preferably contains 1 to 5 carbon atoms, and is more preferably a methoxy group, ethoxy group, n-propoxy group, iso-propoxy group, n-butoxy group or tert-butoxy group.

$R^{101}$ and $R^{102}$ are preferably both hydrogen atoms.

$R^{103}$ and $R^{104}$ preferably both represent alkyl groups, represent an alkoxy group and an alkyl group, or represent an alkoxy group and a hydrogen atom.

In the general formula (5), $R^{105}$ represents a linear, branched or cyclic alkylene group of 1 to 12 carbon atoms which may be substituted with an alkoxy group, hydroxyl group, halogen atom or epoxy group, an arylene group which may be substituted with an alkoxy group, hydroxyl group, halogen atom or epoxy group, or a single bond.

Examples of the halogen atom within $R^{105}$ include the same halogen atoms as those mentioned above within the description of $R^{101}$ ti $R^{104}$.

Examples of the alkoxy group within $R^{105}$ include the same alkoxy groups as those mentioned above within the description of $R^{101}$ to $R^{104}$.

Examples of the alkylene group or arylene group for $R^{105}$ include groups in which a hydrogen atom has been removed from the alkyl groups and aryl groups described above for $R^{101}$ to $R^{104}$.

Of the above possibilities, $R^{105}$ is preferably an alkylene group or a single bond.

Among the joining groups represented by the above general formulas (2) to (5), a joining group represented by the general formula (2) or a joining group represented by the general formula (4) is preferred, and a joining group represented by the general formula (2) is the most desirable.

Specific examples of preferred core portions of the polymer (C21) are shown below.

[Chemical Formula 52]

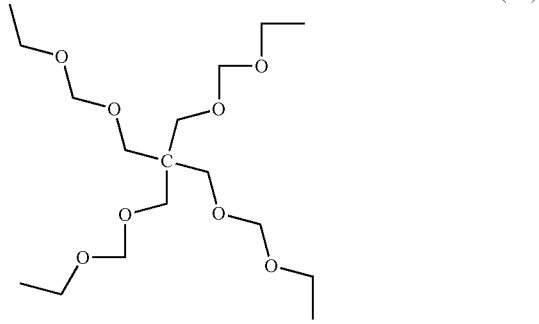  (1-1)

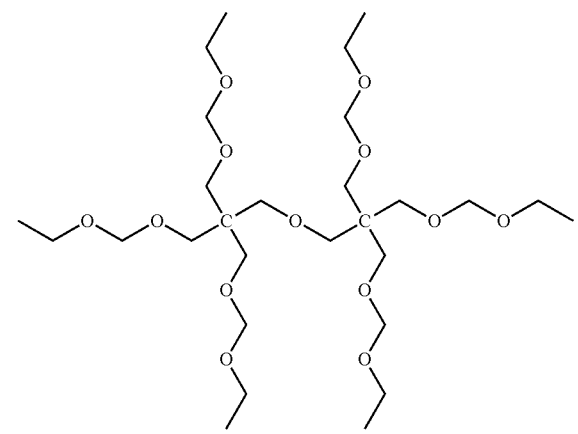  (1-2)

(Arm Portions)

The arm portions of the polymer (C21) are composed of polymer chains that are bonded to the core portion described above.

These polymer chains that are bonded to the core portion are preferably bonded to each of the terminals of the core portion (namely, the terminals of $X^{21}$ on the opposite side from $X^{22}$ in the above formula (1)).

The polymer chains bonded to the core portion may be the same or different from each other, but are preferably the same, as such compounds yield superior effects for the present invention.

Examples of the polymer chains that constitute the arm portions include the same polymers as those described above for the component (C1). For example, specific examples of polymer chains containing the aforementioned structural units (a12) and (a32) include polymer chains containing the two structural units represented by general formula (P-1) shown below.

[Chemical Formula 53]

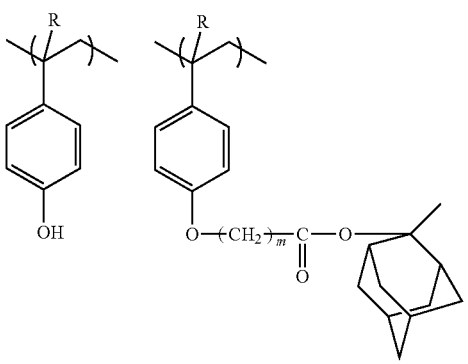

(P-1)

In the formula, R represents a hydrogen atom, an alkyl group of 1 to 5 carbon atoms or a halogenated alkyl group of 1 to 5 carbon atoms, and m represents an integer of 1 to 5.

The weight-average molecular weight (Mw) (the polystyrene-equivalent value determined by gel permeation chromatography) of the polymer (C21) is preferably within a range from 1,000 to 1,000,000, more preferably from 1,500 to 500,000, still more preferably from 1,500 to 50,000, and most preferably from 2,000 to 20,000. Further, the Mn value for each of the arm portions of the polymer (C21) is preferably within a range from 300 to 50,000, more preferably from 500 to 10,000, and most preferably from 500 to 8,000. Further, the average number of structural units that constitute each arm portion (average number of monomer units) is preferably within a range from 2 to 50 units, and more preferably from 3 to 30 units.

The dispersity (Mw/Mn) of the polymer (C21) is preferably within a range from 1.01 to 3.00, more preferably from 1.01 to 2.00, and still more preferably from 1.01 to 1.50. When the dispersity is not more than the upper limit of the above range, the polymer exhibits satisfactory solubility in a resist solvent when used as a resist. On the other hand, when the dispersity is at least as large as the lower limit of the above range, dry etching resistance and the cross-sectional shape of the resist pattern are improved.

The component (C2) can be synthesized using conventional production methods (such as the method disclosed in Japanese Unexamined Patent Application, First Publication No. 2010-217856).

One example of a method of producing the polymer (C21) is described below, for the case where the arm portions are polymer chains composed of the structural units (a12) and (a32). It should be noted that the present invention is not limited to this method.

First, a hydroxystyrene monomer in which the phenolic hydroxyl group has been protected with a protective group is polymerized by an anionic polymerization method to synthesize a polymer (hereinafter referred to as "polymer (a)") that provides the arm portions. Next, by using a coupling agent for anionic polymerization as the raw material for providing the core portion represented by the above general formula (1), the coupling agent for anionic polymerization is reacted with the polymer (a) to synthesize a polymer (C21'), and part or all of the protective groups protecting the phenolic hydroxyl groups in the polymer (C21') are then eliminated. Subsequently, a substituent containing an acid-dissociable group is introduced at the phenolic hydroxyl groups.

<Acid Generator Component (B)>

The resist composition of the present invention may also include an acid generator component (B), which does not correspond with the component (A), and which generates acid upon exposure (hereinafter referred to as "component (B)"), provided the inclusion of this component (B) does not impair the effects of the present invention.

As the component (B), there are no particular limitations, and any of the known acid generators proposed for use in conventional chemically amplified resist compositions may be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

As an onium salt acid generator, a compound represented by general formula (b-1) or (b-2) shown below may be used.

[Chemical Formula 54]

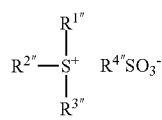

(b-1)

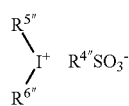

(b-2)

In the formulas, each of $R^{1\prime\prime}$ to $R^{3\prime\prime}$ independently represents an aryl group, alkyl group or alkenyl group which may have a substituent, wherein two of $R^{1\prime\prime}$ to $R^{3\prime\prime}$ may be bonded to each other to form a ring together with the sulfur atom in the formula, each of $R^{5\prime\prime}$ and $R^{6\prime\prime}$ independently represents an aryl group, alkyl group or alkenyl group which may have a substituent, and $R^{4\prime\prime}$ represents an alkyl group, halogenated alkyl group, aryl group or alkenyl group which may have a substituent.

In formula (b-1), each of $R^{1\prime\prime}$ to $R^{3\prime\prime}$ independently represents an aryl group, alkyl group or alkenyl group which may have a substituent. Two of $R^{1\prime\prime}$ to $R^{3\prime\prime}$ may be bonded to each other to form a ring together with the sulfur atom in the formula.

Examples of the aryl group for $R^{1\prime\prime}$ to $R^{3\prime\prime}$ include unsubstituted aryl groups of 6 to 20 carbon atoms, and substituted aryl groups in which part or all of the hydrogen atoms of an aforementioned unsubstituted aryl group have each been substituted with a substituent.

The unsubstituted aryl group for $R^{1\prime\prime}$ to $R^{3\prime\prime}$ is preferably an aryl group of 6 to 10 carbon atoms because such groups enable lower cost synthesis. Specific examples include a phenyl group and a naphthyl group.

Examples of the substituent within the substituted aryl group for $R^{1\prime\prime}$ to $R^{3\prime\prime}$ include an alkyl group, alkoxy group, halogen atom, hydroxyl group, oxo group (=O), aryl group, alkoxyalkyloxy group, alkoxycarbonylalkyloxy group, —C(=O)—O—$R^{7\prime\prime}$, —O—C(=O)—$R^{8\prime\prime}$ and —O—$R^{9\prime\prime}$.

The alkyl group as the substituent is preferably an alkyl group having 1 to 5 carbon atoms, and most preferably a methyl group, ethyl group, propyl group, n-butyl group or tert-butyl group.

The alkoxy group as the substituent for the substituted aryl group is preferably an alkoxy group having 1 to 5 carbon atoms, and most preferably a methoxy group, ethoxy group, n-propoxy group, iso-propoxy group, n-butoxy group or tert-butoxy group.

The halogen atom as the substituent for the substituted aryl group is preferably a fluorine atom.

Examples of the aryl group as the substituent for the substituted aryl group include the same aryl groups as those described above for $R^{1\prime\prime\prime}$ to $R^{3\prime\prime\prime}$, and of these, aryl groups of 6 to 20 carbon atoms are preferred, aryl groups of 6 to 10 carbon atoms are more preferred, and a phenyl group or naphthyl group is particularly desirable.

Examples of the alkoxyalkyloxy group, alkoxycarbonylalkyloxy group, —C—(=O)—O—$R^{7\prime\prime\prime}$, —O—C(=O)—$R^{8\prime\prime\prime}$ and —O—$R^{9\prime\prime\prime}$ within the substituted aryl group include the same alkoxyalkyloxy groups, alkoxycarbonylalkyloxy groups, and groups represented by —C—(=O)—O—$R^{7\prime\prime\prime}$, —O—C(=O)—$R^{8\prime\prime\prime}$ and —O—$R^{9\prime\prime\prime}$ as those mentioned above for the non-aromatic substituent which the alkyl group may have, within the description relating to $R^2$ in the formula (a0-0-1).

The aryl group for each of $R^{1\prime\prime\prime}$ to $R^{3\prime\prime\prime}$ is preferably a phenyl group or a naphthyl group.

Examples of the alkyl group for $R^{1\prime\prime\prime}$ to $R^{3\prime\prime\prime}$ include unsubstituted alkyl groups, and substituted alkyl groups in which part or all of the hydrogen atoms of an aforementioned unsubstituted alkyl group have each been substituted with a substituent.

Examples of the alkenyl group for $R^{1\prime\prime\prime}$ to $R^{3\prime\prime\prime}$ include unsubstituted alkenyl groups, and substituted alkenyl groups in which part or all of the hydrogen atoms of an aforementioned unsubstituted alkyl group have each been substituted with a substituent.

Examples of the unsubstituted alkyl group include the same groups as those mentioned above within the description of $R^2$ in the formula (a0-0-1). Of these, in terms of achieving excellent resolution, an alkyl group of 1 to 5 carbon atoms is preferred. Specific examples include a methyl group, ethyl group, n-propyl group, isopropyl group, n-butyl group, isobutyl group, n-pentyl group, cyclopentyl group, hexyl group, cyclohexyl group, nonyl group and decyl group.

The unsubstituted alkenyl group preferably has 2 to 10 carbon atoms, more preferably 2 to 5 carbon atoms, and still more preferably 2 to 4 carbon atoms. Specific examples of the alkenyl group include a vinyl group, propenyl group (allyl group), butynyl group, 1-methylpropenyl group and 2-methylpropenyl group.

Examples of the substituent within the substituted alkyl group and substituted alkenyl group include the same substituents as those mentioned above for the substituent of the aforementioned substituted aryl group.

Two of $R^{1\prime\prime\prime}$ to $R^{3\prime\prime\prime}$ may be bonded to each other to form a ring together with the sulfur atom in the formula. The formed ring may be saturated or unsaturated. Further, the ring may be either monocyclic or polycyclic. For example, if one or both of the groups that form the ring are cyclic groups (such as a cyclic alkyl group or aryl group), then a polycyclic ring structure (condensed ring structure) is formed when these groups are bonded to each other.

In those cases where two of $R^{1\prime\prime\prime}$ to $R^{3\prime\prime\prime}$ are bonded to each other to form a ring, the ring that includes the sulfur atom from the formula as part of the ring structure is preferably a 3- to 10-membered ring, and more preferably a 5- to 7-membered ring, including the sulfur atom.

The atoms that constitute the ring structure of this ring may include another hetero atom besides the sulfur atom bonded to $R^5$ and $R^6$. Examples of this other hetero atom include a sulfur atom, an oxygen atom and a nitrogen atom.

Specific examples of the ring that is formed include a thiophene ring, thiazole ring, benzothiophene ring, thianthrene ring, dibenzothiophene ring, 9H-thioxanthene ring, thioxanthone ring, phenoxathiin ring, tetrahydrothiophenium ring and tetrahydrothiopyranium ring.

Specific examples of the cation moiety within the compound represented by the above formula (b-1) include triphenylsulfonium, (3,5-dimethylphenyl)diphenylsulfonium, (4-(2-adamantoxymethyloxy)-3,5-dimethylphenyl) diphenylsulfonium, (4-(2-adamantoxymethyloxy)phenyl) diphenylsulfonium, (4-(tert-butoxycarbonylmethyloxy) phenyl)diphenylsulfonium, (4-(tert-butoxycarbonylmethyloxy)-3,5-dimethylphenyl) diphenylsulfonium, (4-(2-methyl-2-adamantyloxycarbonylmethyloxy)phenyl) diphenylsulfonium, (4-(2-methyl-2-adamantyloxycarbonylmethyloxy)-3,5-dimethylphenyl) diphenylsulfonium, tri(4-methylphenyl)sulfonium, dimethyl (4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl) phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl) tetrahydrothiopyranium and 1-(4-methylphenyl)tetrahydrothiopyranium.

Furthermore, specific examples of preferred cation moieties for the compound represented by the above formula (b-1) include the cation moieties represented by formulas (b1-1-1) to (b1-1-33) shown below.

[Chemical Formula 55]

(b1-1-1)

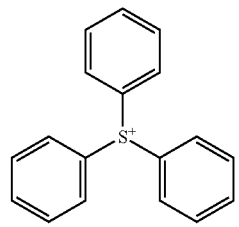

-continued
(b1-1-2)
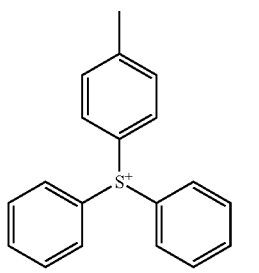
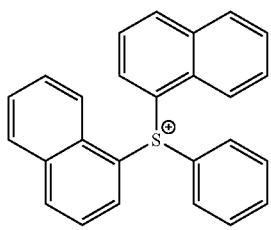
[Chemical Formula 56]
(b1-1-3)
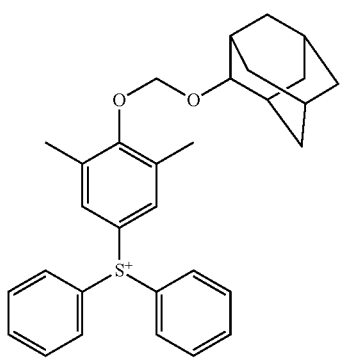
(b1-1-5)
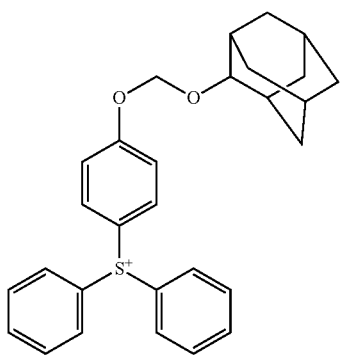
(b1-1-6)
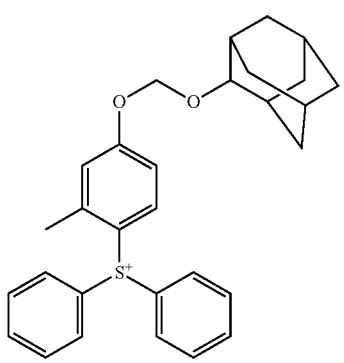
-continued
[Chemical Formula 57]
(b1-1-7)
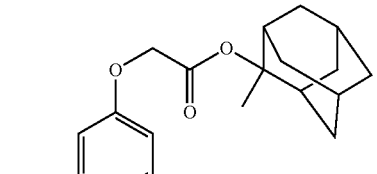
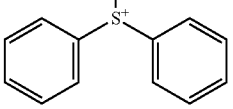
(b1-1-8)
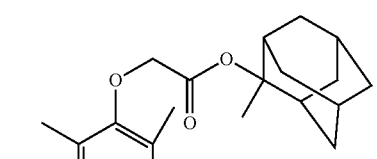
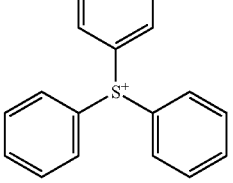
(b1-1-9)
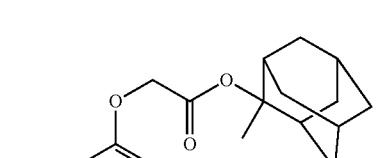
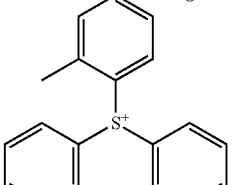
(b1-1-10)
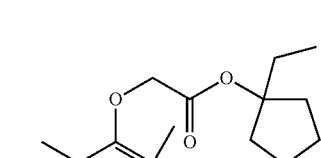
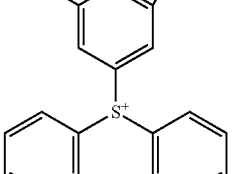

(b1-1-11)
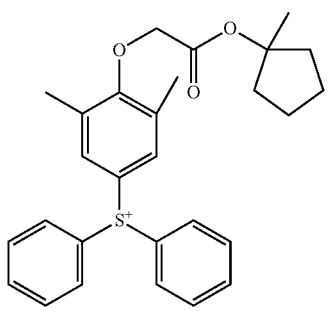
(b1-1-12)
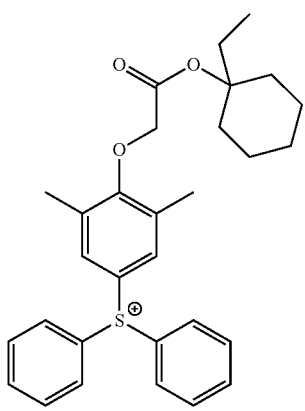
(b1-1-13)
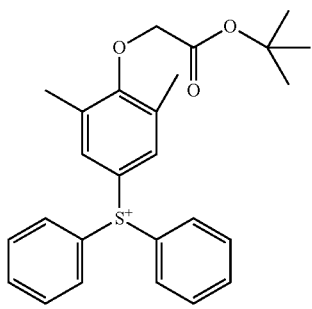
[Chemical Formula 58]
(b1-1-14)
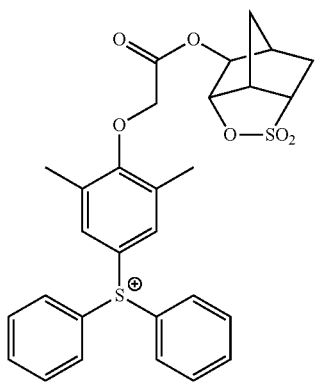
(b1-1-15)
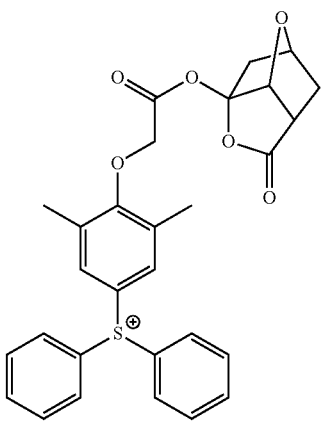
(b1-1-16)
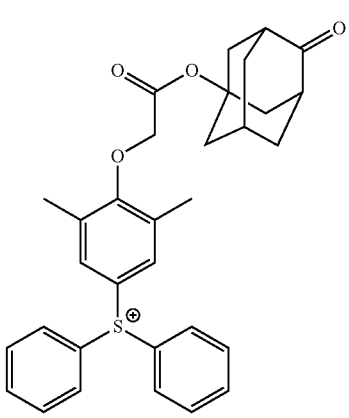
(b1-1-17)
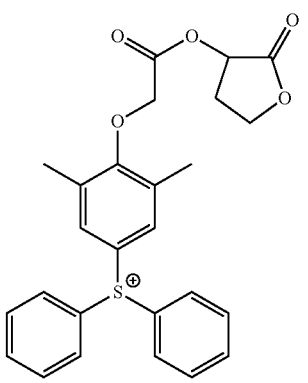
(b1-1-18)
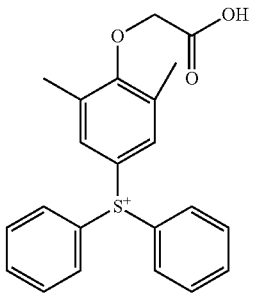

(b1-1-19)
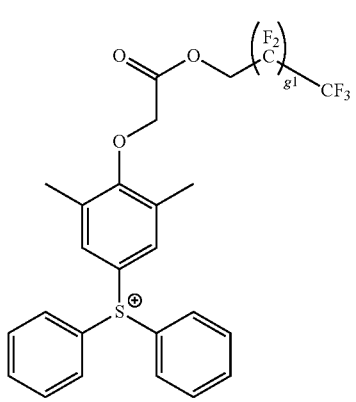
In the above formula, g1 represents the number of repeating units, and is typically an integer of 1 to 5.
[Chemical Formula 59]
(b1-1-20)
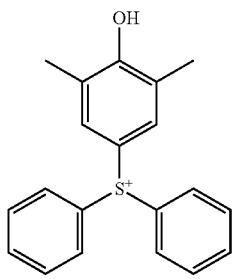
(b1-1-21)
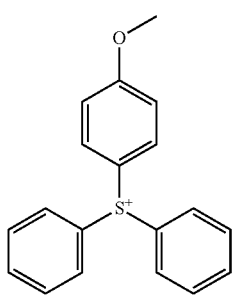
(b1-1-22)
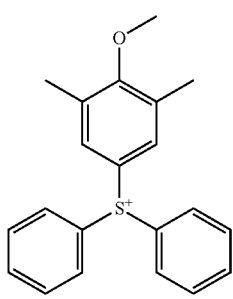
[Chemical Formula 60]
(b1-1-23)
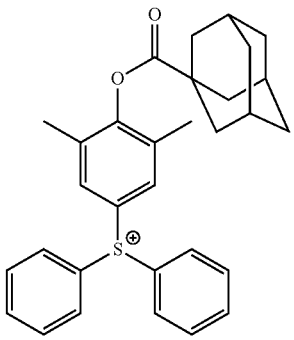
(b1-1-24)
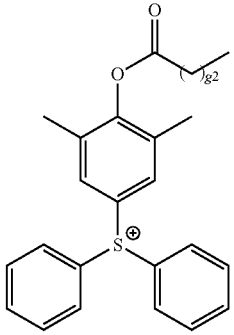
(b1-1-25)
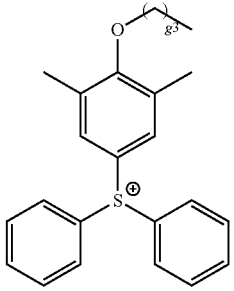
In the above formulas, g2 and g3 represent numbers of repeating units, wherein g2 is an integer of 0 to 20, and g3 is an integer of 0 to 20.
[Chemical Formula 61]
(b1-1-26)
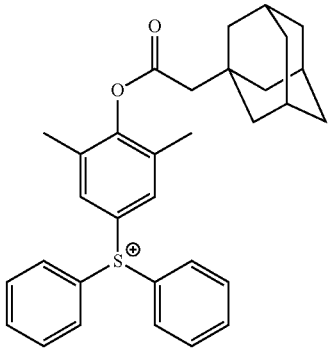

(b1-1-27)
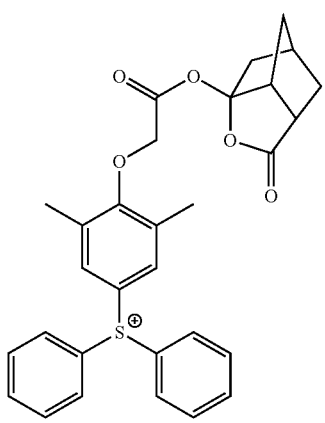

(b1-1-28)
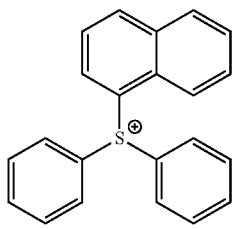

[Chemical Formula 62]

(b1-1-29)
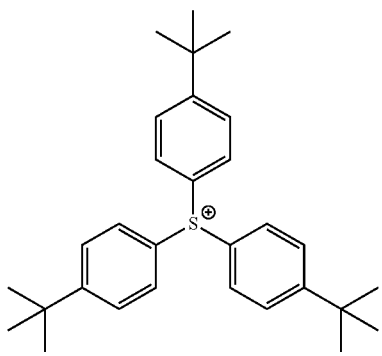

(b1-1-30)
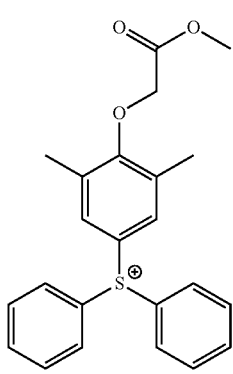

(b1-1-31)
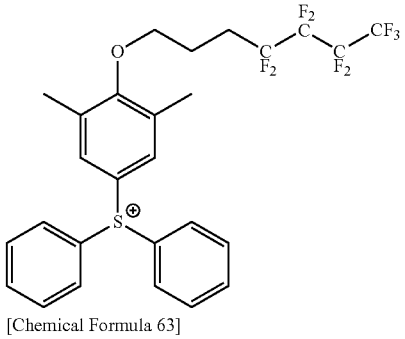

[Chemical Formula 63]

(b1-1-32)
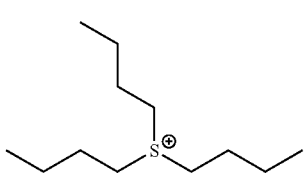

(b1-1-33)
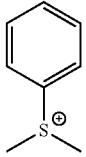

Further, in the cation moiety of the compound represented by formula (b-1), specific examples of preferred cations in the case where two of $R^{1\prime\prime}$ to $R^{3\prime\prime}$ may be bonded to each other to form a ring together with the sulfur atom in the formula include the cation moieties represented by formulas (b1-2) to (b1-5) shown below.

[Chemical Formula 64]

(b1-2)
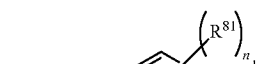
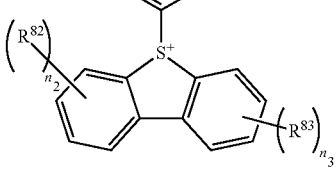

(b1-3)
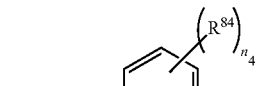
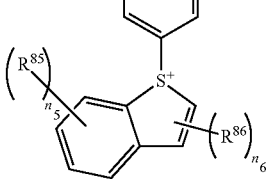

In the above formulas, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

[Chemical Formula 65]

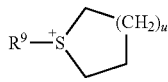
(b1-4)

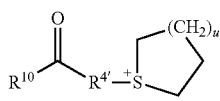
(b1-5)

In the above formulas, each of $R^9$ and $R^{10}$ independently represents a phenyl group or naphthyl group which may have a substituent, an alkyl group or alkoxy group of 1 to 5 carbon atoms, or a hydroxyl group, $R^{4'}$ represents an alkylene group of 1 to 5 carbon atoms, and u represents an integer of 1 to 3.

In formulas (b1-2) and (b1-3), the alkyl group for $R^{81}$ to $R^{86}$ is preferably an alkyl group of 1 to 5 carbon atoms, and among such groups, is more preferably a linear or branched alkyl group, and most preferably a methyl group, ethyl group, propyl group, isopropyl group, n-butyl group or tert-butyl group.

In formulas (b1-2) and (b1-3), the alkoxy group for $R^{81}$ to $R^{86}$ is preferably an alkoxy group of 1 to 5 carbon atoms, and among such groups, is more preferably a linear or branched alkoxy group, and most preferably a methoxy group or an ethoxy group.

In formulas (b1-2) and (b1-3), the hydroxyalkyl group for $R^{81}$ to $R^{86}$ is preferably a group in which one or more of the hydrogen atoms within an aforementioned alkyl group have each been substituted with a hydroxyl group, and is more preferably a hydroxymethyl group, hydroxyethyl group or hydroxypropyl group.

When the subscripts $n_1$ to $n_6$ appended to $R^{81}$ to $R^{86}$ represent an integer of 2 or more, the corresponding plurality of $R^{81}$ to $R^{86}$ groups may be the same or different from each other.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Specific examples of preferred cation moieties represented by the above formula (b1-2) or (b1-3) include the cations shown below.

[Chemical Formula 66]

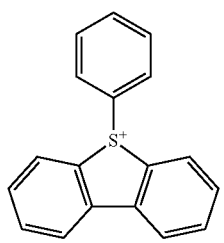
(b1-2-1)

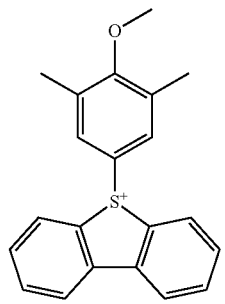
(b1-2-2)

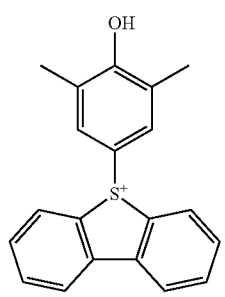
(b1-2-3)

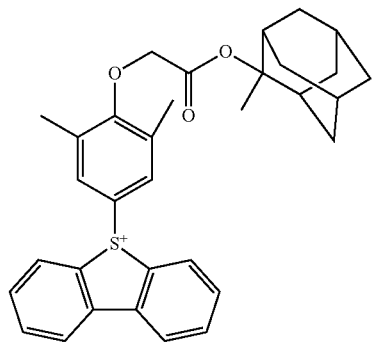
(b1-2-4)

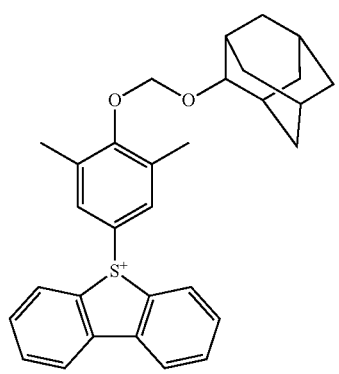
(b1-2-5)

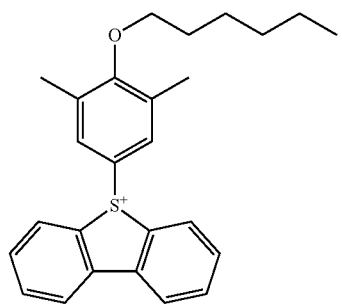
(b1-2-6)

-continued (b1-3-1)

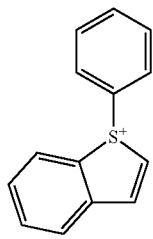

(b1-3-2)

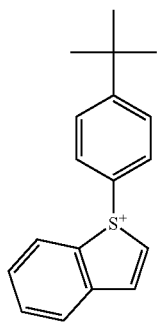

In formulas (b1-4) and (b1-5), each of $R^9$ and $R^{10}$ independently represents a phenyl group or naphthyl group which may have a substituent, an alkyl group or alkoxy group of 1 to 5 carbon atoms, or a hydroxyl group. Examples of the substituent include the same groups as those described above for the substituent of the substituted aryl groups mentioned within the description relating to the aryl groups of $R^{1\prime\prime}$ to $R^{3\prime\prime}$ (such as an alkyl group, alkoxy group, alkoxyalkyloxy group, alkoxycarbonylalkyloxy group, halogen atom, hydroxyl group, oxo group (=O), aryl group, —C—(=O)—O—$R^{7\prime\prime}$, —O—C(=O)—$R^{8\prime\prime}$, —O—$R^{9\prime\prime}$, or a group represented by the above general formula —O—$R^{50}$—C(=O)—O—$R^{56}$ in which $R^{56}$ has been substituted with $R^{56\prime}$).

$R^{4\prime}$ represents an alkylene group of 1 to 5 carbon atoms.

u represents an integer of 1 to 3, and is most preferably 1 or 2.

Specific examples of preferred cation moieties represented by formula (b1-4) or (b1-5) include the cations shown below.

In the formulas below, $R^C$ represents a substituent mentioned above within the description relating to the substituted aryl group (namely, an alkyl group, alkoxy group, alkoxyalkyloxy group, alkoxycarbonylalkyloxy group, halogen atom, hydroxyl group, oxo group (=O), aryl group, —C—(=O)—O—$R^{7\prime\prime}$ or —O—C(=O)—$R^{8\prime\prime}$ or —O—$R^{9\prime\prime}$).

[Chemical Formula 67]

(b1-4-1)

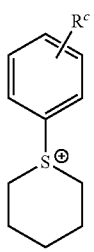

(b1-4-2)

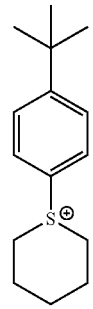

(b1-4-3)

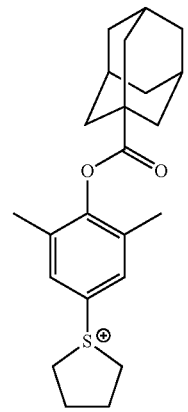

(b1-4-4)

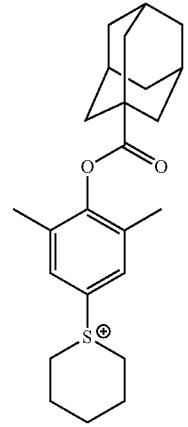

(b1-4-5)

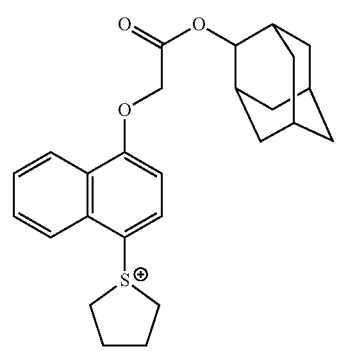

-continued

[Chemical Formula 68]

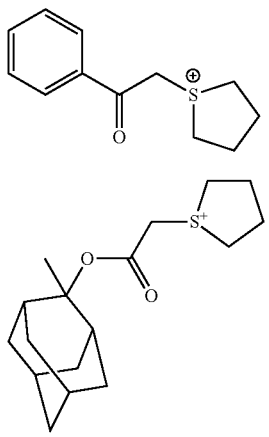

(b1-5-1)

(b1-5-2)

In the above formula (b-1), $R^{4'''}$ represents an alkyl group, halogenated alkyl group, aryl group or alkenyl group which may have a substituent.

The alkyl group for $R^{4'''}$ may be linear, branched or cyclic.

The linear or branched alkyl group preferably contains 1 to 10 carbon atoms, more preferably 1 to 8 carbon atoms, and most preferably 1 to 4 carbon atoms.

The cyclic alkyl group preferably contains 4 to 15 carbon atoms, more preferably 4 to 10 carbon atoms, and most preferably 6 to 10 carbon atoms.

Examples of the halogenated alkyl group for $R^{4'''}$ include groups in which part or all of the hydrogen atoms within an aforementioned linear, branched or cyclic alkyl group have each been substituted with a halogen atom. Examples of the halogen atom include a fluorine atom, chlorine atom, bromine atom or iodine atom. A fluorine atom is preferred.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part or all of the hydrogen atoms within the alkyl group, halogenated alkyl group, aryl group or alkenyl group may each be substituted with a substituent (an atom other than a hydrogen atom, or a group).

$R^{4'''}$ may have one substituent, or two or more substituents.

Examples of the substituent include a halogen atom, a hetero atom, an alkyl group, and a group represented by the formula $X^{10}\text{-}Q^1\text{-}$ (wherein $Q^1$ represents a divalent linking group containing an oxygen atom, and $X^{10}$ represents a hydrocarbon group of 3 to 30 carbon atoms which may have a substituent).

Examples of the halogen atom and alkyl group include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X^{10}\text{-}Q^1\text{-}$, $Q^1$ represents a divalent linking group containing an oxygen atom.

$Q^1$ may contain an atom other than the oxygen atom. Examples of atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—), and combinations of these non-hydrocarbon, oxygen atom-containing linking groups with an alkylene group.

Specific examples of the combinations of the non-hydrocarbon, oxygen atom-containing linking groups and an alkylene group include —$X^{02}$—NH—C(=O)—O—$R^{90}$—, —$R^{91}$—O—, —$R^{91}$—O—C(=O)—, —O—C(=O)—$R^{92}$—, —$R^{91}$—O—C(=O)—$R^{92}$—, and —C(=O)—O—$R^{93}$—O—C(=O)—. In these formulas, $X^{02}$ represents a single bond or a divalent linking group, and each of $R^{90}$ to $R^{93}$ independently represents an alkylene group.

Examples of the linking group for $X^{02}$ include the same divalent linking groups as those described above for $R^1$.

The alkylene group for $R^{90}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—$CH_2$—], alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, an ethylene group [—$CH_2CH_2$—], alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, a trimethylene group (n-propylene group) [—$CH_2CH_2CH_2$—], alkyltrimethylene groups such as —CH($CH_3$)$CH_2CH_2$— and —$CH_2$CH($CH_3$)$CH_2$—, a tetramethylene group [—$CH_2CH_2CH_2CH_2$—], alkyltetramethylene groups such as —CH($CH_3$)$CH_2CH_2CH_2$— and —$CH_2$CH($CH_3$)$CH_2CH_2$—, and a pentamethylene group [—$CH_2CH_2CH_2CH_2CH_2$—].

$Q^1$ is preferably a divalent linking group containing an ester linkage or ether linkage, and is more preferably a group represented by —$R^{91}$—O—, —$R^{92}$—O—C(=O)— or —C(=O)—O—$R^{93}$—O—C(=O)—.

In the group represented by the formula $X^{10}\text{-}Q^1\text{-}$, the hydrocarbon group for $X^{10}$ may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within substituents is not included in the number of carbon atoms of the aromatic hydrocarbon group.

Specific examples of the aromatic hydrocarbon group include aryl groups, which are aromatic hydrocarbon rings having one hydrogen atom removed therefrom, such as a phenyl group, biphenylyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, a portion of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which a portion of the carbon atoms that constitute the ring within an aforementioned aryl group have been substituted with a hetero atom such as an oxygen atom, a sulfur atom or a nitrogen atom, and heteroarylalkyl groups in which a portion of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group or oxo group (=O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is particularly desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

The aliphatic hydrocarbon group for $X^{10}$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $X^{10}$, a portion of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on this "hetero atom" within $X^{10}$, provided it is an atom other than a carbon atom or a hydrogen atom. Examples of the hetero atom include a halogen atom, oxygen atom, sulfur atom and nitrogen atom. Examples of the halogen atom include a fluorine atom, chlorine atom, iodine atom and bromine atom.

The substituent containing a hetero atom may consist solely of the hetero atom, or may be a group that also contains a group or atom other than the hetero atom.

Specific examples of the substituent for substituting a portion of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, any of these substituents may be included within the ring structure of the aliphatic hydrocarbon group.

Examples of the substituent for substituting part or all of the hydrogen atoms include an alkoxy group, halogen atom, halogenated alkyl group, hydroxyl group, oxo group (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 69]

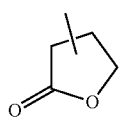 (L1)

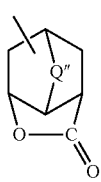 (L2)

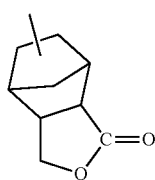 (L3)

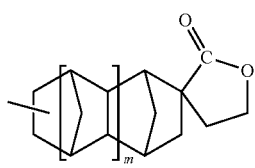 (L4)

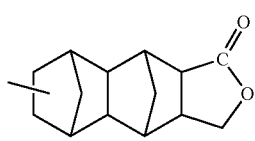 (L5)

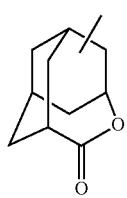 (L6)

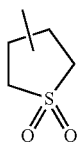 (S1)

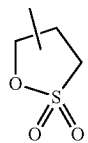 (S2)

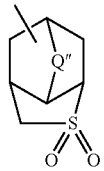 (S3)

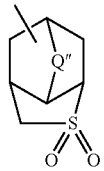 (S4)

In the formulas, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms), and m represents an integer of 0 or 1.

Examples of the alkylene groups for Q″, R$^{94}$ and R$^{95}$ include the same alkylene groups as those described above for R$^{91}$ to R$^{93}$.

In these aliphatic cyclic groups, part of the hydrogen atoms bonded to the carbon atoms that constitute the ring structure may each be substituted with a substituent. Examples of this substituent include an alkyl group, alkoxy group, halogen atom, halogenated alkyl group, hydroxyl group or oxo group (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting part or all of the hydrogen atoms.

Among the various possibilities described above, X$^{10}$ is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L5), and (S3) and (S4) are preferable.

Further, X$^{10}$ is preferably a group containing a polar region, as such groups yield improved lithography properties and a superior resist pattern shape.

Examples of these groups containing a polar region include groups in which a portion of the carbon atoms that constitute the aliphatic cyclic group of an above-mentioned group X$^{10}$ have been substituted with a substituent containing a hetero atom, namely with a substituent such as —O—, —C(=O)—O—, —C(=O)—, —C(=O)—NH—, —NH— (wherein H may be substituted with a substituent such as an alkyl group or an acyl group), —S—, —S(=O)₂— or —S(=O)₂—O.

Among the above possibilities, $R^{4'''}$ is preferably a group having $X^{10}$-$Q^1$- as a substituent. In such cases, $R^{4'''}$ is preferably a group represented by the formula $X^{10}$-$Q^1$-$Y^1$— (wherein $Q^1$ and $X^{10}$ are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula $X^{10}$-$Q^1$-$Y^1$—, examples of the alkylene group represented by $Y^1$ include those alkylene groups described above for $Q^1$ in which the number of carbon atoms is within a range from 1 to 4.

Examples of the fluorinated alkylene group for $Y^1$ include groups in which part or all of the hydrogen atoms of an above-mentioned alkylene group have each been substituted with a fluorine atom.

Specific examples of $Y^1$ include —CF₂—, —CF₂CF₂—, —CF₂CF₂CF₂—, —CF(CF₃)CF₂—, —CF(CF₂CF₃)—, —C(CF₃)₂—, —CF₂CF₂CF₂CF₂—, —CF(CF₃)CF₂CF₂—, —CF₂CF(CF₃)CF₂—, —CF(CF₃)CF(CF₃)—, —C(CF₃)₂CF₂—, —CF(CF₂CF₃)CF₂—, —CF(CF₂CF₃)CF₂—, —C(CF₃)(CF₂CF₃)—, —CHF—, —CH₂CF₂—, —CH₂CH₂CF₂—, —CH₂CF₂CF₂—, —CH(CF₃)CH₂—, —CH(CF₂CF₃)—, —C(CH₃)(CF₃)—, —CH₂CH₂CH₂CF₂—, —CH₂CH₂CF₂CF₂—, —CH(CF₃)CH₂CH₂—, —CH₂CH(CF₃)CH₂—, —CH(CF₃)CH(CF₃)—, —C(CF₃)₂CH₂—, —CH₂—, —CH₂CH₂—, —CH₂CH₂CH₂—, —CH(CH₃)CH₂—, —CH(CH₂CH₃)—, —C(CH₃)₂—, —CH₂CH₂CH₂CH₂—, —CH(CH₃) CH₂CH₂—, —CH₂CH(CH₃)CH₂—, —CH(CH₃)CH (CH₃)—, —C(CH₃)₂CH₂—, —CH(CH₂CH₃)CH₂—, —CH (CH₂CH₂CH₃)— and —C(CH₃)(CH₂CH₃)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —CF₂—, —CF₂CF₂—, —CF₂CF₂CF₂—, —CF(CF₃) CF₂—, —CF₂CF₂CF₂CF₂—, —CF(CF₃)CF₂CF₂—, —CF₂CF(CF₃)CF₂—, —CF(CF₃)CF(CF₃)—, —C(CF₃)₂ CF₂—, —CF(CF₂CF₃)CF₂—, —CH₂CF₂—, —CH₂CH₂CF₂—, —CH₂CF₂CF₂—, —CH₂CH₂CH₂CF₂—, —CH₂CH₂CF₂CF₂— and —CH₂CF₂CF₂CF₂—.

Of these, —CF₂—, —CF₂CF₂—, —CF₂CF₂CF₂— or CH₂CF₂CF₂— is preferable, —CF₂—, —CF₂CF₂— or —CF₂CF₂CF₂— is more preferable, and —CF₂— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents with which the alkylene group or fluorinated alkylene group may be substituted include alkyl groups of 1 to 4 carbon atoms, alkoxy groups of 1 to 4 carbon atoms, and a hydroxyl group.

In the above formula (b-2), each of $R^{5'''}$ and $R^{6'''}$ independently represents an aryl group, alkyl group or alkenyl group which may have a substituent.

Further, in terms of achieving better improvement in the lithography properties and the resist pattern shape, it is preferable that at least one of $R^{5'''}$ and $R^{6'''}$ is an aryl group, and more preferable that both of $R^{5'''}$ and $R^{6'''}$ are aryl groups.

Examples of the aryl group for $R^{5'''}$ and $R^{6'''}$ include the same aryl groups as those described for $R^{1'''}$ to $R^{3'''}$.

Examples of the alkyl group for $R^{5'''}$ and $R^{6'''}$ include the same alkyl groups as those described for $R^{1'''}$ to $R^{3'''}$.

Examples of the alkenyl group for $R^{5'''}$ and $R^{6'''}$ include the same alkenyl groups as those described for $R^{1'''}$ to $R^{3'''}$.

Among the various possibilities, the case in which $R^{5'''}$ and $R^{6'''}$ are both phenyl groups is the most desirable.

Specific examples of the cation moiety within the compound represented by formula (b-2) include diphenyliodonium and bis(4-tert-butylphenyl)iodonium.

Examples of $R^{4'''}$ within the formula (b-2) include the same groups as those described above for $R^{4'''}$ within formula (b-1).

Specific examples of onium salt acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by an alkyl sulfonate such as methanesulfonate, n-propanesulfonate, n-butanesulfonate, n-octanesulfonate, 1-adamantanesulfonate or 2-norbornanesulfonate, by a substituted alkyl sulfonate such as d-camphor-10-sulfonate, or by an aromatic sulfonate such as benzenesulfonate, perfluorobenzenesulfonate or p-toluenesulfonate.

Further, onium salts in which the anion moiety of these onium salts has been replaced by an anion moiety represented by any one of formulas (b1) to (b8) shown below can also be used.

[Chemical Formula 70]

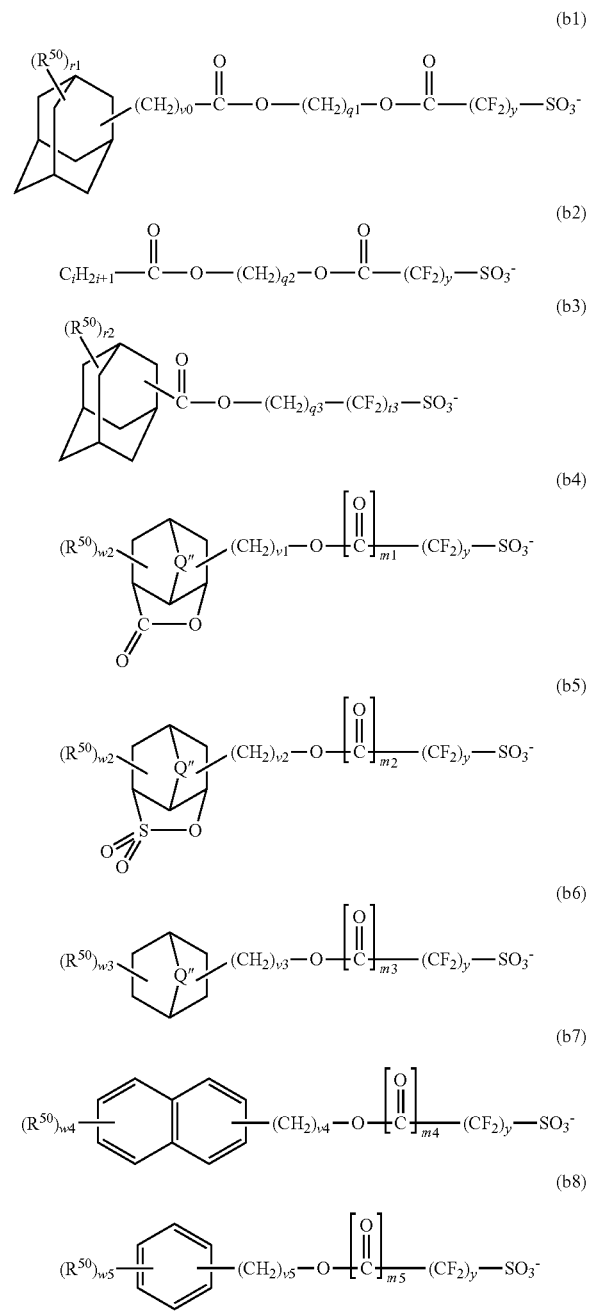

In the formulas, y represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q" is the same as defined above.

Examples of the substituent for $R^{50}$ include the same groups as those which the aforementioned aliphatic hydrocarbon group or aromatic hydrocarbon group for $X^{10}$ may have as a substituent.

If there are two or more $R^{50}$ groups, as indicated by the values r1, r2, and w1 to w5, then the plurality of $R^{50}$ groups within the compound may be the same or different from each other.

Further, onium salts in which the anion moiety of these onium salts has been replaced by an anion moiety represented by formula (b9) shown below can also be used.

In formula (b9), $X^{10}$ and $Y^{1}$ are the same as defined above for $X^{10}$ and $Y^{1}$ respectively in the formula $X^{10}$-$Q^{1}$-$Y^{1}$ mentioned within the description of $R^{4"}$. $X^{02}$ and $R^{90}$ are the same as defined above for $X^{02}$ and $R^{90}$ respectively in the formula —$X^{02}$—NH—C(=O)—O—$R^{90}$— mentioned within the description of $Q^{1}$.

[Chemical Formula 71]

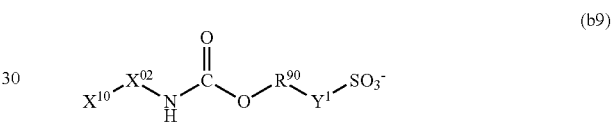

In the formula, $X^{10}$, $X^{02}$, $R^{90}$ and $Y^{1}$ are each the same as defined above.

Further, onium salt acid generators in which the anion moiety ($R^{4"}SO_3^-$) in the above general formula (b-1) or (b-2) has been replaced with an anion moiety represented by general formula (b-3) or (b-4) shown below (but in which the cation moiety is the same as the cation shown in formula (b-1) or (b-2)) can also be used favorably as the onium salt acid generator.

[Chemical Formula 72]

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group contains 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group contains 1 to 10 carbon atoms, preferably 1 to 7 carbon atoms, and more preferably 1 to 3 carbon atoms.

The smaller the number of carbon atoms in the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less and electron beams is improved.

The proportion of fluorine atoms within the alkylene group or alkyl group, namely the fluorination ratio, is preferably within a range from 70 to 100%, and more preferably from 90 to 100%. A perfluoroalkylene or perfluoroalkyl group in which all the hydrogen atoms are substituted with fluorine atoms is the most desirable.

As the onium salt acid generator, onium salts of the above general formula (b-1) or (b-2) in which the anion moiety ($R^{4"}SO_3^-$) has been substituted with $R^a$—COO$^-$ (wherein $R^a$ represents an alkyl group or a fluorinated alkyl group) (and in which the cation moiety is the same as that of general formula (b-1) or (b-2)) may also be used.

Examples of $R^a$ in the above formula include the same groups as those listed above for $R^{4"}$.

Specific examples of $R^a$—COO$^-$ include a trifluoroacetate ion, an acetate ion, and a 1-adamantanecarboxylate ion.

In the present description, an oxime sulfonate acid generator is a compound having at least one group represented by general formula (B-1) shown below, and has a feature of generating acid upon irradiation (exposure). Such oxime sulfonate acid generators are widely used for chemically amplified resist compositions, and any of these known compounds may be selected as appropriate.

[Chemical Formula 73]

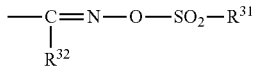

(B-1)

In formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

The organic group for $R^{31}$ is preferably a linear, branched or cyclic alkyl group, or an aryl group. The alkyl group or aryl group may have a substituent. There are no particular limitations on the substituent, and examples include a fluorine atom and a linear, branched or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. A "partially halogenated alkyl group" refers to an alkyl group in which part of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group for $R^{31}$ preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which part of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As the organic group for $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 74]

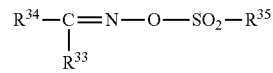

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 75]

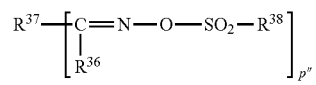

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group or phenanthryl group, and heteroaryl groups in which a portion of the carbon atoms that constitute the ring(s) of these groups are substituted with a hetero atom such as an oxygen atom, a sulfur atom or a nitrogen atom. Of these, a fluorenyl group is preferable.

The aryl group for $R^{34}$ may have a substituent such as an alkyl group, halogenated alkyl group or alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group described above for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 09-208554 (Chemical Formulas 18 and 19 shown in paragraphs [0012] to [0014]) and oxime sulfonate acid generators disclosed in WO 2004/074242 A2 pamphlet (Examples 1 to 40 described on pages 65 to 85) may also be used favorably.

Furthermore, the following compounds may also be used as preferred examples.

[Chemical Formula 76]

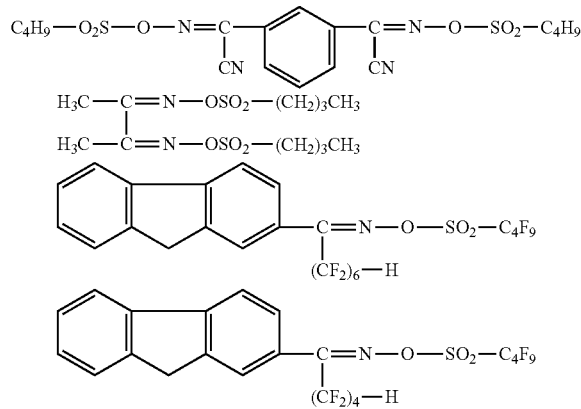

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types of acid generators may be used in combination.

The amount of the component (B) within the resist composition of the present invention is preferably within a range from 0 to 60 parts by weight, more preferably from 0 to 40 parts by weight, and still more preferably from 0 to 10 parts by weight, relative to 100 parts by weight of the combination of the component (A) and the component (C) (or relative to 100 parts by weight of the component (A) in those cases where the composition does not include the component (C)). When the amount of the component (B) is not more than 40 parts by weight, a uniform solution can be obtained when each of the components of the resist composition are dissolved in an organic solvent, and the storage stability of the composition tends to improve. In particular, when the amount of the component (B) is 10 parts by weight or less, a good balance can be achieved between suppressing any deterioration in the lithography properties caused by OoB light, and increasing the sensitivity.

<Optional Components>

In those cases where the resist composition of the present invention is a composition that forms a positive-type resist pattern in an alkali developing process and forms a negative-type resist pattern in an solvent developing process, a low molecular weight compound that may be used as the component (C) is preferably a low molecular weight compound having a molecular weight of at least 500 but less than 2,500, which contains a hydrophilic group and also contains an acid-dissociable group such as those mentioned above within the description of the component (A1). Specific examples include compounds containing a plurality of phenol structures in which part or all of the hydrogen atoms of the hydroxyl groups have each been substituted with an aforementioned acid-dissociable group.

This type of low molecular weight compound is preferably a low molecular weight phenol compound in which a portion of the hydroxyl group hydrogen atoms have each been substituted with an aforementioned acid-dissociable group. These types of compounds are known, for example, as sensitizers or heat resistance improvers for use in non-chemically amplified g-line or i-line resists, and any of these compounds may be used as appropriate.

Specific examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane structures is preferable, as such compounds yield superior levels of resolution and line width roughness (LWR).

There are no particular limitations on the acid-dissociable group, and examples include the same acid-degradable groups as those mentioned above.

The resist composition of the present invention may also include a nitrogen-containing organic compound (D) (hereinafter referred to as "component (D)") that does not correspond with the above components (A) to (C).

There are no particular limitations on the component (D) provided it functions as an acid diffusion control agent, namely, a quencher which traps the acid generated from the component (A) and the component (B) upon exposure. A multitude of these components (D) have already been proposed, and any of these known compounds may be used. Examples of these conventional compounds include amines such as aliphatic amines and aromatic amines, and of these, an aliphatic amine, and particularly a secondary aliphatic amine or tertiary aliphatic amine, is preferable.

An "aliphatic amine" is an amine having one or more aliphatic groups, wherein each of the aliphatic groups preferably contains 1 to 20 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), and cyclic amines.

The alkyl group within the alkylamine may be linear, branched or cyclic.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamine include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine.

Examples of the alkyl group of the hydroxyalkyl group within the aforementioned alkyl alcohol amine include the same groups as those mentioned above for the alkyl group within the alkylamine.

Specific examples of the alkyl alcohol amine include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

Examples of the aromatic amine include aniline, pyridine, 4-dimethylaminopyridine, pyrrole, indole, pyrazole, imidazole and derivatives thereof, diphenylamine, triphenylamine, tribenzylamine, 2,6-diisopropylaniline and N-tert-butoxycarbonyl pyrrolidine.

As the component (D), any of the above compounds may be used alone, or two or more different compounds may be used in combination.

The component (D) is typically used in an amount within a range from 0.01 to 5.0 parts by weight, relative to 100 parts by weight of the combination of the component (A) and the component (C) (or relative to 100 parts by weight of the component (A) in those cases where the composition does not include the component (C)). By ensuring that the amount of the component (D) is within the aforementioned range, the shape of the resist pattern and the post exposure stability of the latent image formed by the pattern-wise exposure of the resist layer are improved.

Furthermore, in the resist composition of the present invention, for the purposes of preventing any deterioration in sensitivity, and improving the resist pattern shape and the post exposure stability of the latent image formed by the pattern-wise exposure of the resist layer, at least one compound (E) (hereinafter referred to as "component (E)") selected from the group consisting of organic carboxylic acids, and phosphorus oxo acids and derivatives thereof may also be added.

Examples of the organic carboxylic acids include acetic acid, malonic acid, citric acid, malic acid, succinic acid, benzoic acid and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives phosphinic acid esters such as phenylphosphinic acid.

As the component (E), salicylic acid is particularly preferred.

As the component (E), one compound may be used alone, or two or more different compounds may be used in combination.

The component (E) is typically used in an amount within a range from 0.01 to 5.0 parts by weight relative to 100 parts by weight of the combination of the component (A) and the component (C) (or relative to 100 parts by weight of the component (A) in those cases where the composition does not include the component (C)).

If desired, miscible additives may also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The resist composition of the present invention can be prepared by dissolving the materials for the resist composition in an organic solvent (hereinafter frequently referred to as "component (S)").

The component (S) may be any organic solvent which can dissolve each of the components used to give a uniform solution, and one or more types of organic solvent may be selected appropriately from those solvents that have been conventionally known as solvents for a chemically amplified resists.

Examples include lactones such as γ-butyrolactone;

ketones such as acetone, methyl ethyl ketone, cyclohexanone, methyl-n-pentyl ketone, methyl isopentyl ketone and 2-heptanone;

polyhydric alcohols such as ethylene glycol, diethylene glycol, propylene glycol and dipropylene glycol;

polyhydric alcohol derivatives, including compounds having an ester bond such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of these polyhydric alcohols or compounds having an ester bond [among these derivatives, propylene glycol monomethyl ether acetate (PGMEA) and propylene glycol monomethyl ether (PGME) are preferred];

cyclic ethers such as dioxane;

esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among the above solvents, propylene glycol monomethyl ether acetate (PGMEA), propylene glycol monomethyl ether (PGME) and ethyl lactate (EL) are preferred.

Further, among the mixed solvents, a mixed solvent obtained by mixing PGMEA with a polar solvent is preferable. The mixing ratio (weight ratio) of the mixed solvent may be determined as appropriate, with due consideration of the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed in combination as the polar solvent, the PGMEA:(PGME+cyclohexanone) weight ratio is preferably from 1:9 to 9:1, more preferably from 2:8 to 8:2, and still more preferably from 3:7 to 7:3.

Further, as the component (S), a mixed solvent of PGMEA, EL or an aforementioned mixed solvent of PGMEA and a polar solvent, with γ-butyrolactone is also preferable. In this case, the mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

The resist composition of the present invention and the component (A1) included within the resist composition are novel materials that have been unknown until now.

When the component (A1) is subjected to EUV exposure or EB exposure, acid is generated from the structural unit (a0). As a result, the component (A1) can be used as an acid generator for a chemically amplified resist composition for use with EUV or EB. Further, even by itself, the component (A1) is a resin component that is capable of forming a film (resist film), while also exhibiting changed solubility in a developing solution under the action of acid, and can therefore also function as the base component of the resist composition. Accordingly, even by itself, the component (A1) can function as a chemically amplified resist composition for use with EUV or EB. In other words, by subjecting the component (A1) to EUV exposure or EB exposure, the action of the acid generated from the structural unit (a0) causes the entire component (A1) to exhibit changed solubility in a developing solution. As a result, even in the case of a film formed solely from the component (A1), a resist pattern can be performed by subjecting the film to selective exposure and then performing developing.

Further, the resist composition of the present invention exhibits superior sensitivity and resolution when forming a resist pattern by EUV exposure or EB exposure, and moreover, the shape of the formed resist pattern has minimal roughness and exhibits a high degree of rectangularity for the cross-sectional shape (namely, superior verticalness of the pattern side walls).

In the present invention, it is thought that there is a synergistic action between the fact that introducing the structural unit (a0) containing an acid-generating region into the resin component results in a more uniform distribution of the acid-generating regions throughout the resist film, and the fact that because the cation moiety of the structural unit (a0) has no aromaticity, it is less likely to absorb light in the DUV region (wavelength: 150 to 350 nm), enabling suppression of the adverse effects resulting from the penetration into the unexposed portions of light from the DUV region incorporated within the OoB light generated during EUV exposure (such as the generation of acid in the unexposed portions and the accompanying change in solubility within the developing solution). In the DUV region, degradation of acid generator components is caused by light absorption by the cation moiety, and therefore, in the present invention, the fact that the cation moiety of the acid-generating region in the structural unit (a0) lacks aromaticity, and therefore exhibits a high degree of transparency to light in the DUV region, is a very important factor.

<<Method of Forming Resist Pattern>>

The method of forming a resist pattern according to the present invention includes: forming a resist film on a substrate using the resist composition of the present invention, conducting exposure of the resist film using EUV or EB, and developing the resist film to form a resist pattern.

The method for forming a resist pattern according to the present invention can be performed, for example, as follows.

First, the resist composition of the present invention is applied onto a substrate using a spinner or the like, and a bake treatment (post applied bake (PAB)) is conducted under temperature conditions of 80 to 150° C. for 40 to 120 seconds, and preferably 60 to 90 seconds to form a resist film.

Subsequently, the resist film is selectively exposed using an exposure apparatus such as an EB exposure apparatus or an EUV exposure apparatus, either by irradiation through a mask having a predetermined pattern formed therein (namely, a mask pattern), or by patterning via direct irradiation with an electron beam without using a mask pattern, and the resist film is then subjected to a bake treatment (post exposure bake (PEB)) under temperature conditions of 80 to 150° C. for 40 to 120 seconds, and preferably 60 to 90 seconds.

Next, the resist film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

There are no particular limitations on the substrate, and a conventionally known substrate may be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) or an organic film such as the lower organic film in a multilayer resist method can be used.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

There are no particular limitations on the wavelength used for exposure, and the exposure can be conducted using radiation such as an ArF excimer laser, KrF excimer laser, $F_2$ excimer laser, extreme ultraviolet radiation (EUV), vacuum ultraviolet radiation (VUV), electron beam (EB), X-rays, and soft X-rays. The resist composition of the present invention is particularly effective for use with a KrF excimer laser, ArF excimer laser, EB or EUV.

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film that is to be exposed. The refractive index of the immersion medium is not particularly limited as long at it satisfies the above requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon solvents.

Conventional additives may be added to the organic developing solution as required. Examples of these additives include surfactants. There are no particular limitations on the surfactants, and ionic and nonionic fluorine-based surfactants and/or silicon-based surfactants can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following a solvent developing process include those organic solvents among the solvents described above for the organic solvent of the organic developing solution which exhibit poor dissolution of the resist pattern. Examples of typical solvents that may be used include one or more solvents selected from among hydrocarbon solvents, ketone-based solvents, ester-based solvents, alcohol-based solvents, amide-based solvents and ether-based solvents. Among these, at least one solvent selected from among hydrocarbon solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

<<Polymeric Compound>>

A polymeric compound of the present invention has a structural unit (a0) represented by the general formula (a0-0-1) shown below.

Details regarding this polymeric compound of the present invention are the same as described above within the description of the component (A1) of the resist composition of the present invention.

[Chemical Formula 77]

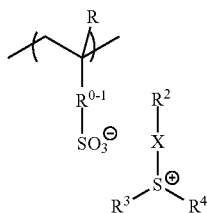

(a0-0-1)

In the formula, R represents a hydrogen atom, an alkyl group of 1 to 5 carbon atoms or a halogenated alkyl group of 1 to 5 carbon atoms, $R^{0-1}$ represents a single bond or a divalent linking group, each of $R^2$, $R^3$ and $R^4$ independently represents a linear, branched or cyclic alkyl group which may have a non-aromatic substituent, or alternatively $R^3$ and $R^4$ may be bonded to each other to form a ring together with the sulfur atom in the formula, and X represents a non-aromatic divalent linking group or a single bond.

EXAMPLES

A more detailed description of the present invention is presented below based on a series of examples, although the present invention is in no way limited by these examples.

In the examples, a compound represented by a chemical formula (01) is designated as "compound (01)", and the same labeling system applies for compounds represented by other formulas.

In the NMR analyses, tetramethylsilane (TMS) was used as an internal standard for the $^1$H-NMR and $^{13}$C-NMR measurements, and hexafluorobenzene was used as an internal standard for the $^{19}$F-NMR measurements (with the hexafluorobenzene peak designated as −160 ppm).

Of the monomers used in the polymer synthesis examples described below, the compound (01) was synthesized via a monomer synthesis example described below. Compounds (02) to (05) were synthesized in a similar manner.

Monomer Synthesis Example

Synthesis of Compound (01)

A round-bottom flask was charged with a compound A (2.8 g), a compound B (3.8 g), dichloromethane (26 g) and pure water (26 g), and the resulting mixture was stirred for 30 minutes at room temperature. Subsequently, the dichloromethane layer was washed with a 1% aqueous solution of hydrochloric acid, and was then washed repeatedly with pure water (26 g) until neutral. The organic layer was then concentrated under reduced pressure, yielding 4.7 g of a compound (01) as a white powder.

The obtained compound was analyzed by NMR, and the structure was identified on the basis of the results shown below.

$^1$H-NMR (400 MHz, DMSO-d6): δ (ppm)=6.1 (s, 1H, CH$_2$=C), 5.74 (s, 1H, CH$_2$=C), 4.58 to 4.67 (t, 2H, CH$_2$), 1.89 (s, 3H, CH$_3$)

$^{19}$F-NMR (376 MHz, DMSO-d6): δ (ppm)=−111.3

[Chemical Formula 78]

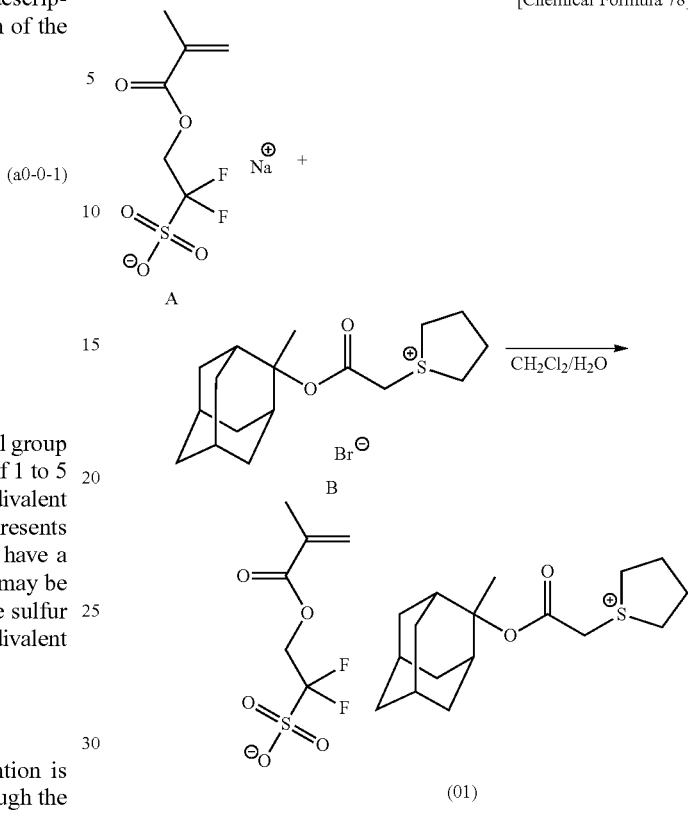

Polymer Synthesis Example 1

Synthesis of Polymeric Compound 1

In a separable flask fitted with a thermometer, a reflux condenser and a nitrogen inlet tube, 19.86 g (62.79 mmol) of a compound (21), 31.77 g (121.09 mmol) of a compound (11) and 8.37 g (15.95 mmol) of the compound (01) were dissolved in 79.53 g of a mixed solvent of methyl ethyl ketone (MEK) and cyclohexanone (CH). Subsequently, 29.97 mmol of dimethyl azobisisobutyrate (V-601) was added to, and dissolved in, the solution as a polymerization initiator. The resulting solution was added dropwise, over a period of four hours and under a nitrogen atmosphere, to 42.28 g of MEK that was heated to 80° C. Following completion of the dropwise addition, the reaction solution was stirred for one hour under heat, and was then cooled to room temperature. The thus obtained reaction polymerization solution was added dropwise to a large volume of n-heptane to precipitate the polymer, and the precipitated white powder was separated by filtration, washed with methanol, and subsequently dried, yielding 35.47 g of a polymeric compound 1 as the target compound.

For this polymeric compound, the polystyrene-equivalent weight-average molecular weight (Mw) determined by GPC measurement was 4,300, and the molecular weight dispersity (Mw/Mn) was 1.87.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.9/44.0/10.1.

[Chemical Formula 79]

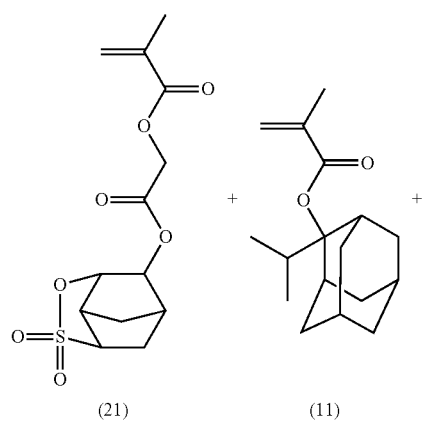

and 9.59 g (18.28 mmol) of the compound (01) as monomers, and altering the amount added of dimethyl azobisisobutyrate (V-601) to 35.90 mmol, synthesis was performed in the same manner as the polymer synthesis example 1, yielding 35.47 g of a polymeric compound 2 as the target compound.

For this polymeric compound, the polystyrene-equivalent weight-average molecular weight (Mw) determined by GPC measurement was 4,000, and the molecular weight dispersity (Mw/Mn) was 1.89.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.2/44.4/10.4.

[Chemical Formula 80]

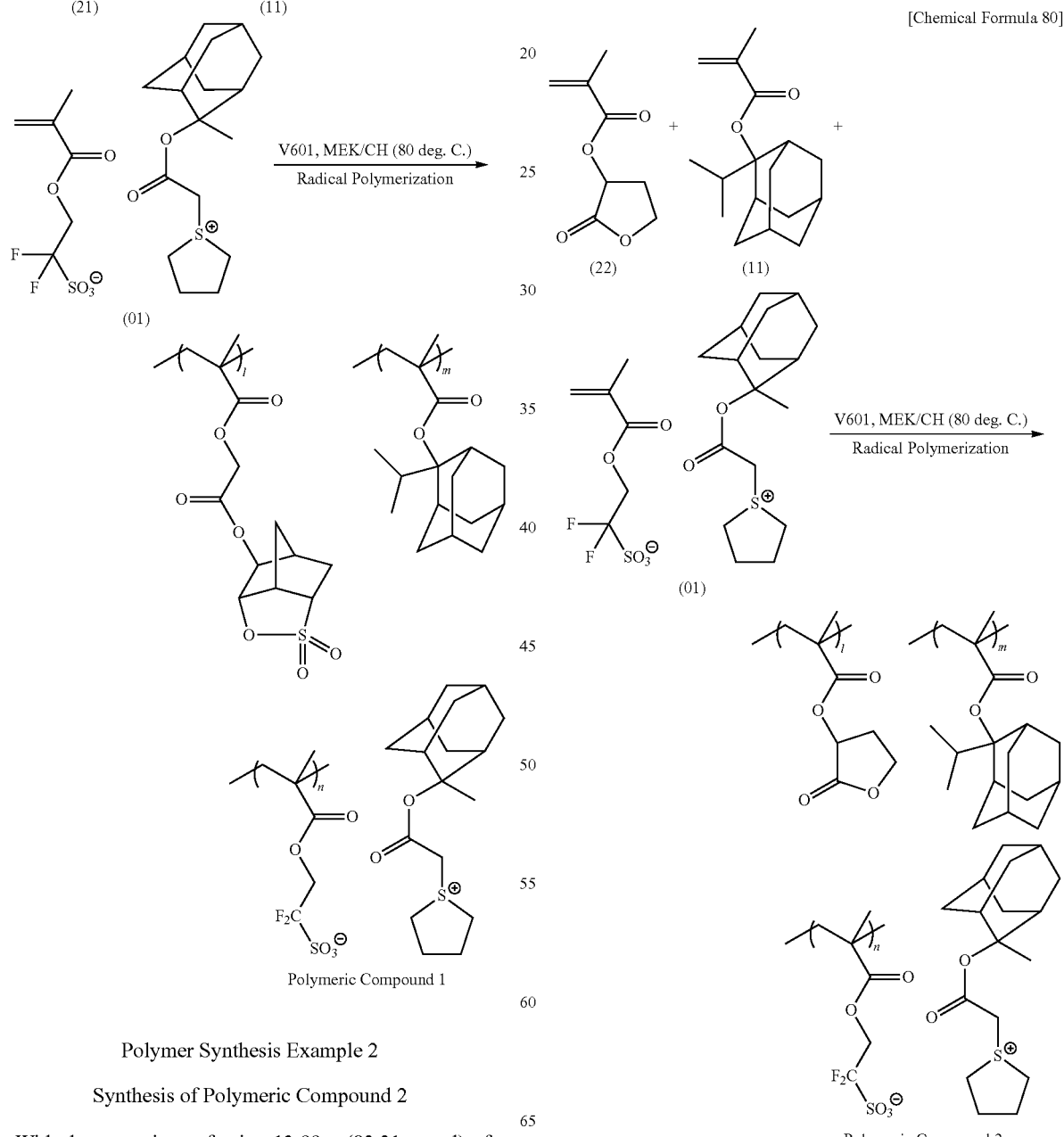

Polymer Synthesis Example 2

Synthesis of Polymeric Compound 2

With the exceptions of using 13.99 g (82.21 mmol) of a compound (22), 36.42 g (138.79 mmol) of the compound (11)

Polymer Synthesis Example 3

Synthesis of Polymeric Compound 4

With the exceptions of using 21.43 g (82.21 mmol) of the compound (21), 34.29 g (130.68 mmol) of the compound (11) and 4.28 g (8.15 mmol) of the compound (01) as monomers, and altering the amount added of dimethyl azobisisobutyrate (V-601) to 30.99 mmol, synthesis was performed in the same manner as the polymer synthesis example 1, yielding 37.50 g of a polymeric compound 4 as the target compound.

The structural formula of this polymeric compound 4 is the same as the aforementioned polymeric compound 1.

For this polymeric compound, the polystyrene-equivalent weight-average molecular weight (Mw) determined by GPC measurement was 3,800, and the molecular weight dispersity (Mw/Mn) was 1.95.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=48.1/46.5/5.4.

Polymer Synthesis Example 4

Synthesis of Polymeric Compound 5

With the exceptions of using 18.36 g (58.03 mmol) of the compound (21), 29.36 g (111.91 mmol) of the compound (11) and 12.28 g (23.41 mmol) of the compound (01) as monomers, and altering the amount added of dimethyl azobisisobutyrate (V-601) to 29.00 mmol, synthesis was performed in the same manner as the polymer synthesis example 1, yielding 32.82 g of a polymeric compound 5 as the target compound.

The structural formula of this polymeric compound 5 is the same as the aforementioned polymeric compound 1.

For this polymeric compound, the polystyrene-equivalent weight-average molecular weight (Mw) determined by GPC measurement was 4,400, and the molecular weight dispersity (Mw/Mn) was 1.86.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=42.4/42.9/14.7.

Polymer Synthesis Example 5

Synthesis of Polymeric Compound 6

With the exceptions of using 16.91 g (53.47 mmol) of the compound (21), 27.06 g (103.12 mmol) of the compound (11) and 16.03 g (30.55 mmol) of the compound (01) as monomers, and altering the amount added of dimethyl azobisisobutyrate (V-601) to 28.07 mmol, synthesis was performed in the same manner as the polymer synthesis example 1, yielding 36.08 g of a polymeric compound 6 as the target compound.

The structural formula of this polymeric compound 6 is the same as the aforementioned polymeric compound 1.

For this polymeric compound, the polystyrene-equivalent weight-average molecular weight (Mw) determined by GPC measurement was 4,500, and the molecular weight dispersity (Mw/Mn) was 1.87.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=39.9/40.6/19.5.

Polymer Synthesis Example 6

Synthesis of Polymeric Compound 7

With the exceptions of using 19.86 g (62.79 mmol) of the compound (21), 31.77 g (121.09 mmol) of the compound (11) and 8.37 g (15.95 mmol) of the compound (01) as monomers, and altering the amount added of dimethyl azobisisobutyrate (V-601) to 13.99 mmol, synthesis was performed in the same manner as the polymer synthesis example 1, yielding 36.96 g of a polymeric compound 7 as the target compound.

The structural formula of this polymeric compound 7 is the same as the aforementioned polymeric compound 1.

For this polymeric compound, the polystyrene-equivalent weight-average molecular weight (Mw) determined by GPC measurement was 7,600, and the molecular weight dispersity (Mw/Mn) was 2.00.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.1/44.2/10.7.

Polymer Synthesis Example 7

Synthesis of Polymeric Compound 8

With the exceptions of using 17.34 g (54.82 mmol) of the compound (21), 27.74 g (105.72 mmol) of the compound (11), 10.54 g (37.59 mmol) of a compound (31) and 4.38 g (8.35 mmol) of the compound (01) as monomers, and altering the amount added of dimethyl azobisisobutyrate (V-601) to 30.86 mmol, synthesis was performed in the same manner as the polymer synthesis example 1, yielding 33.73 g of a polymeric compound 8 as the target compound.

For this polymeric compound, the polystyrene-equivalent weight-average molecular weight (Mw) determined by GPC measurement was 4,400, and the molecular weight dispersity (Mw/Mn) was 1.91.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n/o=37.5/37.8/19.7/5.0.

[Chemical Formula 81]

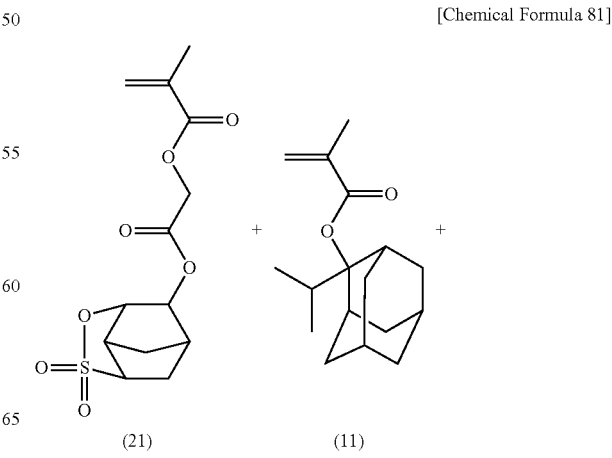

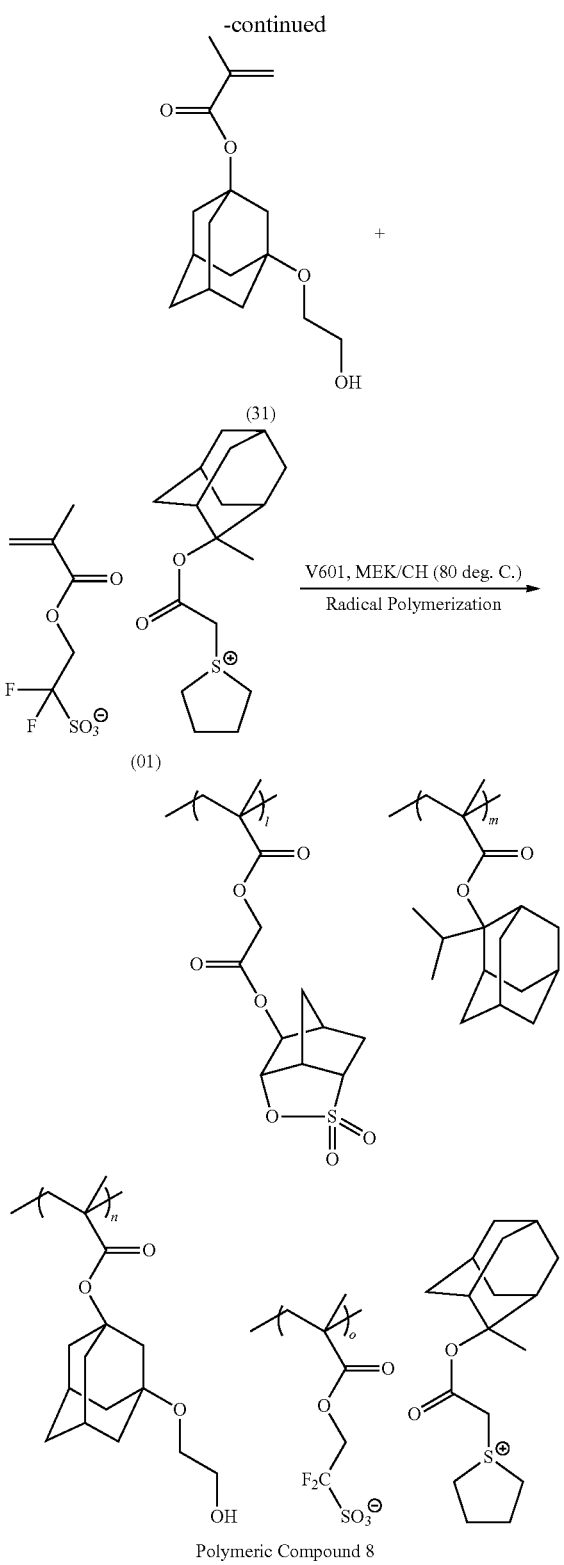

Polymeric Compound 8

Polymer Synthesis Example 8

Synthesis of Polymeric Compound 9

With the exceptions of using 16.23 g (51.32 mmol) of the compound (21), 25.97 g (98.97 mmol) of the compound (11), 9.25 g (32.99 mmol) of the compound (31) and 8.55 g (16.29 mmol) of the compound (01) as monomers, and altering the amount added of dimethyl azobisisobutyrate (V-601) to 29.94 mmol, synthesis was performed in the same manner as the polymer synthesis example 1, yielding 32.40 g of a polymeric compound 9 as the target compound.

The structural formula of this polymeric compound 9 is the same as the aforementioned polymeric compound 8.

For this polymeric compound, the polystyrene-equivalent weight-average molecular weight (Mw) determined by GPC measurement was 4,400, and the molecular weight dispersity (Mw/Mn) was 1.92.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n/o=36.3/36.0/17.9/9.8.

Polymer Synthesis Example 9

Synthesis of Polymeric Compound 10

With the exceptions of using 14.98 g (47.35 mmol) of the compound (21), 23.96 g (91.32 mmol) of the compound (11), 8.53 g (30.44 mmol) of the compound (31) and 12.53 g (23.87 mmol) of the compound (01) as monomers, and altering the amount added of dimethyl azobisisobutyrate (V-601) to 28.95 mmol, synthesis was performed in the same manner as the polymer synthesis example 1, yielding 31.44 g of a polymeric compound 10 as the target compound.

The structural formula of this polymeric compound 10 is the same as the aforementioned polymeric compound 8.

For this polymeric compound, the polystyrene-equivalent weight-average molecular weight (Mw) determined by GPC measurement was 4,100, and the molecular weight dispersity (Mw/Mn) was 1.87.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n/o=34.6/33.7/16.3/15.4.

Polymer Synthesis Example 10

Synthesis of Polymeric Compound 11

With the exceptions of using 13.78 g (43.56 mmol) of the compound (21), 22.04 g (84.01 mmol) of the compound (11), 7.85 g (28.00 mmol) of the compound (31) and 16.32 g (31.12 mmol) of the compound (01) as monomers, and altering the amount added of dimethyl azobisisobutyrate (V-601) to 28.00 mmol, synthesis was performed in the same manner as the polymer synthesis example 1, yielding 31.12 g of a polymeric compound 11 as the target compound.

The structural formula of this polymeric compound 11 is the same as the aforementioned polymeric compound 8.

For this polymeric compound, the polystyrene-equivalent weight-average molecular weight (Mw) determined by GPC measurement was 4,500, and the molecular weight dispersity (Mw/Mn) was 1.90.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n/o=32.0/32.4/15.5/20.1.

Polymer Synthesis Example 11

Synthesis of Polymeric Compound 12

With the exceptions of using 20.36 g (64.36 mmol) of the compound (21), 32.57 g (124.13 mmol) of the compound (11) and 7.07 g (16.35 mmol) of the compound (02) as monomers, and altering the amount added of dimethyl azobisisobutyrate (V-601) to 30.73 mmol, synthesis was performed in the same manner as the polymer synthesis example 1, yielding 32.87 g of a polymeric compound 12 as the target compound.

For this polymeric compound, the polystyrene-equivalent weight-average molecular weight (Mw) determined by GPC measurement was 4,500, and the molecular weight dispersity (Mw/Mn) was 1.86.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=44.8/44.4/10.8.

[Chemical Formula 82]

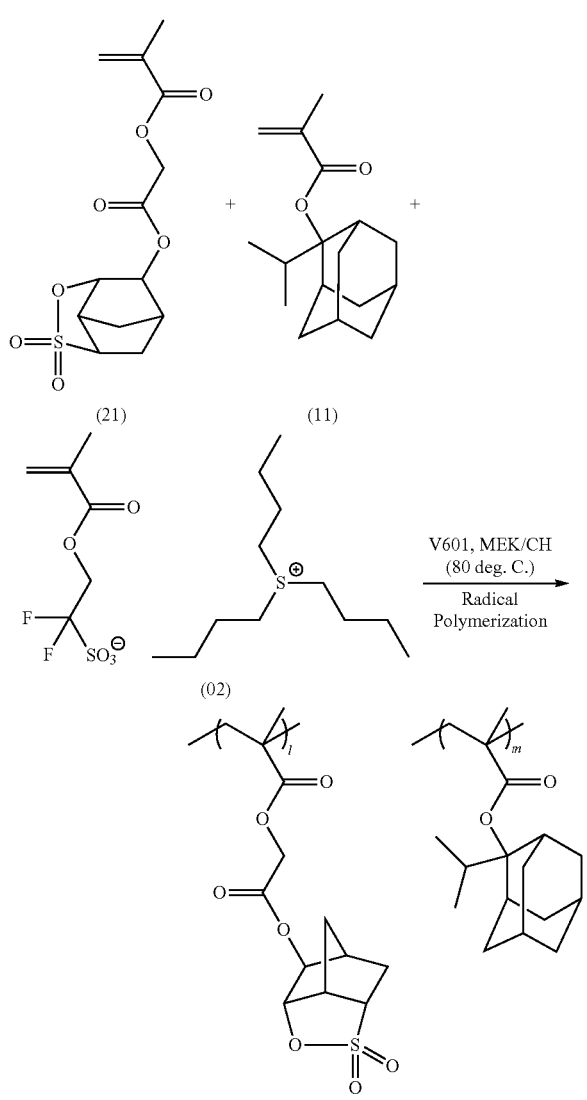

Polymeric Compound 12

Polymer Synthesis Example 12

Synthesis of Polymeric Compound 13

With the exceptions of using 20.36 g (64.36 mmol) of the compound (21), 32.57 g (124.13 mmol) of the compound (11) and 7.07 g (16.35 mmol) of the compound (02) as monomers, and altering the amount added of dimethyl azobisisobutyrate (V-601) to 14.34 mmol, synthesis was performed in the same manner as the polymer synthesis example 1, yielding 34.09 g of a polymeric compound 13 as the target compound.

The structural formula of this polymeric compound 13 is the same as the aforementioned polymeric compound 12.

For this polymeric compound, the polystyrene-equivalent weight-average molecular weight (Mw) determined by GPC measurement was 7,100, and the molecular weight dispersity (Mw/Mn) was 1.99.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.3/44.8/9.9.

Polymer Synthesis Example 13

Synthesis of Polymeric Compound 14

With the exceptions of using 17.75 g (56.10 mmol) of the compound (21), 28.39 g (108.19 mmol) of the compound (11) and 13.87 g (32.06 mmol) of the compound (02) as monomers, and altering the amount added of dimethyl azobisisobutyrate (V-601) to 29.45 mmol, synthesis was performed in the same manner as the polymer synthesis example 1, yielding 33.59 g of a polymeric compound 14 as the target compound.

The structural formula of this polymeric compound 14 is the same as the aforementioned polymeric compound 12.

For this polymeric compound, the polystyrene-equivalent weight-average molecular weight (Mw) determined by GPC measurement was 3,900, and the molecular weight dispersity (Mw/Mn) was 1.85.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=40.8/39.8/19.4.

Polymer Synthesis Example 14

Synthesis of Polymeric Compound 15

With the exceptions of using 19.56 g (61.83 mmol) of the compound (21), 31.29 g (119.25 mmol) of the compound (11) and 9.15 g (15.70 mmol) of the compound (03) as monomers, and altering the amount added of dimethyl azobisisobutyrate (V-601) to 29.52 mmol, synthesis was performed in the same manner as the polymer synthesis example 1, yielding 34.10 g of a polymeric compound 15 as the target compound.

For this polymeric compound, the polystyrene-equivalent weight-average molecular weight (Mw) determined by GPC measurement was 4,400, and the molecular weight dispersity (Mw/Mn) was 1.93.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.7/44.6/9.7.

[Chemical Formula 83]

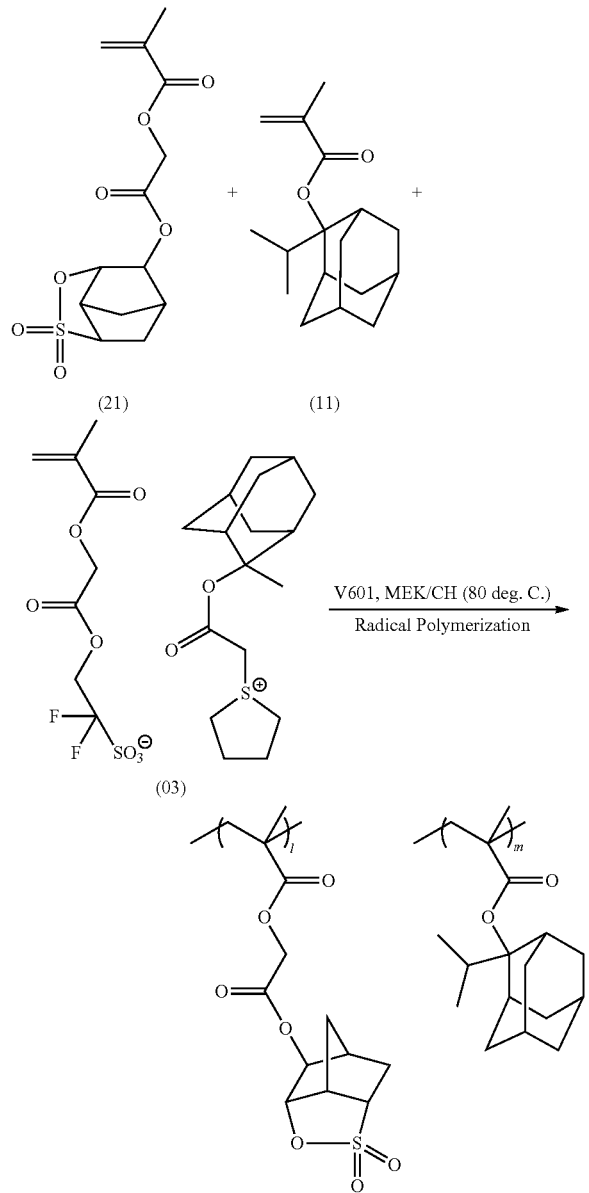

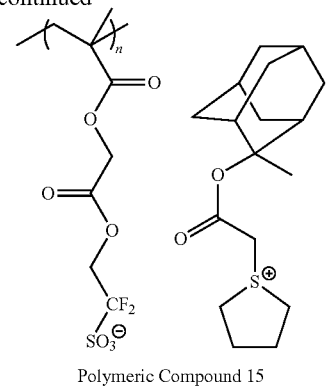

Polymeric Compound 15

Polymer Synthesis Example 15

Synthesis of Polymeric Compound 16

With the exceptions of using 19.99 g (63.19 mmol) of the compound (21), 31.98 g (121.87 mmol) of the compound (11) and 8.03 g (16.05 mmol) of the compound (04) as monomers, and altering the amount added of dimethyl azobisisobutyrate (V-601) to 30.17 mmol, synthesis was performed in the same manner as the polymer synthesis example 1, yielding 30.98 g of a polymeric compound 16 as the target compound.

For this polymeric compound, the polystyrene-equivalent weight-average molecular weight (Mw) determined by GPC measurement was 4,500, and the molecular weight dispersity (Mw/Mn) was 1.92.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.1/44.8/10.1.

[Chemical Formula 84]

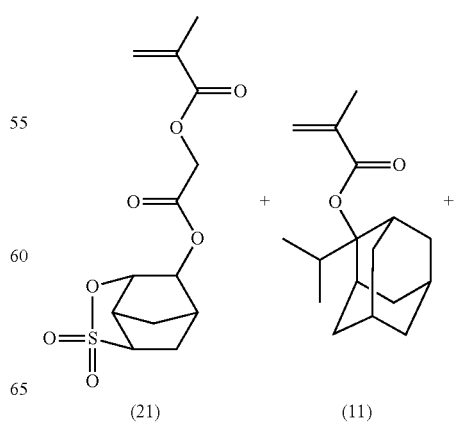

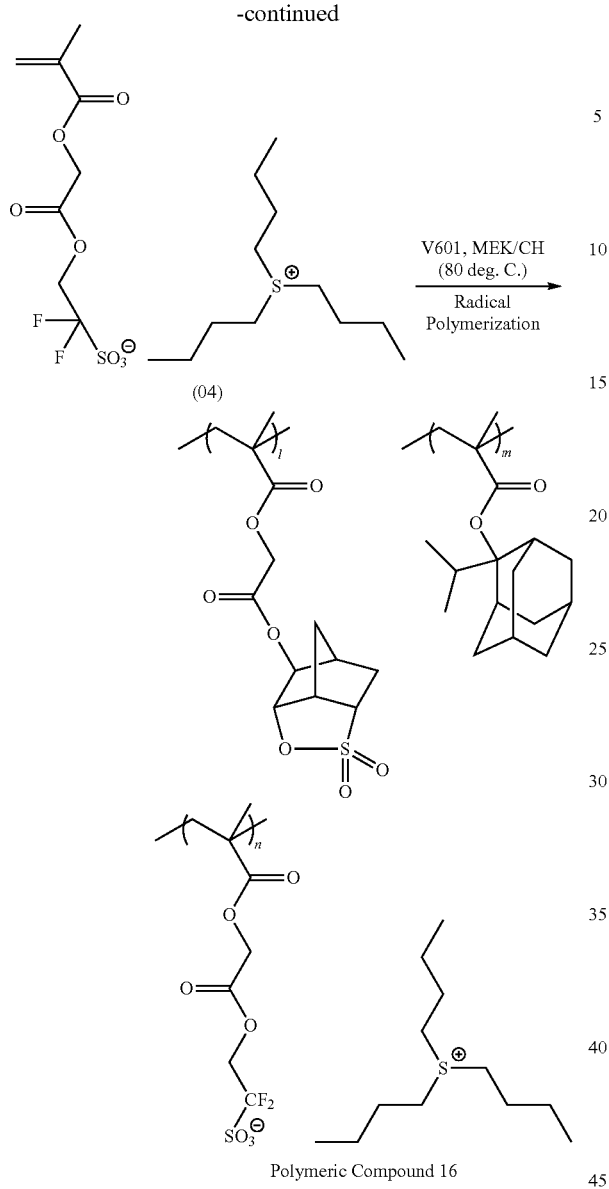

Polymeric Compound 16

Polymer Synthesis Example 16

Synthesis of Polymeric Compound 17

With the exceptions of using 19.20 g (60.68 mmol) of the compound (21), 30.71 g (117.03 mmol) of the compound (11) and 10.10 g (15.41 mmol) of the compound (05) as monomers, and altering the amount added of dimethyl azobisisobutyrate (V-601) to 28.97 mmol, synthesis was performed in the same manner as the polymer synthesis example 1, yielding 38.44 g of a polymeric compound 17 as the target compound.

For this polymeric compound, the polystyrene-equivalent weight-average molecular weight (Mw) determined by GPC measurement was 3,700, and the molecular weight dispersity (Mw/Mn) was 1.88.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=45.3/45.1/9.6.

[Chemical Formula 85]

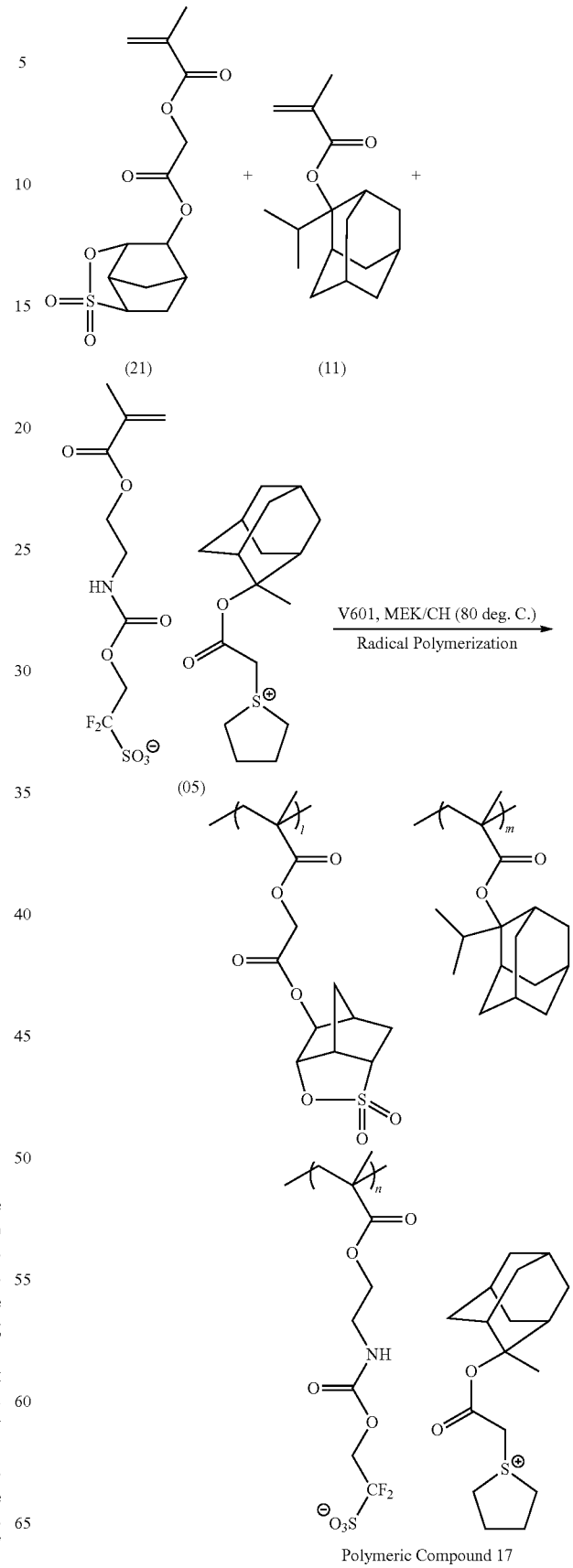

Polymeric Compound 17

Polymer Synthesis Example 17

Synthesis of Polymeric Compound 18

With the exceptions of using 17.16 g (54.24 mmol) of the compound (21), 27.45 g (104.60 mmol) of the compound (11), 6.36 g (30.99 mmol) of a compound (32) and 9.03 g (17.22 mmol) of the compound (01) as monomers, and altering the amount added of dimethyl azobisisobutyrate (V-601) to 31.06 mmol, synthesis was performed in the same manner as the polymer synthesis example 1, yielding 33.73 g of a polymeric compound 18 as the target compound.

For this polymeric compound, the polystyrene-equivalent weight-average molecular weight (Mw) determined by GPC measurement was 4,000, and the molecular weight dispersity (Mw/Mn) was 1.86.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n/o=36.4/35.7/17.5/10.4.

Polymer Synthesis Example 18

Synthesis of Polymeric Compound 19

With the exceptions of using 16.71 g (52.83 mmol) of the compound (21), 26.74 g (101.89 mmol) of the compound (11), 7.75 g (33.96 mmol) of a compound (33) and 8.80 g (16.77 mmol) of the compound (01) as monomers, and altering the amount added of dimethyl azobisisobutyrate (V-601) to 30.82 mmol, synthesis was performed in the same manner as the polymer synthesis example 1, yielding 33.73 g of a polymeric compound 19 as the target compound.

For this polymeric compound, the polystyrene-equivalent weight-average molecular weight (Mw) determined by GPC measurement was 3,900, and the molecular weight dispersity (Mw/Mn) was 1.88.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n/o=36.9/36.1/16.9/10.1.

[Chemical Formula 86]

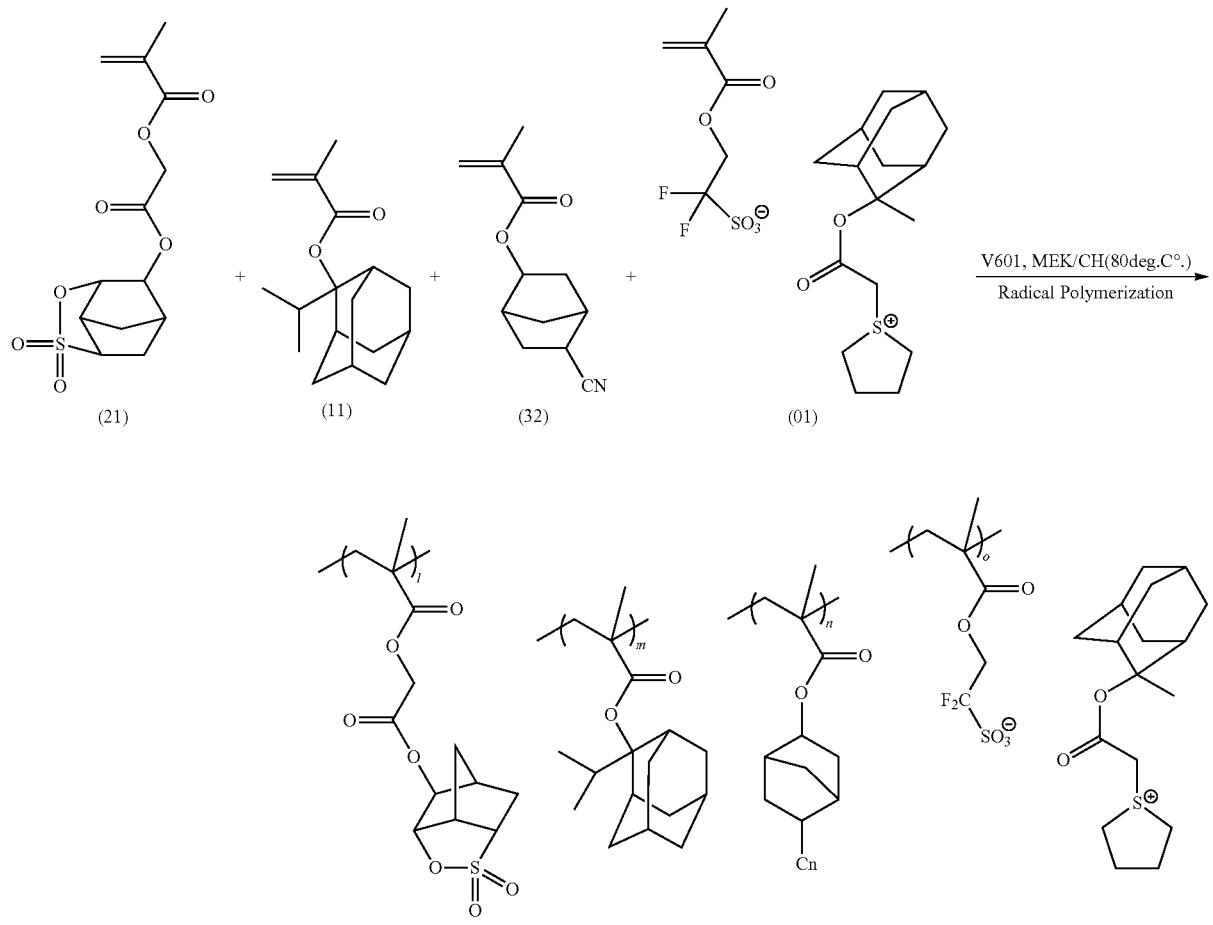

Polymeric Compound 18

[Chemical Formula 87]

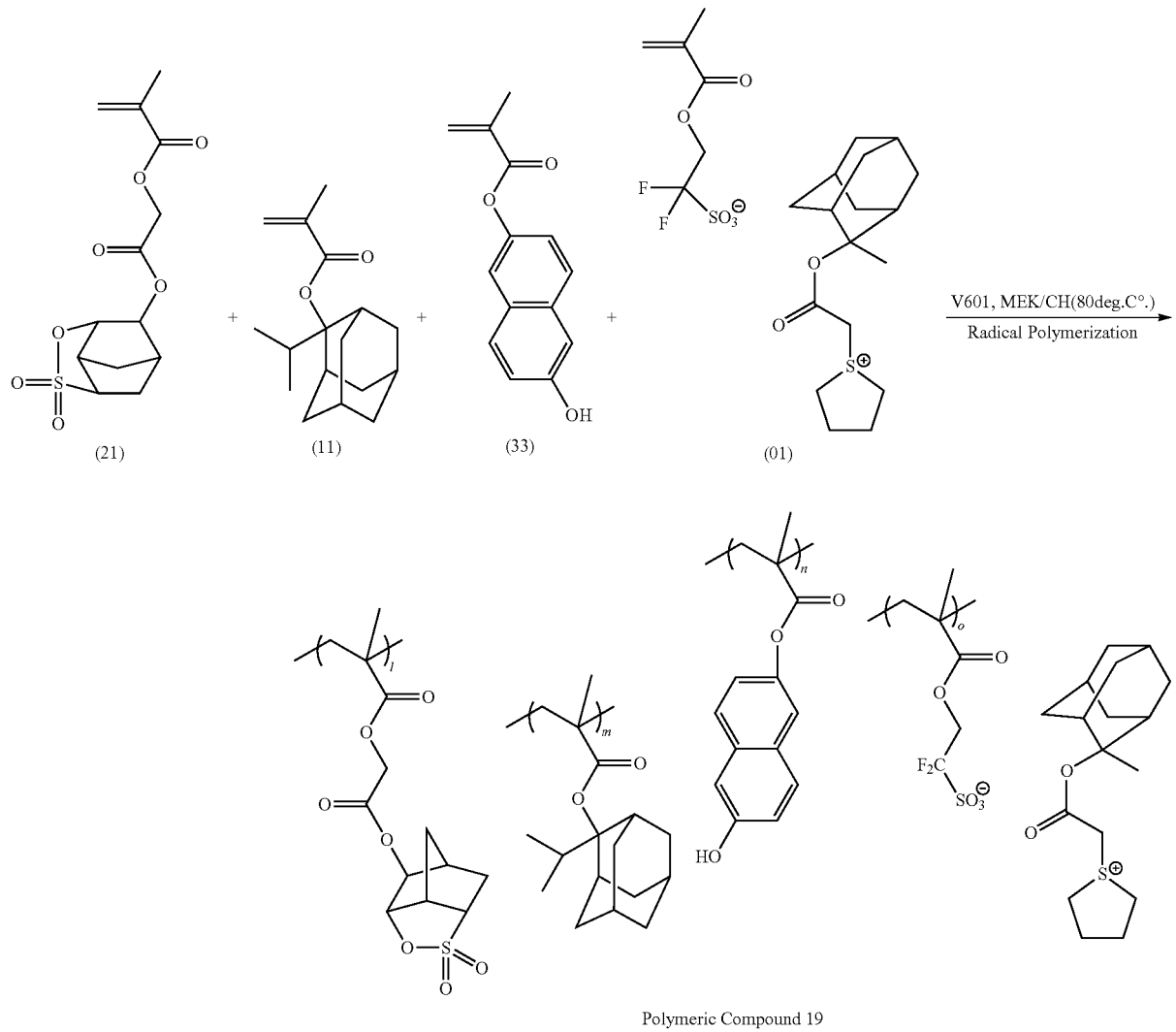

Polymer Synthesis Example 19

Synthesis of Polymeric Compound 20

With the exceptions of using 23.32 g (194.09 mmol) of a compound (34), 21.59 g (86.26 mmol) of a compound (12) and 15.09 g (28.75 mmol) of the compound (01) as monomers, and altering the amount added of dimethyl azobisisobutyrate (V-601) to 46.37 mmol, synthesis was performed in the same manner as the polymer synthesis example 1, yielding 31.32 g of a polymeric compound 20 as the target compound.

For this polymeric compound, the polystyrene-equivalent weight-average molecular weight (Mw) determined by GPC measurement was 3,600, and the molecular weight dispersity (Mw/Mn) was 1.95.

Further, the compositional ratio of the copolymer (the proportion (molar ratio) of each of the structural units within the structural formula) determined by carbon-13 nuclear magnetic resonance spectroscopy (600 MHz, $^{13}$C-NMR) was l/m/n=58.8/30.7/10.5.

[Chemical Formula 88]

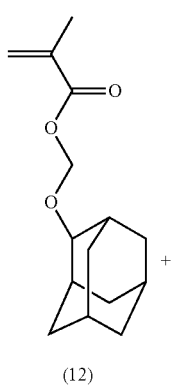

173
-continued
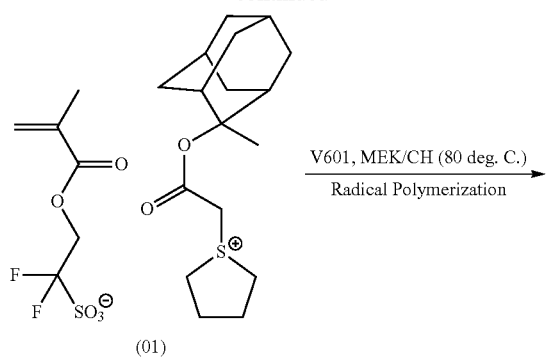
(01)
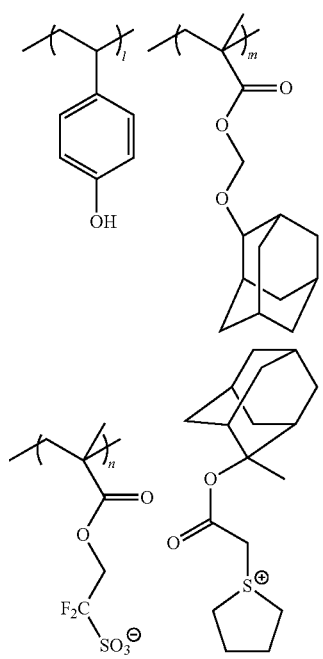
Polymeric Compound 20
[Polymeric Compounds 1' to 8' (for Comparative Purposes)]
Copolymers represented by structural formulas (A')-1 to (A')-8 shown below were prepared as comparative polymeric compounds.
[Chemical Formula 89]
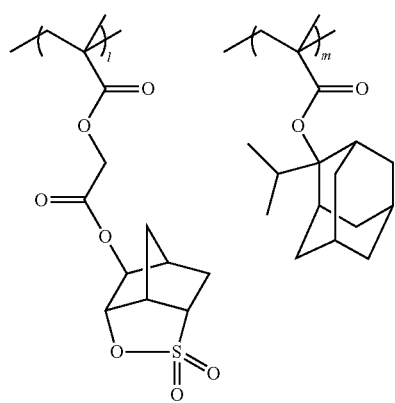
(A')-1
174
-continued
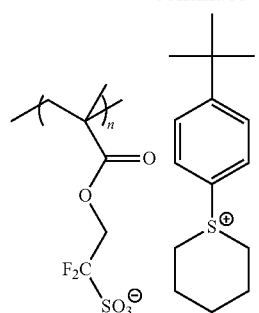
l/m/n = 45/45/10, Mw = 4,000, Mw/Mn = 1.85
[Chemical Formula 90]
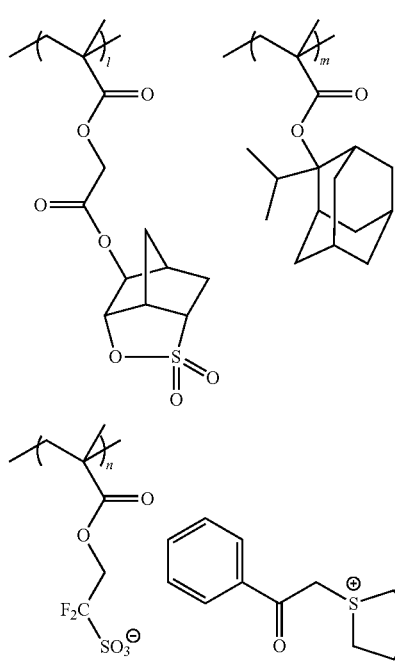
l/m/n = 45/45/10, Mw = 4,000, Mw/Mn = 1.80
[Chemical Formula 91]
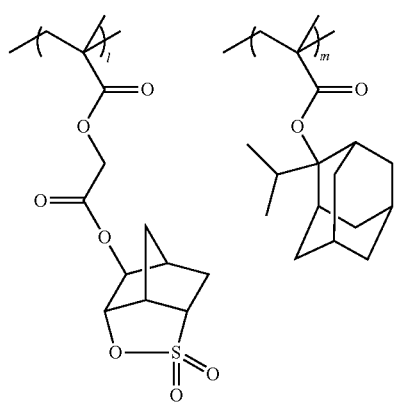
(A')-3

-continued
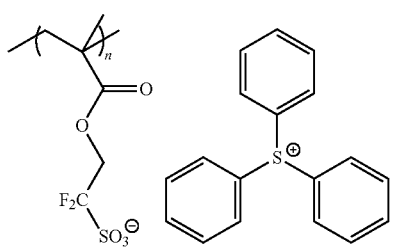
l/m/n = 45/45/10, Mw = 4,000, Mw/Mn = 1.90
[Chemical Formula 92]
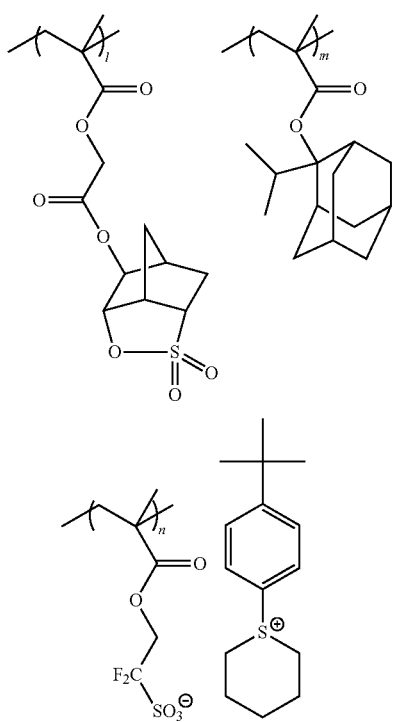
l/m/n = 45/45/10, Mw = 7,000, Mw/Mn = 1.80
[Chemical Formula 93]
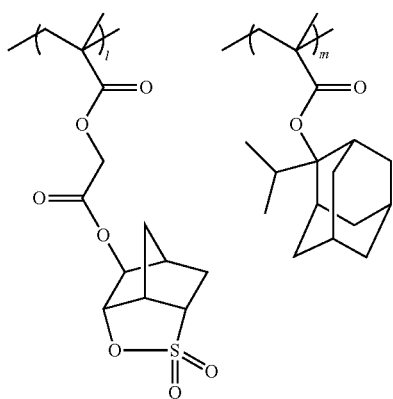
-continued
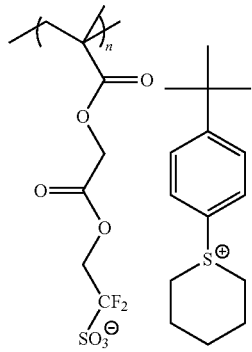
l/m/n = 45/45/10, Mw = 4,000, Mw/Mn = 2.00
[Chemical Formula 94]
(A′)-4
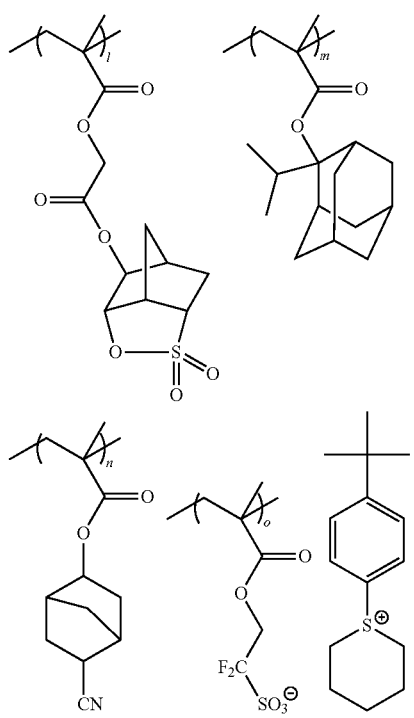
l/m/n/o = 36/36/18/10, Mw = 4,000, Mw/Mn = 1.85
[Chemical Formula 95]
(A′)-6
(A′)-5
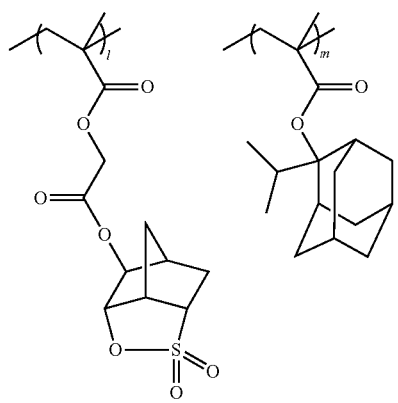
(A′)-7

-continued

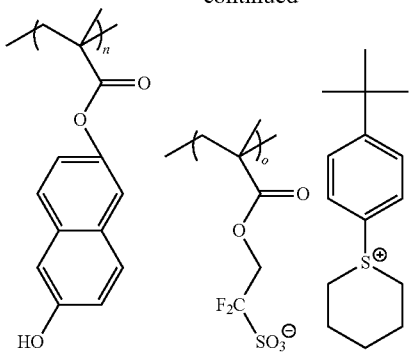

l/m/n/o = 36/36/18/10, Mw = 4,000, Mw/Mn = 1.85

(A')-8

[Chemical Formula 96]

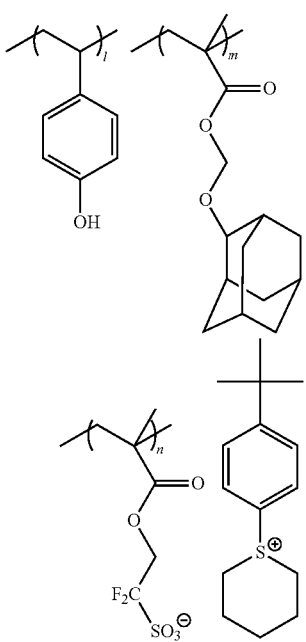

l/m/n = 60/30/10, Mw = 4,000, Mw/Mn = 1.75

Examples 1 to 26, Comparative Examples 1 to 8

The components shown in Tables 1 to 3 were mixed together and dissolved to prepare a series of resist compositions.

TABLE 1

|  | Component (A) | Component (D) | Component (E) | Component (S) |
|---|---|---|---|---|
| Example 1 | (A)-1 [100] | (D)-1 [0.67] | (E)-1 [0.64] | (S)-1 [5200] |
| Example 2 | (A)-2 [100] | (D)-2 [1.5] | (E)-1 [0.6] | (S)-1 [5200] |
| Example 3 | (A)-1 [100] | (D)-2 [1.5] | (E)-1 [0.6] | (S)-1 [5200] |
| Example 4 | (A)-4 [100] | (D)-2 [1.5] | (E)-1 [0.6] | (S)-1 [5200] |
| Example 5 | (A)-5 [100] | (D)-2 [1.5] | (E)-1 [0.6] | (S)-2 [5200] |
| Example 6 | (A)-6 [100] | (D)-2 [1.5] | (E)-1 [0.6] | (S)-2 [5200] |
| Example 7 | (A)-7 [100] | (D)-2 [1.5] | (E)-1 [0.6] | (S)-1 [5200] |
| Example 8 | (A)-8 [100] | (D)-2 [1.5] | (E)-1 [0.6] | (S)-1 [5200] |
| Example 9 | (A)-9 [100] | (D)-2 [1.5] | (E)-1 [0.6] | (S)-1 [5200] |
| Example 10 | (A)-10 [100] | (D)-2 [1.5] | (E)-1 [0.6] | (S)-2 [5200] |
| Example 11 | (A)-11 [100] | (D)-2 [1.5] | (E)-1 [0.6] | (S)-2 [5200] |
| Example 12 | (A)-12 [100] | (D)-2 [1.5] | (E)-1 [0.6] | (S)-1 [5200] |
| Example 13 | (A)-13 [100] | (D)-2 [1.5] | (E)-1 [0.6] | (S)-1 [5200] |
| Example 14 | (A)-14 [100] | (D)-2 [1.5] | (E)-1 [0.6] | (S)-2 [5200] |
| Example 15 | (A)-15 [100] | (D)-1 [0.67] | (E)-1 [0.64] | (S)-1 [5200] |
| Example 16 | (A)-16 [100] | (D)-1 [0.67] | (E)-1 [0.64] | (S)-1 [5200] |
| Example 17 | (A)-17 [100] | (D)-1 [0.67] | (E)-1 [0.64] | (S)-1 [5200] |
| Example 18 | (A)-18 [100] | (D)-1 [0.67] | (E)-1 [0.64] | (S)-1 [5200] |
| Example 19 | (A)-19 [100] | (D)-1 [0.67] | (E)-1 [0.64] | (S)-1 [5200] |
| Example 20 | (A)-20 [100] | (D)-1 [0.67] | (E)-1 [0.64] | (S)-1 [5200] |

TABLE 2

|  | Component (A) | Component (D) | Component (E) | Other optional components | Component (S) |
|---|---|---|---|---|---|
| Example 21 | (A)-1 [80] | (D)-2 [1.6] | (E)-1 [0.64] | (C)-1 [20] | (S)-1 [5200] |
| Example 22 | (A)-1 [50] | (D)-2 [1.6] | (E)-1 [0.64] | (C)-1 [50] | (S)-1 [5200] |
| Example 23 | (A)-1 [80] | (D)-2 [1.6] | (E)-1 [0.64] | (C)-2 [20] | (S)-1 [5200] |
| Example 24 | (A)-1 [80] | (D)-2 [1.6] | (E)-1 [0.64] | (C)-3 [20] | (S)-1 [5200] |
| Example 25 | (A)-1 [80] | (D)-2 [1.6] | (E)-1 [0.64] | (C)-4 [20] | (S)-1 [5200] |
| Example 26 | (A)-1 [100] | (D)-2 [1.6] | (E)-1 [0.64] | (B)-1 [10] | (S)-1 [5200] |

TABLE 3

|  | Component (A) | Component (D) | Component (E) | Component (S) |
|---|---|---|---|---|
| Comparative Example 1 | (A')-1 [100] | (D)-1 [0.67] | (E)-1 [0.64] | (S)-1 [5200] |
| Comparative Example 2 | (A')-2 [100] | (D)-1 [0.67] | (E)-1 [0.64] | (S)-1 [5200] |
| Comparative Example 3 | (A')-3 [100] | (D)-1 [0.67] | (E)-1 [0.64] | (S)-1 [5200] |
| Comparative Example 4 | (A')-4 [100] | (D)-1 [0.67] | (E)-1 [0.64] | (S)-1 [5200] |
| Comparative Example 5 | (A')-5 [100] | (D)-1 [0.67] | (E)-1 [0.64] | (S)-1 [5200] |
| Comparative Example 6 | (A')-6 [100] | (D)-1 [0.67] | (E)-1 [0.64] | (S)-1 [5200] |
| Comparative Example 7 | (A')-7 [100] | (D)-1 [0.67] | (E)-1 [0.64] | (S)-1 [5200] |
| Comparative Example 8 | (A')-8 [100] | (D)-1 [0.67] | (E)-1 [0.64] | (S)-1 [5200] |

In Tables 1 to 3, the abbreviations used indicate the following. Further, the numerical values in brackets [ ] indicate the amount (in terms of parts by weight) of the component added.

(A)-1 to (A)-20: the aforementioned polymeric compounds 1 to 20

(A')-1 to (A')-8: the aforementioned copolymers represented by the structural formulas (A')-1 to (A')-8 respectively (D)-1: triethanolamine (D)-2: tri-n-octylamine (E)-1: salicylic acid (S)-1: a mixed solvent of γ-butyrolactone/PGMEA/PGME/cyclohexanone=200/2250/1500/1250 (weight ratio)

(S)-2: a mixed solvent of γ-butyrolactone/PGMEA/PGME/cyclohexanone=200/1500/1000/2500 (weight ratio)

(C)-1: a main chain-degradable polymer represented by a structural formula (C)-1 shown below [Mw=3,700, Mw/Mn=1.13. Of the R groups shown in the formula, the ratio of (number of R groups that represent a 2-methyl-2-adamantyloxycarbonylmethyl group):(number of R groups that represent a hydrogen atom)=25:75]

(C)-2: a copolymer represented by a structural formula (C)-2 shown below [l/m=60/30, Mw=8,000, Mw/Mn=1.90]

(C)-3: a copolymer represented by a structural formula (C)-3 shown below [l/m/n/o/p=35/22/18/13/12, Mw=7,000, Mw/Mn=1.65]

(C)-4: a copolymer represented by a structural formula (C)-4 shown below [l/m=75/25, Mw=7,300, Mw/Mn=1.85]

(B)-1: a compound represented by a structural formula (B)-1 shown below

[Chemical Formula 97]

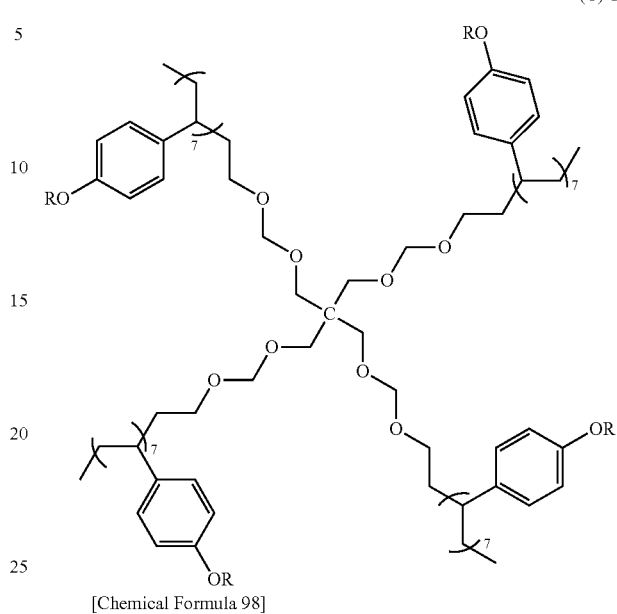

(C)-1

[Chemical Formula 98]

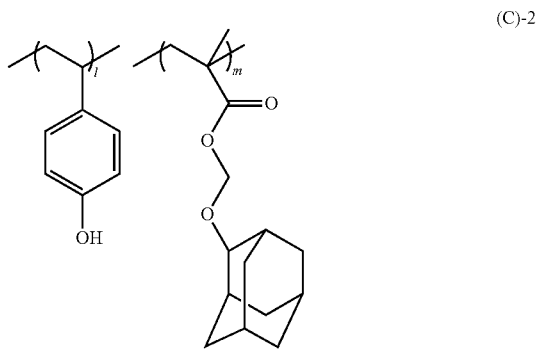

(C)-2

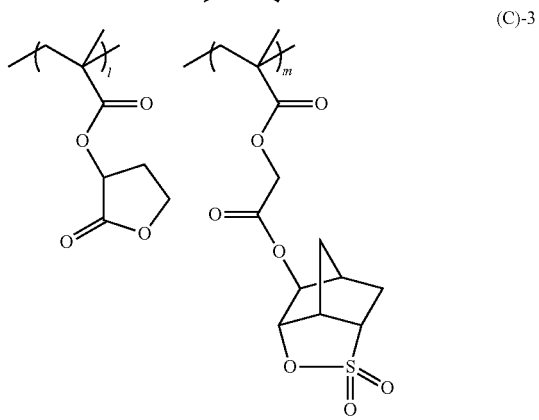

(C)-3

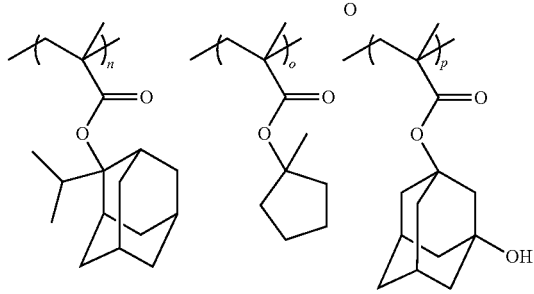

-continued

[Chemical Formula 99]

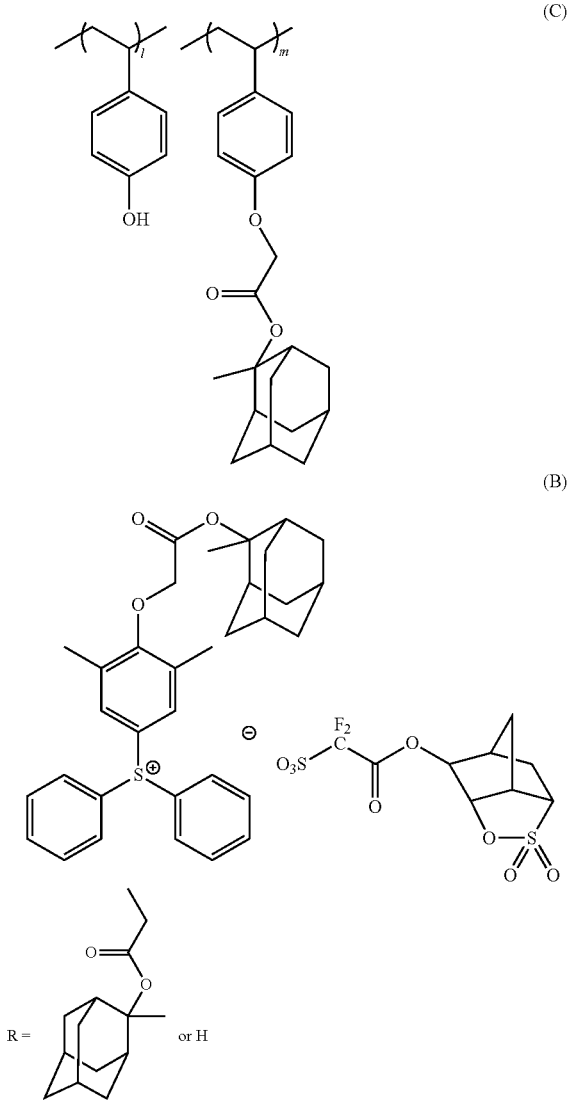

Using each of the obtained resist compositions, the following evaluations were performed.

[Formation of Resist Pattern]

Using a spinner, the resist composition of each example was applied uniformly onto an 8-inch silicon substrate that had been surface-treated with hexamethyldisilazane (HMDS) for 36 seconds at 90° C., and a bake treatment (PAB) was then conducted for 60 seconds at a PAB temperature shown in Table 4, thereby forming a resist film (thickness: 60 nm). This resist film was subjected to patterning (exposure) with an electron beam exposure apparatus HL800D (VSB) (manufactured by Hitachi Ltd.) using an accelerating voltage of 50 keY, and was then subjected to a bake treatment (PEB) for 60 seconds at a PEB temperature shown in Table 4, followed by development for 60 seconds at 23° C. in a 2.38% by weight aqueous solution of tetramethylammonium hydroxide (TMAH) (product name: NMD-3, manufactured by Tokyo Ohka Kogyo Co., Ltd.).

As a result, in each example, a line and space resist pattern (hereafter referred to as an "L/pattern") having a line width of 100 nm and a pitch of 200 nm was formed.

It is thought that a higher accelerating voltage is advantageous in forming a fine resist pattern, but in the present evaluation, in order to reproduce a state that simulates the state in which OoB light is generated, a comparatively low accelerating voltage of 50 keV was employed for the exposure conditions.

[Evaluation of Sensitivity and Resolution]

The optimum exposure dose Eop ($\mu C/cm^2$) at which an L/S pattern having a line width of 100 nm and a pitch of 200 nm was formed in the aforementioned "Formation of Resist Pattern" was determined and recorded as the sensitivity. The results are listed in Table 4.

Further, the resolution limit at the above Eop value was also determined. The results are shown in Table 4 as "resolution".

[Evaluation of Line Edge Roughness (LER)]

For the LS pattern formed in the aforementioned "Formation of Resist Pattern", the value of $3\sigma$ was determined as a measure of the LER. This value of $3\sigma$ (units: nm) represents the value of three times the standard deviation ($\sigma$) for line width values measured at 400 points along the lengthwise direction of the line using a scanning electron microscope (product name: S-9220, manufactured by Hitachi High-Technologies Corporation, accelerating voltage: 800 V). The smaller the value of $3\sigma$, the lower the level of roughness in the line side walls, meaning an LS pattern of more uniform width has been obtained. The results are shown in Table 4.

[Evaluation of Cross-Sectional Shape]

Using a scanning electron microscope (product name: SU8000, manufactured by Hitachi High-Technologies Corporation, accelerating voltage: 800 V), the cross-sectional shape of an LS pattern having a line width of 100 nm and a pitch of 200 nm formed in the aforementioned "Formation of Resist Pattern" was inspected. Patterns for which the cross-sectional shape was rectangular were evaluated as "A", whereas patterns having a rounded top shape were evaluated as "B". The results are shown in Table 4.

[Evaluation of Sensitivity to KrF Excimer Laser Light ($E_0$ Measurement)]

Using a spinner, the resist composition of each example was applied uniformly onto an 8-inch silicon substrate that had been surface-treated with hexamethyldisilazane (HMDS) for 36 seconds at 90° C., and a bake treatment (PAB) was then conducted for 60 seconds at a PAB temperature shown in Table 4, thereby forming a resist film (thickness: 60 nm). This resist film was subjected to exposure using a KrF exposure apparatus S-203B (manufactured by Nikon Corporation), and was then subjected to a bake treatment (PEB) for 60 seconds at a PEB temperature shown in Table 4, followed by development for 60 seconds at 23° C. in a 2.38% by weight aqueous solution of tetramethylammonium hydroxide (TMAH) (product name: NMD-3, manufactured by Tokyo Ohka Kogyo Co., Ltd.).

The above operation was performed while the exposure dose was changed (increased in a stepwise manner from 0 to 50 mJ/cm²), and the lowest exposure dose (mJ/cm²) at which the resist film within the exposed portions was removed was recorded as the $E_0$ sensitivity. Compositions for which the resist film within the exposed portions was not removed even when the exposure dose reached 50 mJ/cm², namely compositions for which the value of the $E_0$ sensitivity exceeded 50 mJ/cm², were deemed to have no sensitivity to KrF excimer laser light. The results are shown in Table 4. In Table 4, "N.D." indicates that the composition lacked sensitivity to KrF excimer laser light.

TABLE 4

| | PAB/PEB (° C.) | EB 100 nm SL | | | | KrF $E_0$ (mJ/cm$^2$) |
|---|---|---|---|---|---|---|
| | | Eop (μC/cm$^2$) | LER (nm) | Resolution (nm) | Cross-sectional shape | |
| Example 1 | 140/120 | 48 | 6.5 | 50 | A | N.D. |
| | 130/110 | 50 | 6.2 | 50 | A | N.D. |
| Example 2 | 140/120 | 42 | 7.1 | 50 | A | N.D. |
| Example 3 | 140/120 | 50 | 7.2 | 50 | A | N.D. |
| Example 4 | 140/120 | 70 | 7.5 | 50 | A | N.D. |
| Example 5 | 140/120 | 33 | 6.7 | 50 | A | N.D. |
| Example 6 | 140/120 | 20 | 7.5 | 50 | A | N.D. |
| Example 7 | 140/120 | 52 | 7.2 | 50 | A | N.D. |
| Example 8 | 130/110 | 68 | 7.6 | 50 | A | N.D. |
| Example 9 | 130/110 | 49 | 7.0 | 50 | A | N.D. |
| Example 10 | 130/110 | 30 | 6.5 | 50 | A | N.D. |
| Example 11 | 130/110 | 18 | 7.0 | 50 | A | N.D. |
| Example 12 | 130/110 | 46 | 6.8 | 50 | A | N.D. |
| Example 13 | 130/110 | 50 | 6.7 | 50 | A | N.D. |
| Example 14 | 130/110 | 38 | 6.6 | 50 | A | N.D. |
| Example 15 | 130/110 | 45 | 6.5 | 50 | A | N.D. |
| Example 16 | 130/110 | 46 | 6.3 | 50 | A | N.D. |
| Example 17 | 130/110 | 38 | 6.0 | 50 | A | N.D. |
| Example 18 | 130/110 | 48 | 6.0 | 50 | A | N.D. |
| Example 19 | 140/120 | 45 | 7.0 | 50 | A | N.D. |
| Example 20 | 130/130 | 52 | 7.8 | 50 | A | N.D. |
| Example 21 | 130/110 | 50 | 7.0 | 50 | A | N.D. |
| Example 22 | 130/110 | 46 | 6.8 | 50 | A | N.D. |
| Example 23 | 130/110 | 56 | 7.8 | 50 | A | N.D. |
| Example 24 | 130/110 | 46 | 6.7 | 50 | A | N.D. |
| Example 25 | 130/110 | 52 | 7.7 | 50 | A | N.D. |
| Example 26 | 130/110 | 38 | 7.6 | 50 | A | 24 |
| Comparative example 1 | 140/120 | 50 | 8.4 | 60 | B | 6 |
| Comparative example 2 | 140/120 | 52 | 8.4 | 60 | B | 7 |
| Comparative example 3 | 140/120 | 30 | 8.4 | 60 | B | 3 |
| Comparative example 4 | 140/120 | 54 | 9.0 | 60 | B | 6.5 |
| Comparative example 5 | 130/110 | 45 | 8.6 | 60 | B | 6 |
| Comparative example 6 | 130/110 | 48 | 8.0 | 60 | B | 7 |
| Comparative example 7 | 140/120 | 45 | 9.0 | 60 | B | 5 |
| Comparative example 8 | 130/130 | 50 | 10.0 | 70 | B | 8 |

As is evident from the results shown above, the resist compositions of the examples 1 to 20, which contained the polymeric compounds 1 to 20 respectively as the component (A), exhibited no sensitivity relative to KrF excimer laser light, displayed good sensitivity to EB, and also yielded favorable results for the resolution and the pattern shape (LER, cross-sectional shape). The examples 21 to 25, which also contained the component (C), yielded similar results. The example 26, which also included the component (B), exhibited some sensitivity to KrF excimer laser light, but the resolution and pattern shape results were still favorable.

In contrast, the comparative examples 1 to 8, which contained the polymeric compounds 1' to 8' respectively as the component (A), exhibited inferior resolution, larger LER and inferior cross-sectional shape when compared with the examples 1 to 26.

What is claimed is:

1. A resist composition for use with EUV or EB, the composition comprising a resin component (A) which generates acid upon exposure and exhibits changed solubility in a developing solution under action of acid, the resin component (A) comprising a resin component (A1) having a structural unit (a0) having no aromaticity in the cation moiety, wherein the structural unit (a0) is represented by a general formula (a0-0-1) shown below:

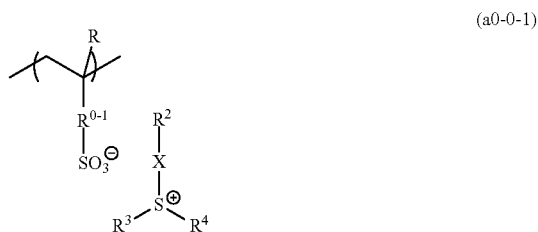

(a0-0-1)

wherein R represents a hydrogen atom, an alkyl group of 1 to 5 carbon atoms or a halogenated alkyl group of 1 to 5 carbon atoms, $R^{0-1}$ represents a single bond or a divalent linking group, each of $R^2$, $R^3$ and $R^4$ independently represents a linear, branched or cyclic alkyl group which may have a non-aromatic substituent, or alternatively $R^3$ and $R^4$ may be bonded to each other to form a ring together with a sulfur atom in the general formula, and X represents a non-aromatic divalent linking group or a single bond, and $R^2$—X—$S^+$($R^3$)($R^4$) in the general formula (a0-0-1) is represented by a general formula (I-1), (I-2), (I-3) or (I-4) shown below:

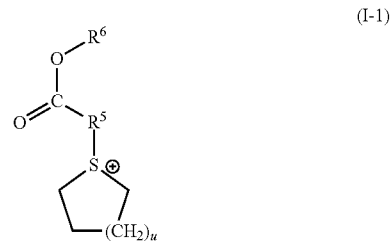

(I-1)

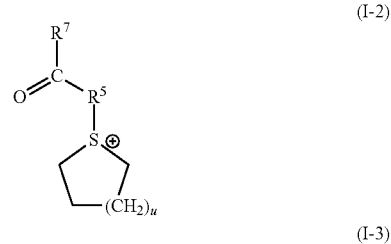

(I-2)

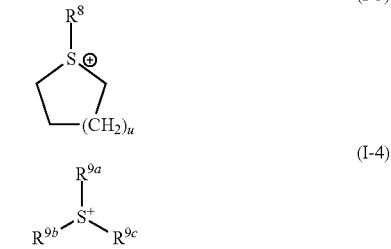

(I-3)

(I-4)

wherein, u represents an integer of 1 to 3, $R^5$ represents an alkylene group which may have a non-aromatic substituent, $R^6$ represents an alkyl group which may have a non-aromatic substituent, $R^7$ represents a hydroxyl group, $R^8$ represents an unsubstituted alkyl group, and each of $R^{9a}$ to $R^{9c}$ independently represents a linear or branched alkyl group of 5 to 15 carbon atoms.

2. The resist composition for use with EUV or EB according to claim 1, wherein the resin component (A1) is a resin component that exhibits increased polarity under action of acid.

3. The resist composition for use with EUV or EB according to claim 2, wherein the resin component (A1) has a structural unit (a1) containing an acid-degradable group that exhibits increased polarity under action of acid.

4. The resist composition for use with EUV or EB according to claim 3, wherein the resin component (A1) also has at least one structural unit (a2) selected from the group consisting of structural units derived from an acrylate ester containing a lactone-containing cyclic group and structural units derived from an acrylate ester containing an —SO$_2$-containing cyclic group, wherein the structural unit (a2) may have the hydrogen atom bonded to the carbon atom on the α-position substituted with a substituent.

5. The resist composition for use with EUV or EB according to claim 3, wherein the component (A1) also has a structural unit (a3) containing a polar group-containing hydrocarbon group.

6. A method of forming a resist pattern, the method comprising:
    forming a resist film using the resist composition for use with EUV or EB according to any one of claims 1 to 5, exposing the resist film with EUV or EB, and developing the resist film to form a resist pattern.

7. A polymeric compound having a structural unit (a0) having no aromaticity in the cation moiety, wherein the structural unit (a0) is represented by a general formula (a0-0-1) shown below:

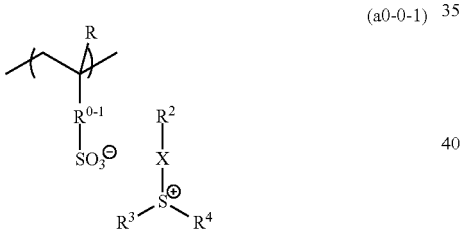

(a0-0-1)

wherein R represents a hydrogen atom, an alkyl group of 1 to 5 carbon atoms or a halogenated alkyl group of 1 to 5 carbon atoms, $R^{0-1}$ represents a single bond or a divalent linking group, each of $R^2$, $R^3$ and $R^4$ independently represents a linear, branched or cyclic alkyl group which may have a non-aromatic substituent, or alternatively $R^3$ and $R^4$ may be bonded to each other to form a ring together with a sulfur atom in the general formula, and X represents a non-aromatic divalent linking group or a single bond, and $R^2$—X—$S^+(R^3)(R^4)$ in the general formula (a0-0-1) is represented by a general formula (I-1), (I-2), (I-3) or (I-4) shown below:

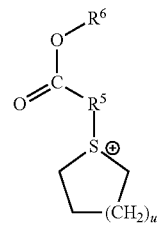

(I-1)

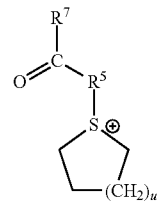

(I-2)

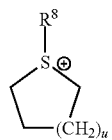

(I-3)

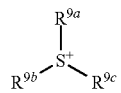

(I-4)

wherein, u represents an integer of 1 to 3, $R^5$ represents an alkylene group which may have a non-aromatic substituent, $R^6$ represents an alkyl group which may have a non-aromatic substituent, $R^7$ represents a hydroxyl group, $R^8$ represents an unsubstituted alkyl group, and each of $R^{9a}$ to $R^{9c}$ independently represents a linear or branched alkyl group of 5 to 15 carbon atoms.

8. The polymeric compound according to claim 7, wherein the polymeric compound exhibits increased polarity under action of acid.

9. The polymeric compound according to claim 8, wherein the polymeric compound also has a structural unit (a1) containing an acid-degradable group that exhibits increased polarity under action of acid.

10. The polymeric compound according to claim 9, wherein the polymeric compound also has at least one structural unit (a2) selected from the group consisting of structural units derived from an acrylate ester containing a lactone-containing cyclic group and structural units derived from an acrylate ester containing an —SO$_2$-containing cyclic group, wherein the structural unit (a2) may have the hydrogen atom bonded to the carbon atom on the α-position substituted with a substituent.

11. The polymeric compound according to claim 9 or 10, wherein the polymeric compound also has a structural unit (a3) containing a polar group-containing hydrocarbon group.

* * * * *

UNITED STATES PATENT AND TRADEMARK OFFICE
CERTIFICATE OF CORRECTION

PATENT NO. : 9,104,101 B2
APPLICATION NO. : 13/402820
DATED : August 11, 2015
INVENTOR(S) : Kensuke Matsuzawa et al.

It is certified that error appears in the above-identified patent and that said Letters Patent is hereby corrected as shown below:

Title Page
Page 1 (item 73- assignee), "Kawaski-shi" should be --Kawasaki-shi--.
In the Specification
Col. 13, line 29, "-CF$_2$," should be -- -CF$_2$-,--.
Col. 13, line 46, "f'" should be --f'--.
Col. 25, lines 19-25:

" 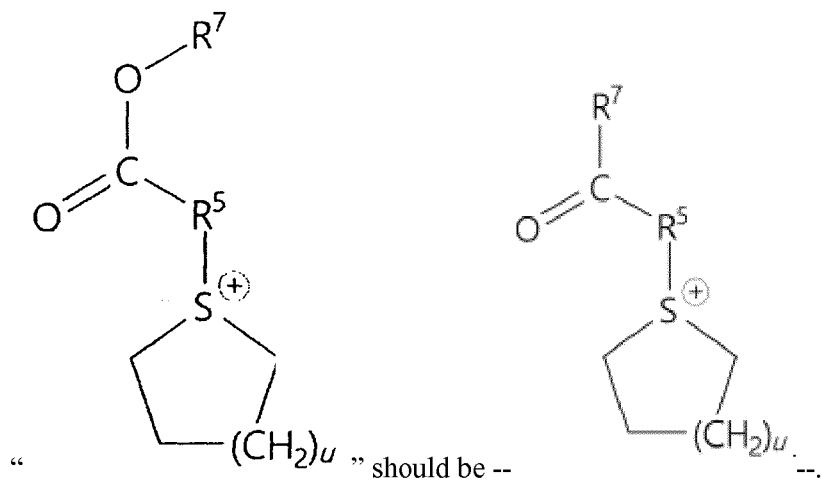 " should be -- --.

Col. 28, line 66, "acid dissociable," should be --acid-dissociable,--.
Col. 29, line 7, "acid dissociable," should be --acid-dissociable,--.
Col. 35, line 46, "-[Y$^{21}$-C(=O)-O]$_m$-Y$^{22}$-" should be -- -[Y$^{21}$-C(=O)-O]$_{m'}$-Y$^{22}$- --.
Col. 35, lines 55-56, "-[Y$^{21}$-C(=O)-O]$_m$-Y$^{22}$-" should be -- -[Y$^{21}$-C(=O)-O]$_{m'}$-Y$^{22}$- --.
Col. 36, lines 5-6, "-[Y$^{21}$-C(=O)-O]$_m$-Y$^{22}$-," should be -- -[Y$^{21}$-C(=O)-O]$_{m'}$-Y$^{22}$-,--.
Col. 36, line 9, "-[Y$^{21}$-C(=O)-O]$_m$-Y$^{22}$-" should be -- -[Y$^{21}$-C(=O)-O]$_{m'}$-Y$^{22}$- --.
Col. 36, line 12, "-(CH$_2$)$_a$-C(=O)-O-(CH$_2$)$_b$-" should be -- -(CH$_2$)$_{a'}$-C(=O)-O-(CH$_2$)$_{b'}$- --.
Col. 36, line 27, "-[Y$^{21}$-C(=O)-O]$_m$-Y$^{22}$-" should be -- -[Y$^{21}$-C(=O)-O]$_{m'}$-Y$^{22}$- --.
Col. 36, line 29, "-[Y$^{21}$-C(=O)-O]$_m$-Y$^{22}$-" should be -- -[Y$^{21}$-C(=O)-O]$_{m'}$-Y$^{22}$- --.
Col. 36, line 36, "-[Y$^{21}$-C(=O)-O]$_m$-Y$^{22}$-" should be -- -[Y$^{21}$-C(=O)-O]$_{m'}$-Y$^{22}$- --.
Col. 68, lines 11-12, "-[Y$^{21}$-C(=O)-O]$_m$-Y$^{22}$-" should be -- -[Y$^{21}$-C(=O)-O]$_{m'}$-Y$^{22}$- --.

Signed and Sealed this
Twenty-fourth Day of May, 2016

Michelle K. Lee
*Director of the United States Patent and Trademark Office*

CERTIFICATE OF CORRECTION (continued)
U.S. Pat. No. 9,104,101 B2

Col. 70, line 62, ""α-substituted)" should be --"(α-substituted)--.
Col. 82, line 22, "-[Y$^{21}$-C(=O)-O]$_m$-Y$^{22}$-" should be -- -[Y$^{21}$-C(=O)-O]$_{m'}$-Y$^{22}$- --.
Col. 106, line 56, "CH$_2$=C(R)-R$^{0-1}$-SO$_3$ R$^2$-X-S$^+$(R$^3$)(R$^4$))," should be
--CH$_2$=C(R)-R$_{0-1}$-SO$_3^-$R$^2$-X-S$^+$(R$^3$)(R$^4$),--.
Col. 109, line 63, "by are" should be --by -X$^{22}$-X$^{21}$- are--.
Col. 112, lines 45-52:

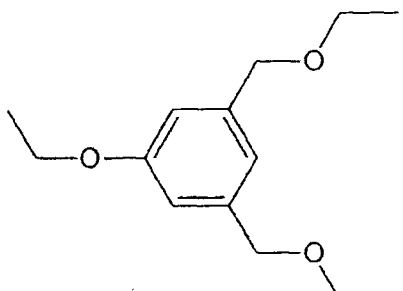 " should be -- 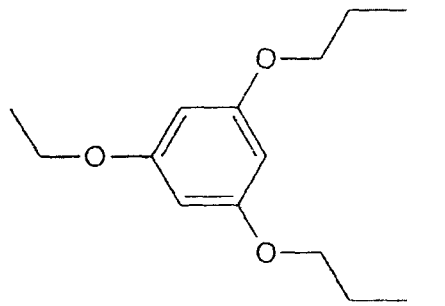 --.

Col. 113, lines 1-10:

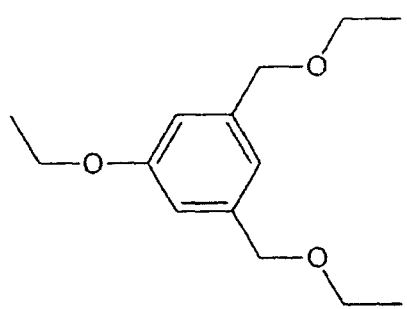 " should be -- 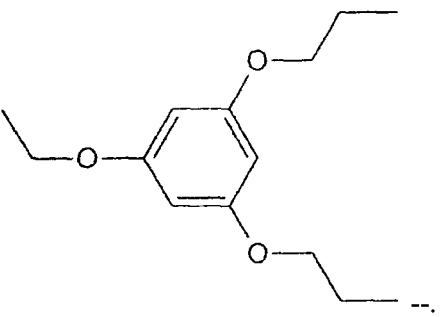 --.

Col. 113, lines 45-50:

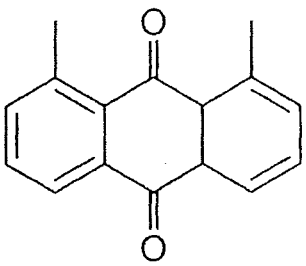 " should be -- 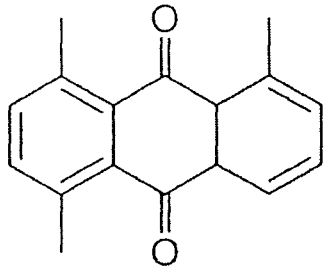 --.

Col. 115, line 54, "ti R$^{104}$." should be --to R$^{104}$.--.
Col. 139, line 2, after "-C(=O)-," insert -- -O-C(=O)-O-,--.
Col. 153, line 40, "long at" should be --long as--.
Col. 164, line 21, "(II)" should be --(11)--.

Col. 169-170, line 32:
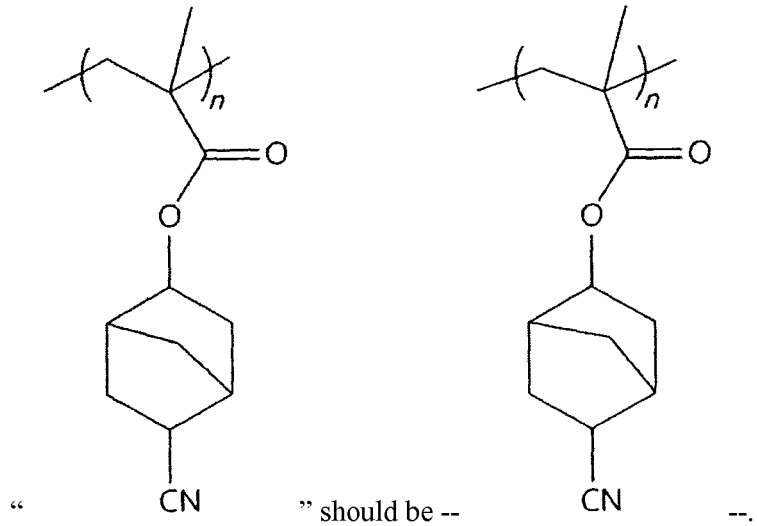
" [left structure] " should be -- [right structure] --.
Col. 170, line 30, "V601, MEK/CH(80deg.C°.)" should be --V601, MEK/CH(80deg.C.)--.
Col. 172, line 4, "V601, MEK/CH(80deg.C°.)" should be --V601, MEK/CH(80deg.C.)--.
Col. 176, line 47, "Mw/Mn = 1.85" should be --Mw/Mn= 1.80--.
Col. 180, line 26:
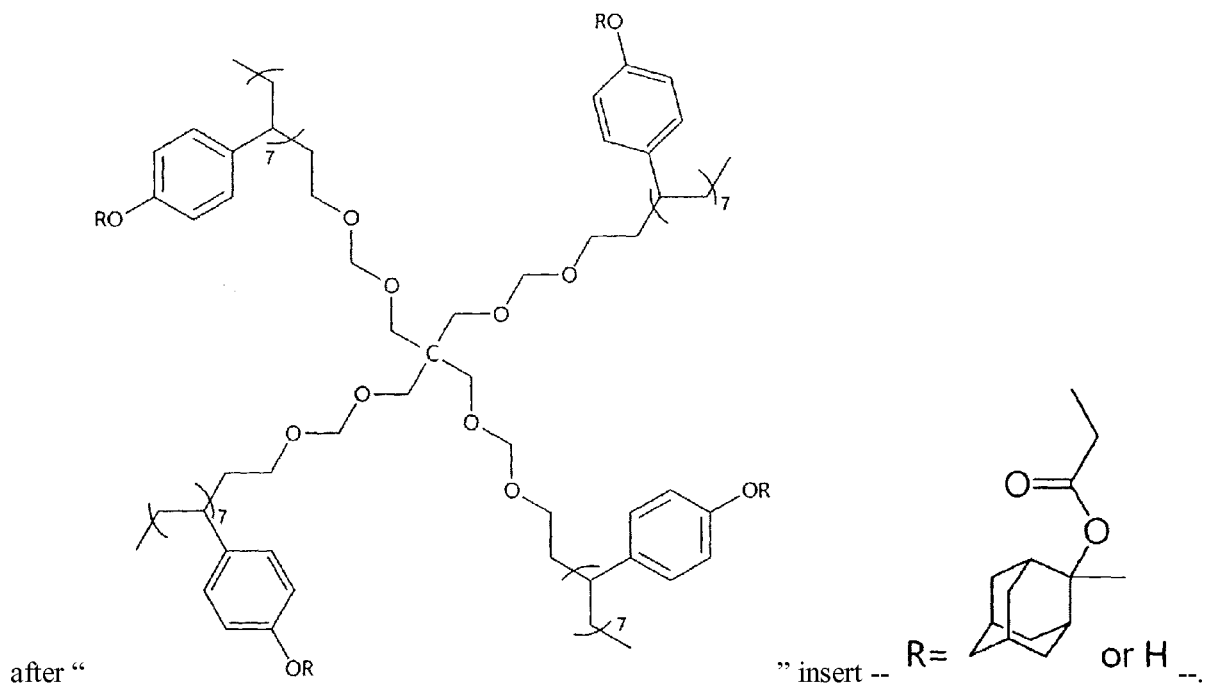
after " [structure] " insert -- R= [adamantyl] or H --.

Col. 181, lines 35-45, Above "Using each" delete " R= 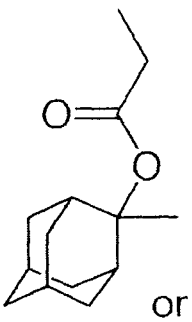 or H ,".
Col. 181, line 53, "(P AB)" should be --(PAB)--.
Col. 181, line 58, "keY," should be --keV,--.
Col. 181, line 66, ""L/pattern")" should be --"L/S pattern")--.
In the Claims
Col. 186, line 36 (claim 7), "$R^{9a}$ to $R^{9c}$" should be --$R^{9a}$ to $R^{9c}$--.